(12) United States Patent
D'Evelyn et al.

(10) Patent No.: US 12,224,172 B2
(45) Date of Patent: *Feb. 11, 2025

(54) GROUP III NITRIDE SUBSTRATE WITH OXYGEN GRADIENT, METHOD OF MAKING, AND METHOD OF USE

(71) Applicant: SLT Technologies, Inc., Los Angeles, CA (US)

(72) Inventors: Mark P. D'Evelyn, Vancouver, WA (US); Keiji Fukutomi, Vancouver, WA (US); Drew W. Cardwell, Camas, WA (US); David N. Italiano, Washougal, WA (US); Chiaki Domoto, Vancouver, WA (US)

(73) Assignee: SLT Technologies, Inc., Los Angeles, CA (US)

( * ) Notice: Subject to any disclaimer, the term of this patent is extended or adjusted under 35 U.S.C. 154(b) by 204 days.

This patent is subject to a terminal disclaimer.

(21) Appl. No.: 18/072,684

(22) Filed: Nov. 30, 2022

(65) Prior Publication Data

US 2023/0167586 A1 Jun. 1, 2023

Related U.S. Application Data

(60) Provisional application No. 63/326,448, filed on Apr. 1, 2022, provisional application No. 63/285,000, filed on Dec. 1, 2021.

(51) Int. Cl.
*B32B 27/02* (2006.01)
*C30B 29/40* (2006.01)
(Continued)

(52) U.S. Cl.
CPC ...... *H01L 21/02389* (2013.01); *C30B 29/406* (2013.01); *H01L 21/02433* (2013.01); *H01L 21/02595* (2013.01); *C30B 7/105* (2013.01)

(58) Field of Classification Search
CPC . C30B 29/406; C30B 7/105; H01L 21/02389; H01L 21/02433; H01L 21/0254;
(Continued)

(56) References Cited

U.S. PATENT DOCUMENTS

| 7,078,731 B2 | 7/2006 | D'Evelyn et al. |
| 8,979,999 B2 | 3/2015 | D'Evelyn |

(Continued)

FOREIGN PATENT DOCUMENTS

WO 2021163230 A1 8/2021

OTHER PUBLICATIONS

F. Tuomisto et al., Effect of growth polarity on vacancy defect and impurity incorporation in dislocation-free GaN, Applied Physics Letter, 2005, 4 pages.
(Continued)

*Primary Examiner* — Lawrence D Ferguson
(74) *Attorney, Agent, or Firm* — Patterson + Sheridan, LLP

(57) ABSTRACT

Embodiments of the present disclosure include techniques related to techniques for processing materials for manufacture of group-III metal nitride and gallium based substrates. More specifically, embodiments of the disclosure include techniques for substrates with a controlled oxygen gradient using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic and electronic devices, lasers, light emitting diodes, solar cells, photo electrochemical water splitting and hydrogen generation, photodetectors, integrated circuits, and transistors, and others.

20 Claims, 22 Drawing Sheets

(51) Int. Cl.
*H01L 21/02* (2006.01)
*C30B 7/10* (2006.01)

(58) Field of Classification Search
CPC ........... H01L 21/02595; H01L 21/0262; H01L 21/02642; H01L 21/02647
See application file for complete search history.

(56) References Cited

U.S. PATENT DOCUMENTS

| | | |
|---|---|---|
| 9,543,392 B1 | 1/2017 | Jiang et al. |
| 9,589,792 B2 | 3/2017 | Jiang et al. |
| 2014/0147650 A1 | 5/2014 | Jiang et al. |
| 2016/0020284 A1 | 1/2016 | D'Evelyn et al. |
| 2018/0195206 A1 | 7/2018 | Jiang et al. |
| 2019/0198312 A1 | 6/2019 | Yoshida et al. |
| 2020/0109489 A1 | 4/2020 | Mikawa et al. |
| 2020/0224331 A1 | 7/2020 | D'Evelyn et al. |
| 2021/0246571 A1 | 8/2021 | Cardwell et al. |
| 2021/0249252 A1 | 8/2021 | Jiang et al. |
| 2021/0249266 A1 | 8/2021 | D'Evelyn et al. |

OTHER PUBLICATIONS

Cyrus E. Dreyer et al., Gallium vacancy complexes as a cause of Shockley-Read-Hall recombination in III-nitride light emitters, Applied Physics Letter, 2016, 6 pages.
Sami Suihkonen et al., Infrared absorption of hydrogen-related defects in ammonothermal GaN, Applied Physics Letter, 2016, 5 pages.
Kenji Iso et al., Thermal annealing effects on SCAAT™ substrate grown toward the c- and m-directions, Applied Physics Express 12, 125502 (2019), 4 pages.
M.A. Reshchikov et al., Defect-related photoluminescence from ammono GaN, Journal of Applied Physics, 129, 2021, 10 pages.
F. Tuomisto et al., Vacancy defects in bulk ammonothermal GaN crystals, Department of Applied Physics, 2010, 4 pages.
F. Tuomisto et al., Vacancy-hydrogen complexes in ammonothermal GaN, Department of Applied Physics, 2014, 5 pages.
S. Pimputkar et al., Free electron concentration dependent sub-bandgap optical absorption characterization of bulk GaN crystals, Journal of Crystal Growth 432, 2015, 5 pages.
Akira Uedono et al., Vacancies and electron trapping centers in acidic ammonothermal GaN probed by a monoenergetic positron beam, Journal of Grystal Growth 448, 2016, 5 pages.
Sakari Sintonen et al., Evolution of impurity incorporation during ammonothermal growth of GaN, Jornal of Crystal Growth 456, 2016, 7 pages.
Wenkan Jiang et al., Electrical and optical properties of gallium vacancy complexes in ammonothermal GaN, Applied Physics Express 10, 2017, 5 pages.
Emmanouil Kioupakis et al., Determination of Internal Loss in Nitride Lasers from First Principles, Applied Physics Express 3, 2010, 4 pages.
Chris G. Van de Walle, Interactions of hydrogen with native defects in GaN, vol. 56, No. 16, Oct. 15, 1997, 4 pages.
K. Saarinen, Thermal stability of isolated and complexed Ga vacancies in GaN bulk crystals, Physical Review B, vol. 64, 2004, 4 pages.
S. Hautakangas et al., Direct evidence of impurity decoration of Ga vacancies in GaN from positron annihilation spectroscopy, Physical Review B 73, 2006, 4 pages.
N.T. Son et al., Identification of the gallium vacancy-oxygen pair defect in GaN, Physical Review B 80, 2009, 4 pages.
Emmanouil Kioupakis et al., Free-carrier absorption in nitrides from first principles, Physical Review B 81, 2010, 4 pages.
F. Tuomisto et al., Dissociation of VGa-ON complexes in HVPE GaN by high pressure and high temperature annealing, Physica Status Solidi(b), 243, No. 7, pp. 1436-1440, 2006.
PCT/US2022/080713, International Search Report and Written Opinion dated Jul. 4, 2023, 30 pages.
PCT/US2022/080713, Invitation to Pay Additional Fees/Partial International Search dated Apr. 14, 2023, 20 pages.

2D HEXAGONAL ARRAY

2D SQUARE ARRAY

2D RECTANGULAR ARRAY

1D LINEAR ARRAY

2D LINEAR ARRAY

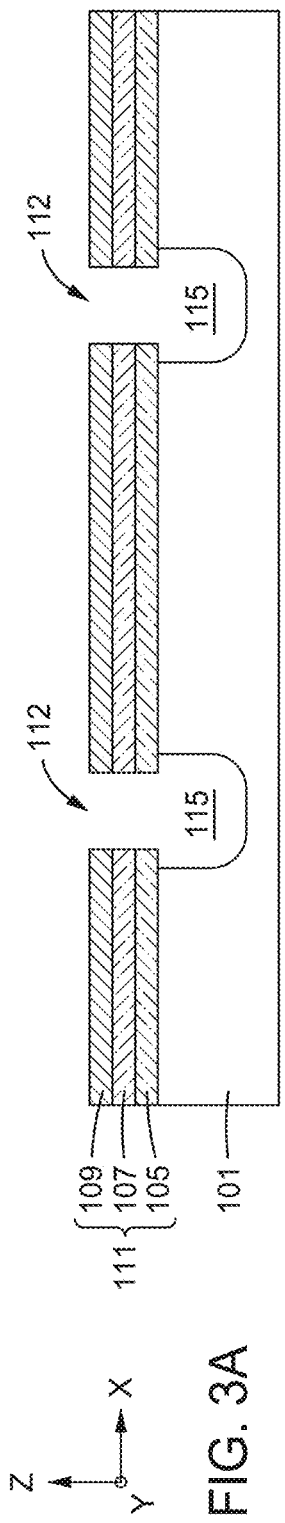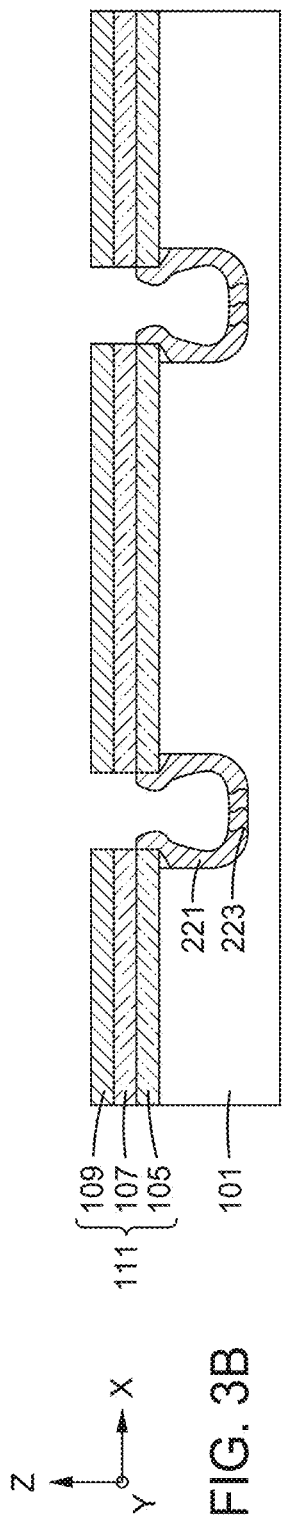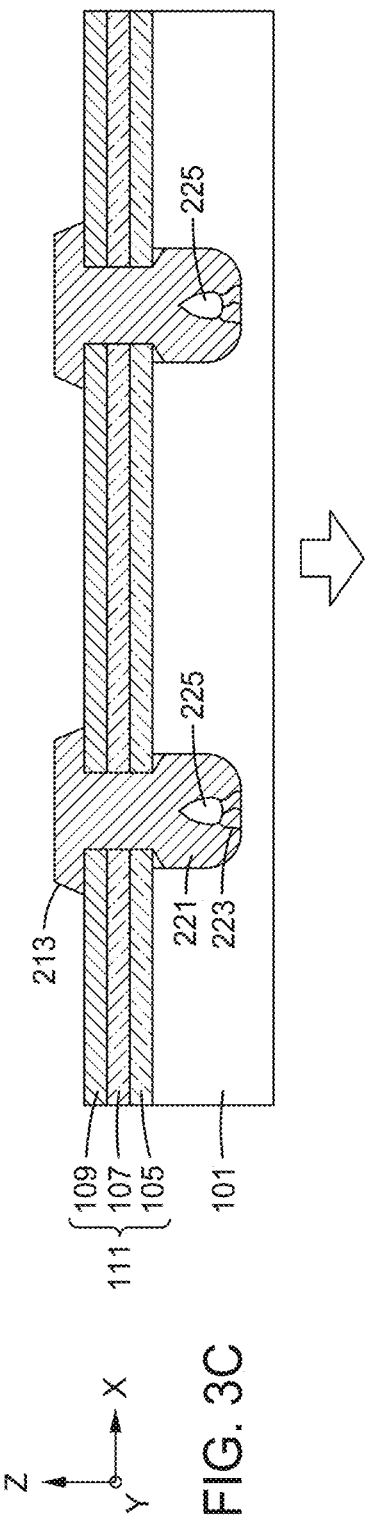

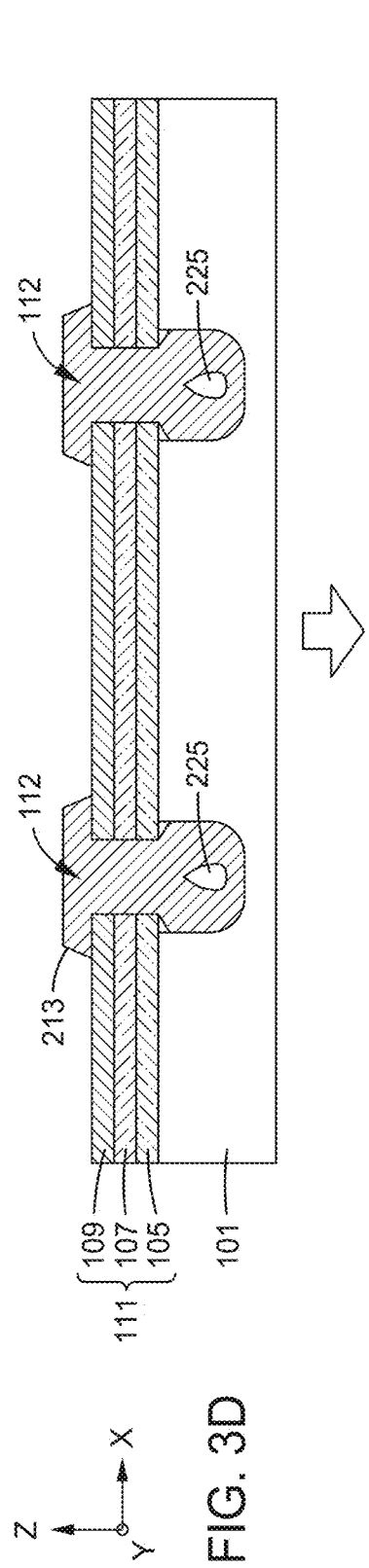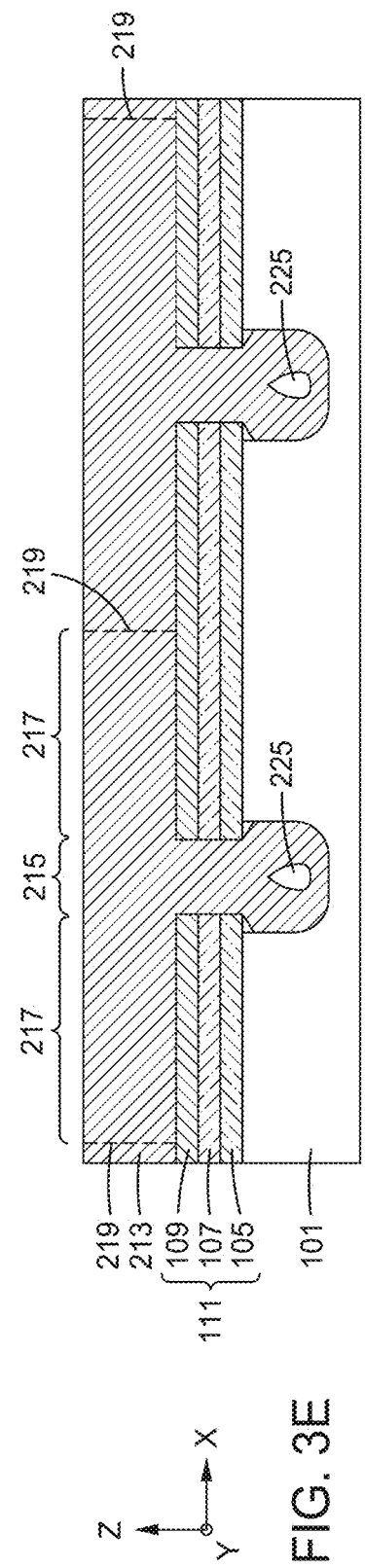

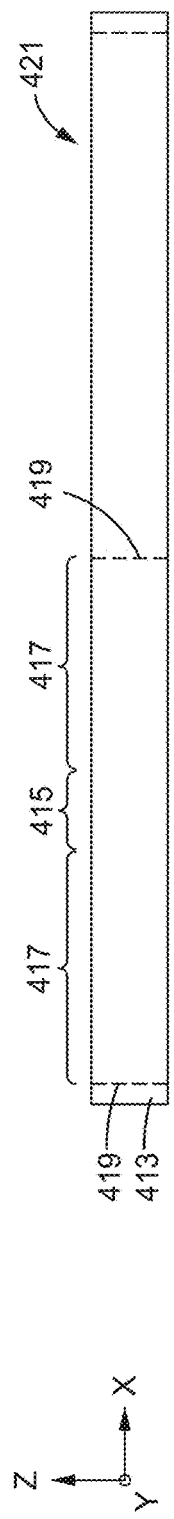
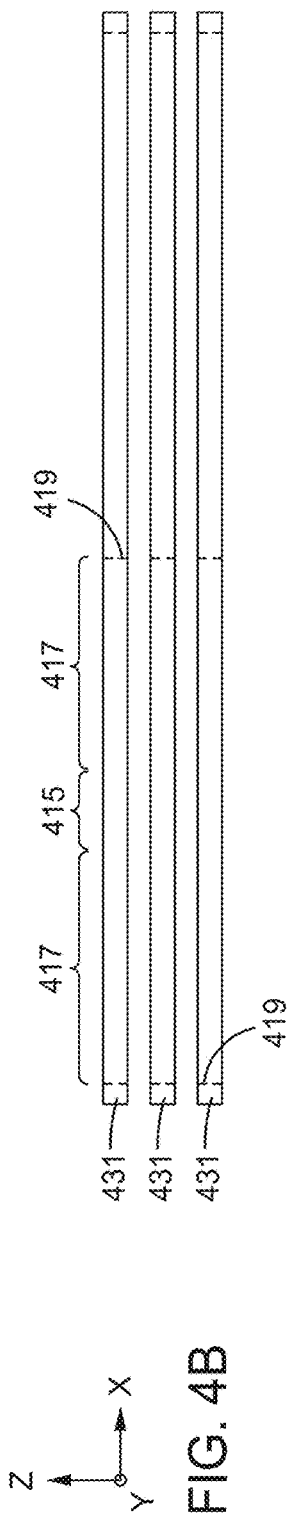
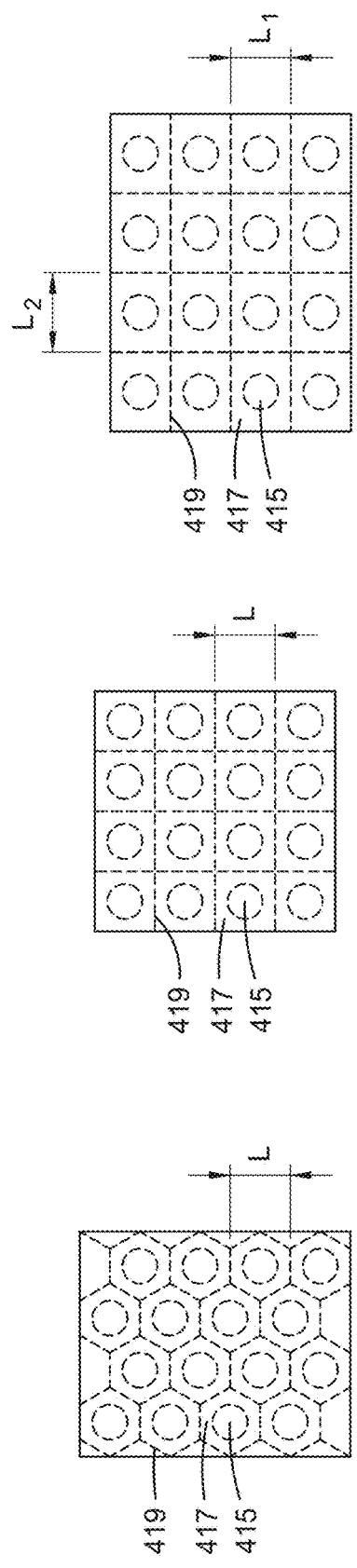
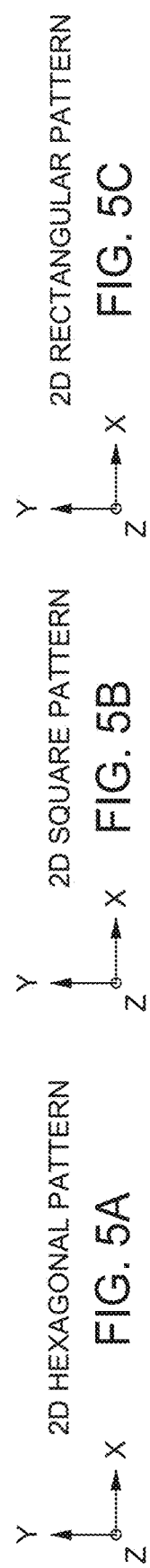

GROUP III NITRIDE SUBSTRATE WITH OXYGEN GRADIENT, METHOD OF MAKING, AND METHOD OF USE

CROSS-REFERENCE TO RELATED APPLICATIONS

This application claims the benefit of U.S. provisional patent application Ser. No. 63/285,000, filed Dec. 1, 2021, and of U.S. provisional patent application Ser. No. 63/326,448, filed Apr. 1, 2022, both of which are herein incorporated by reference.

BACKGROUND

Field

This disclosure relates generally to techniques for processing materials for manufacture of gallium-containing nitride substrates and utilization of these substrates in optoelectronic and electronic devices. More specifically, embodiments of the disclosure include techniques for growing large area substrates using a combination of processing techniques.

Description of the Related Art

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

Progress has been made in the growth of large-area gallium nitride crystals with considerably lower defect levels than heteroepitaxial GaN layers. However, most techniques for growth of large-area GaN substrates involve GaN deposition on a non-GaN substrate, such as sapphire or GaAs. This approach generally gives rise to threading dislocations at average concentrations of $10^5$-$10^7$ cm$^{-2}$ over the surface of thick boules, as well as significant bow, stress, and strain. Reduced concentrations of threading dislocations are desirable for a number of applications. Bow, stress, and strain can cause low yields when slicing the boules into wafers, make the wafers susceptible to cracking during down-stream processing, and may also negatively impact device reliability and lifetime. Another consequence of the bow, stress, and strain is that, during growth in m-plane and semipolar directions, even by near-equilibrium techniques such as ammonothermal growth, significant concentrations of stacking faults may be generated. In addition, the quality of c-plane growth may be unsatisfactory, due to formation of cracks, multiple crystallographic domains, and the like. Capability to manufacture substrates larger than 2-4 inches is currently very limited, as is capability to produce large-area GaN substrates with a nonpolar or semipolar crystallographic orientation. Most large area substrates are manufactured by vapor-phase methods, such as hydride vapor phase epitaxy (HVPE), which are relatively expensive. A less-expensive method is desired, while also achieving large area and low threading dislocation densities as quickly as possible.

Ammonothermal crystal growth has a number of advantages over HVPE as a means for manufacturing GaN boules. However, the performance of ammonothermal GaN crystal growth processing may be significantly dependent on the size and quality of seed crystals. Seed crystals fabricated by HVPE may suffer from many of the limitations described above, and large area ammonothermally-grown crystals are not widely available. A number of techniques, such as lateral epitaxial overgrowth (LEO) may be able to beneficiate HVPE-derived seed crystals, but may nonetheless suffer from issues with strain, cracking, and low yields.

Oxygen is a ubiquitous impurity in GaN substrates and devices and, in many cases, its negative consequences have motivated manufacturers to try to minimize oxygen concentrations in their processes. However, the global effects of oxygen on thick GaN boules and free-standing GaN wafers are not yet well understood.

Due to at least the issues described above, there is a need for substrates that have a lower defect density, a controlled oxygen incorporation, and are formed by techniques that improve the crystal growth process. Also, from the above, it is seen that techniques for improving crystal growth are highly desirable.

SUMMARY

Embodiments of the disclosure may provide a free-standing crystal that includes a group III metal and nitrogen, wherein the free-standing crystal includes a wurtzite crystal structure, a first surface having a maximum dimension greater than 40 millimeters in a first direction and a crystallographic orientation within 10 degrees of (0 0 0 1), and a second surface on the opposite side of the crystal from the first surface, wherein the separation between the first surface and the second surface is between about 100 micrometers and about 1000 micrometers. The average oxygen concentration within the free-standing crystal at a depth of 2 to 10 micrometers from the first surface is between $1\times10^{16}$ cm$^{-3}$ and $5\times10^{19}$ cm$^{-3}$ and is greater, by a factor between about 1.1 and about 10, than the average oxygen concentration within a depth of 2 to 10 micrometers from the second surface.

Embodiments of the disclosure may further provide a free-standing nonpolar or semipolar crystal, comprising a group III metal and nitrogen, wherein the free-standing nonpolar or semipolar crystal comprises: a wurtzite crystal structure. The free-standing nonpolar or semipolar crystal comprises a first surface having a crystallographic orientation within 30 degrees of {1 0 –1 0}, a maximum dimension greater than 5 millimeters in a first direction, the first direction comprising a projection of [0 0 0 1] on the first surface, and a maximum dimension greater than 15 millimeters in a second direction orthogonal to the first direction; and a second surface on an opposite side of the crystal from the first surface, wherein a separation distance between the first surface and the second surface is between 100 micrometers and 1000 micrometers. The free-standing nonpolar or semipolar crystal also includes an average concentration of stacking faults on the first surface below $10^3$ cm$^{-1}$. The free-standing nonpolar or semipolar crystal is characterized by an optical absorption coefficient at a wavelength of 450 nanometers having a locally-minimum value between 0.1 cm$^{-1}$ and 5 cm$^{-1}$ at a first position along the first surface and increasing to a locally-maximum value between 0.5 cm$^{-1}$ and 25 cm$^{-1}$ at a second position along the first direction, the second position being separated from the first position by a distance between 1 millimeter and 25 millimeters.

Embodiments of the disclosure may further provide a free-standing nonpolar or semipolar crystal, comprising a group III metal and nitrogen, wherein the free-standing nonpolar or semipolar crystal comprises a wurtzite crystal structure. The free-standing nonpolar or semipolar crystal comprises a first surface having a crystallographic orientation within 30 degrees of {1 0 –1 0}, a maximum dimension greater than 5 millimeters in a first direction, the first direction comprising a projection of [0 0 0 1] on the first surface, and a maximum dimension greater than 15 millimeters in a second direction orthogonal to the first direction; and a second surface on an opposite side of the crystal from the first surface, wherein a separation distance between the first surface and the second surface is between 100 micrometers and 1000 micrometers. The free-standing nonpolar or semipolar crystal comprises an average concentration of stacking faults on the first surface below 10$^3$ cm$^{-1}$. The free-standing nonpolar or semipolar crystal comprises is characterized by an oxygen concentration having a minimum value between 2×10$^{17}$ cm$^{-3}$ and 1×10$^{19}$ cm$^{-3}$ at a first position along the first surface and increasing to a maximum value between 1×10$^{18}$ cm$^{-3}$ and about 5×10$^{19}$ cm$^{-3}$ at a second position along the first direction, the second position being separated from the first position by a distance between 1 millimeter and 25 millimeters.

Embodiments of the disclosure may further provide a free-standing nonpolar or semipolar crystal, comprising a group III metal and nitrogen, wherein the free-standing nonpolar or semipolar crystal comprises a wurtzite crystal structure. The free-standing nonpolar or semipolar crystal comprises a first surface having a crystallographic orientation within 30 degrees of {1 0 –1 0}, a maximum dimension greater than 5 millimeters in a first direction, the first direction comprising a projection of [0 0 0 1] on the first surface, and a maximum dimension greater than 15 millimeters in a second direction orthogonal to the first direction; and a second surface on an opposite side of the crystal from the first surface, wherein a separation distance between the first surface and the second surface is between 100 micrometers and 1000 micrometers. The free-standing nonpolar or semipolar crystal comprises an average concentration of stacking faults on the first surface below 10$^3$ cm$^{-1}$, and a difference between a maximum value of a {20-21} lattice spacing and a minimum value of a {20-21} lattice spacing on the first surface along the first direction is at least 2×10$^{-5}$ Å and not more than 3×10$^{-4}$ Å and a separation between a locally-maximum {20-21} lattice constant and a locally-minimum {20-21} lattice constant along the first direction is between about 1 millimeter and about 25 millimeters.

Embodiments of the disclosure may further provide a free-standing crystal, comprising a group III metal and nitrogen, wherein the free-standing crystal comprises a wurtzite crystal structure. The free-standing crystal includes a first surface having a maximum dimension greater than 40 millimeters in a first direction and a crystallographic orientation within 10 degrees of (0 0 0 1); and a second surface on the opposite side of the crystal from the first surface, wherein the separation between the first surface and the second surface is between about 100 micrometers and about 1000 micrometers. The free-standing crystal includes an average oxygen concentration within a depth of 2 to 10 micrometers from the first surface is between 1×10$^{16}$ cm$^{-3}$ and 5×10$^{19}$ cm$^{-3}$ and is greater, by a factor between about 1.1 and about 10, than the average oxygen concentration within a depth of 2 to 10 micrometers from the second surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 3A, 3B, and 3C are simplified diagrams illustrating an improved epitaxial lateral overgrowth process for forming a large area group III metal nitride crystal, according to an embodiment of the present disclosure.

FIGS. 3D and 3E are simplified diagrams illustrating an improved epitaxial lateral overgrowth process for forming a large area group III metal nitride crystal, according to an embodiment of the present disclosure.

FIGS. 4A and 4B are simplified diagrams illustrating a method of forming a free-standing ammonothermal group III metal nitride boule and free-standing ammonothermal group III metal nitride wafers.

FIGS. 5A-5E are simplified diagrams illustrating threading dislocation patterns and regions on a free-standing ammonothermal group III metal nitride boule or wafer according to an embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
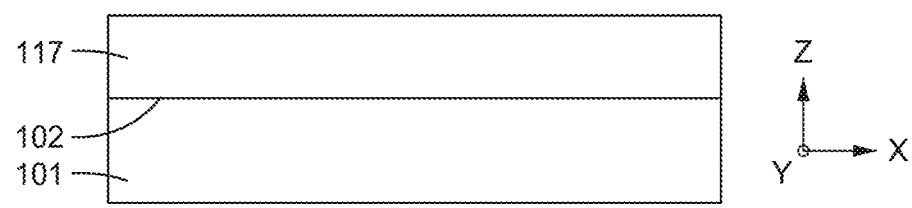
FIG. 1A is a simplified diagram illustrating growth of a crystal on a substrate, according to an embodiment of the present disclosure.

According to the present disclosure, techniques related to techniques for processing materials for manufacture of group-III metal nitride and gallium-based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, laser diodes, light emitting diodes, photodiodes, solar cells, photo electrochemical water splitting and hydrogen generation, photodetectors, integrated circuits, and transistors, and others.

Oxygen is a ubiquitous impurity in the nitrides, including GaN, AlN, InN, and their alloys and, typically, is present at higher concentrations in ammonothermal GaN compared to GaN grown by other methods, such as HVPE. Oxygen, present as a substitutional impurity for nitrogen, acts as an n-type dopant in GaN. However, oxygen also causes an increase in the lattice constants [C. Van de Walle, Phys. Rev. B68, 165209 (2003)], which implies that oxygen gradients in GaN crystals can cause stresses and cracking, particularly in GaN crystals thicker than 0.1 mm, 0.3 mm, 1 mm, or 10 mm. In addition, in ammonothermal GaN oxygen incorporation is typically accompanied by formation of Ga vacancies decorated with H and/or O [for example, W. Jiang, et al., U.S. Pat. No. 9,543,392], which gives rise to sub-bandgap optical absorption and may lead to dark crystals and wafers and may cause further increases in the lattice constants. Ga vacancy complexes with oxygen and/or hydrogen have been investigated by many authors [C. G. Van de Walle, Phys. Rev. B56, R10020 (1997); K. Saarinen, et al., Phys. Rev. B64, 233301 (2001); F. Tuomisto, et al., Appl. Phys. Lett. 86, 031915 (2005); S. Hautakangas, et al., Phys. Rev. B73, 193301 (2006); F. Tuomisto, et al., Phys. Stat. Solidi (b) 243, 1436 (2006); N. T. Son, et al., Phys. Rev. B80, 153202 (2009); F. Tuomisto, et al., J. Crystal Growth 312, 2620 (2010); F. Tuomisto, et al., J. Crystal Growth 403, 114 (2014); S. Suihkonen, et al., Appl. Phys. Lett. 108, 202105 (2016); C. E. Dreyer, et al., Appl. Phys. Lett. 108, 141101 (2016); A. Uedono, et al., J. Crystal Growth 448, 117 (2016); K. Jiang, et al., Appl. Phys. Express 10, 075506 (2017); K. Iso, et al., Appl. Phys. Express 12, 125502 (2019); M. A. Reschikov, J. Appl. Phys. 129, 095703 (2021)] but we are unaware of determinations of their specific effects on the lattice constants of GaN.

Sintonen, et al. [J. Crystal Growth 456, 51 (2016)] characterized the distribution of oxygen and other impurities in a cross section of a crystal grown by an ammonobasic method and found that the oxygen level was approximately constant over the thickness of the crystal, which was grown sequentially in several growth runs, with some upward gradients and some downward gradients, plus fluctuations in the immediate vicinity of regrowth interfaces that generated strain.

As a result of the negative effects of oxygen, including strain and optical absorption, many groups have sought to minimize the concentration of oxygen in raw materials, the crystal growth environment, and in nitride crystals. For example, D'Evelyn, et al. [U.S. Pat. No. 7,078,731] taught oxygen concentrations in grown crystals less than $3 \times 10^{18}$ cm$^{-3}$ or $3 \times 10^{17}$ cm$^{-3}$ by holding the total oxygen content in the raw materials and a capsule used to contain the raw materials below 15 parts per million or below 1.5 parts per million, respectively, with respect to the weight of the final crystal. D'Evelyn, et al. [U.S. Pat. No. 8,461,071] taught the formation of polycrystalline GaN with an incorporated getter, such that the oxygen content present as $Ga_2O_3$ or as a substitutional impurity within the polycrystalline gallium nitride had a concentration approaching or less than about 0.1 part per million.

Surprisingly, the present inventors have found that oxygen impurities, and engineered oxygen gradients within GaN crystals, within certain ranges, can convey a number of benefits to ammonothermal GaN crystal growth in addition to n-type doping. It is well known that oxygen incorporation into ammonothermal GaN differs by crystallographic sector (for example, Jiang, et al., U.S. Pat. No. 9,453,392; Sintonen, et al., J. Crystal Growth 456, 43 (2016)), so it may be beneficial to limit the crystal growth process to predominantly one crystallographic sector, for example, by masking, back-to-back seed placement, or the like (for example, as described by D'Evelyn, U.S. Pat. No. 8,979,999). In certain embodiments, the crystal growth process is chosen to be predominantly in the [0 0 0 −1], or −c, direction.

FIG. 1A is a schematic cross-sectional view of a bulk GaN crystal 117 that has been grown on substrate 101, predominantly in a single crystallographic orientation. In certain embodiments, substrate 101 consists of or includes a substrate material that is a single-crystalline group-III metal nitride, gallium-containing nitride, or gallium nitride. The substrate 101 may be grown by HVPE, ammonothermally, or by a flux method. One or both large area surfaces of substrate 101 may be polished and/or chemical-mechanically polished. A large-area surface 102 of substrate 101 may have a crystallographic orientation within 10 degrees, within 5 degrees, within 2 degrees, within 1 degree, or within 0.5 degree of (0001) +c-plane, (000-1) −c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, or {2 1 −3 ±1}. Large-area surface 102 may have an (h k i l) semipolar orientation, where i=−(h+k) and l and at least one of h and k are nonzero. Large-area surface 102 may have a maximum lateral dimension between about 5 millimeters and about 600 millimeters and a minimum lateral dimension between about 1 millimeter and about 600 millimeters and substrate 101 may have a thickness between about 10 micrometers and about 10 millimeters, or between about 100 micrometers and about 2 millimeters.

Substrate 101 may have a surface threading dislocation density less than about $10^7$ cm$^{-2}$, less than about $10^6$ cm$^{-2}$, less than about $10^5$ cm$^{-2}$, less than about $10^4$ cm$^{-2}$ less than about $10^3$ cm$^{-2}$, or less than about $10^2$ cm$^{-2}$. Substrate 101 may have a stacking-fault concentration below about $10^4$ cm$^{-1}$, below about $10^3$ cm$^{-1}$, below about $10^2$ cm$^{-1}$, below about 10 cm$^{-1}$ or below about 1 cm$^{-1}$. Substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a crystallographic radius of curvature greater than 0.1 meter, greater than 1 meter, greater than 10 meters, greater than 100 meters, or greater than 1000 meters, in at least one, at least two, or in three independent or orthogonal directions.

Substrate 101 may comprise regions having a relatively high concentration of threading dislocations separated by regions having a relatively low concentration of threading dislocations. The concentration of threading dislocations in the relatively high concentration regions may be greater than about $10^5$ cm$^{-2}$, greater than about $10^6$ cm$^{-2}$ greater than about $10^7$ cm$^{-2}$, or greater than about $10^8$ cm$^{-2}$. The concentration of threading dislocations in the relatively low concentration regions may be less than about $10^6$ cm$^{-2}$, less than about $10^5$ cm$^{-2}$, or less than about $10^4$ cm$^{-2}$. Substrate 101 may comprise regions having a relatively high electrical conductivity separated by regions having a relatively low electrical conductivity. Substrate 101 may have a thickness between about 10 microns and about 100 millimeters, or between about 0.1 millimeter and about 10 millimeters. Substrate 101 may have a maximum dimension, including a diameter, of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters.

Large-area surface 102 (FIG. 1A) may have a crystallographic orientation within about 5 degrees of the (000-1) N-face, c-plane orientation, may have an x-ray diffraction ω-scan rocking curve full-width-at-half-maximum (FWHM) less than about 200 arcsec less than about 100 arcsec, less than about 50 arcsec, or less than about 30 arcsec for the (002) and/or the (102) reflections and may have a dislocation density less than about $10^7$ cm$^{-2}$, less than about $10^6$ cm$^{-2}$, or less than about $10^5$ cm$^{-2}$. In some embodiments, the threading dislocations in large-area surface 102 are approximately uniformly distributed. In other embodiments, the threading dislocations in large-area surface 102 are arranged inhomogeneously as a one-dimensional array of rows of relatively high- and relatively low-concentration regions or as a two-dimensional array of high-dislocation-density regions within a matrix of low-dislocation-density regions. The crystallographic orientation of large-area surface 102 may be approximately constant, that is, may vary by less than about 5 degrees, less than about 2 degrees, less than about 1 degree, less than about 0.5 degrees, less than about 0.2 degrees, less than about 0.1 degrees, or less than about 0.05 degrees.

In certain embodiments, large-area surface 102 is etched, for example, to remove surface damage or to improve adhesion of a mask layer. In certain embodiments, large-area surface 102 is etched by one or more of chemical etching, electrochemical etching, photoelectrochemical etching, reactive ion etching, chemically-assisted ion beam etching, or by another form of wet or dry etching.

Figure 1B:
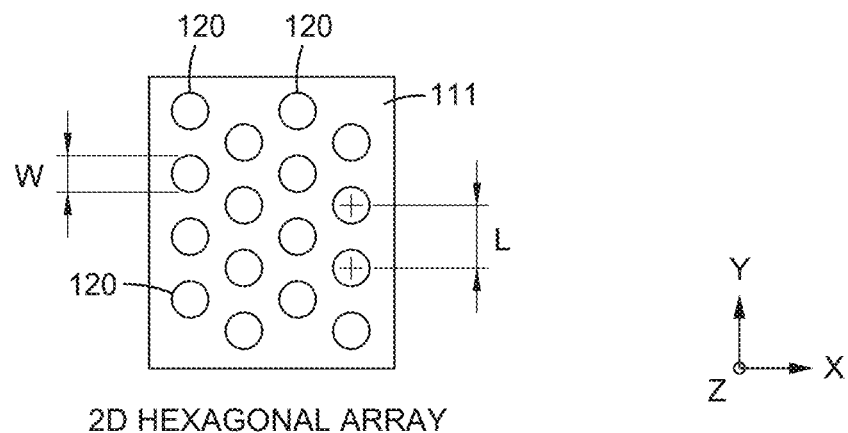
FIGS. 1B, 1C, 1D, 1E, and 1F are top views of arrangements of openings in a patterned mask layer on a seed crystal or a substrate according to an embodiment of the present disclosure.
Figure 1C:
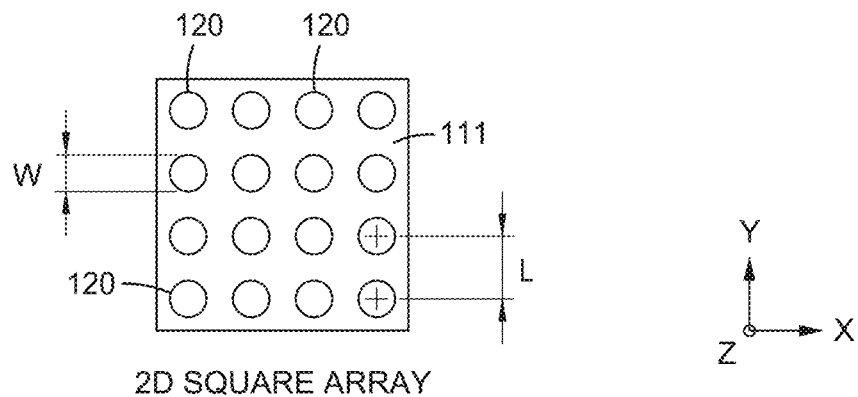
Figure 1D:
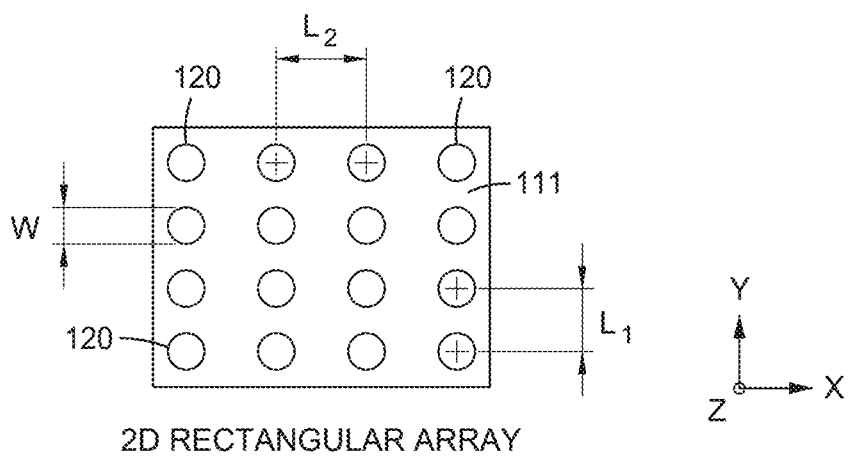

In certain embodiments, a patterned mask layer is provided on large-area surface 102 before growing ammonothermal GaN crystal 117 on substrate 101. FIGS. 1B-1H are top views of arrangements of growth centers 120 in patterned mask layers 111 on substrate 101. In certain embodiments, the growth centers 120 include or consist of a set of exposed regions (not shown in FIGS. 1B-1H, but see FIG. 2A) of the substrate 101, for example, openings in the patterned mask layers, that function as growth centers. As shown in FIG. 2A, patterned mask layers 111 may include one, two, or more of an adhesion layer 105, a diffusion barrier layer 107, and an inert layer 109, and growth centers 120 may include or consist of openings 112 in patterned mask layer 111. The adhesion layer 105 may comprise one or more of Ti, TiN, TiN$_y$, TiSi$_2$, Ta, TaN$_y$, Al, Ge, Al$_x$Ge$_y$, Cu, Si, Cr, V, Ni, W, TiW$_x$, TiW$_x$N$_y$, or the like and may have a thickness between about 1 nanometer and about 1 micrometer. The diffusion-barrier layer 107 may comprise one or more of TiN, TiN$_y$, TiSi$_2$, W, TiW$_x$, TiN$_y$, WN$_y$, TaN$_y$, TiW$_x$N$_y$, TiW$_x$Si$_z$N$_y$, TiC, TiCN, Pd, Rh, Cr, or the like, and have a thickness between about 1 nanometer and about 10 micrometers. The inert layer 109 may comprise one or more of Au, Ag, Pt, Pd, Rh, Ru, Ir, Ni, Cr, V, Ti, or Ta and may have a thickness between about 10 nanometers and about 100 micrometers. The one or more patterned mask layers 111 may be deposited by sputter deposition, thermal evaporation, electron-beam evaporation, electroplating, electroless plating, a combination or sequence of these techniques, or the like.

Exposed regions, or openings 112 may be formed by one or more of negative photoresist lift-off, shadow masking, positive photoresist reactive ion etching, wet chemical etching, ion milling, and nanoimprint lithography, laser cutting, or the like. In certain embodiments, trenches are prepared underlying exposed growth centers 120.

Figure 1E:
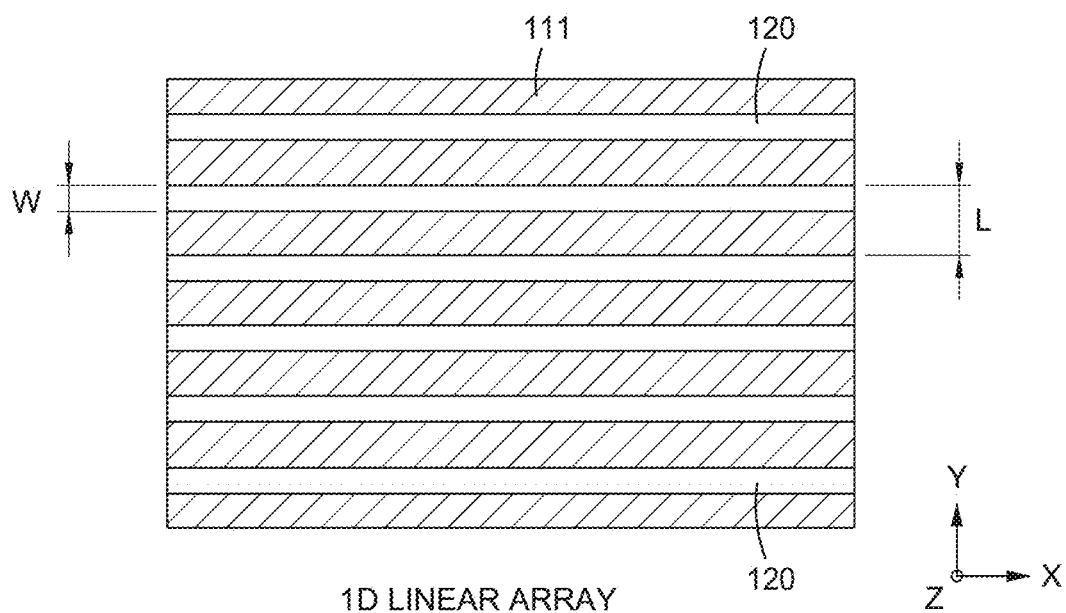
Figure 1F:
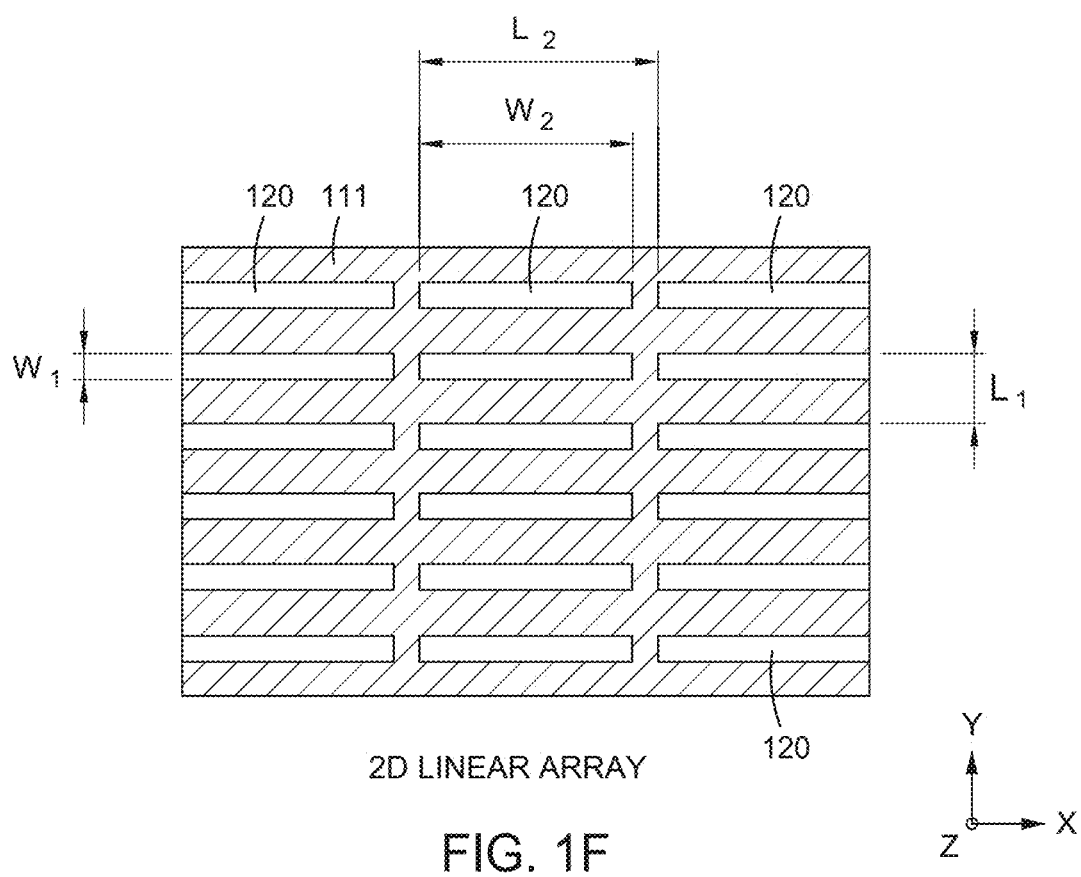
Figure 1G:
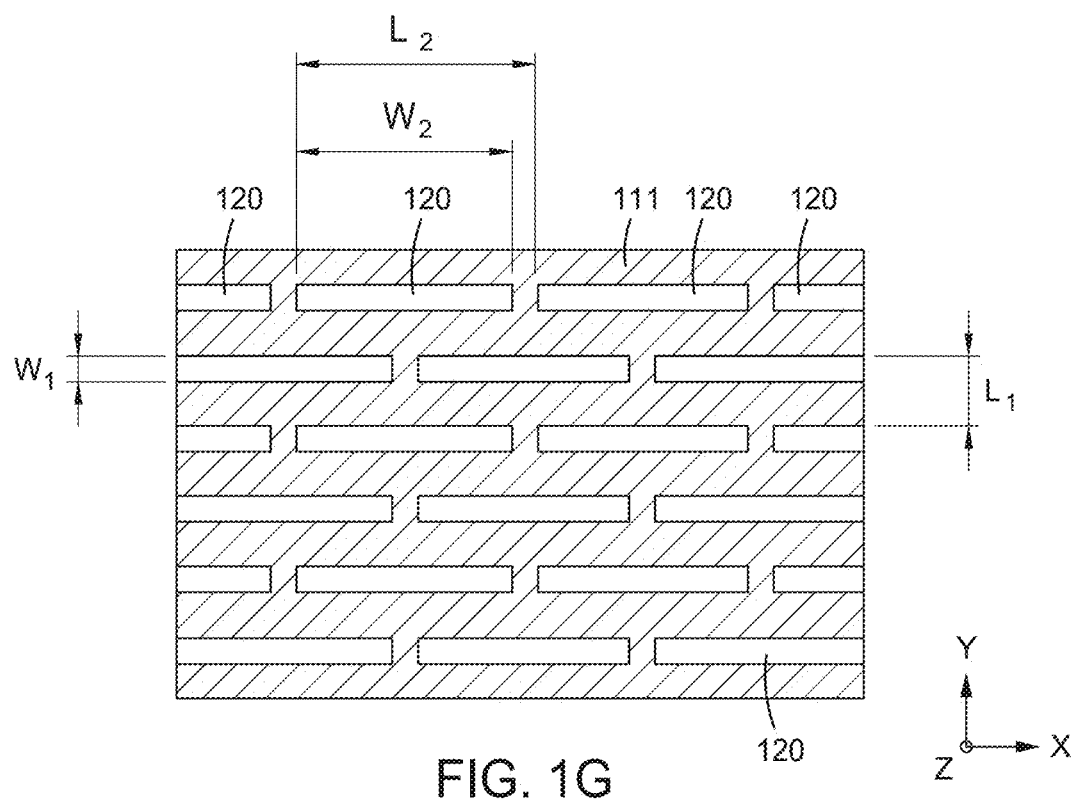
FIGS. 1G and 1H are top views of arrangements of openings in a patterned mask layer on a seed crystal or a substrate according to an embodiment of the present disclosure.
Figure 1H:
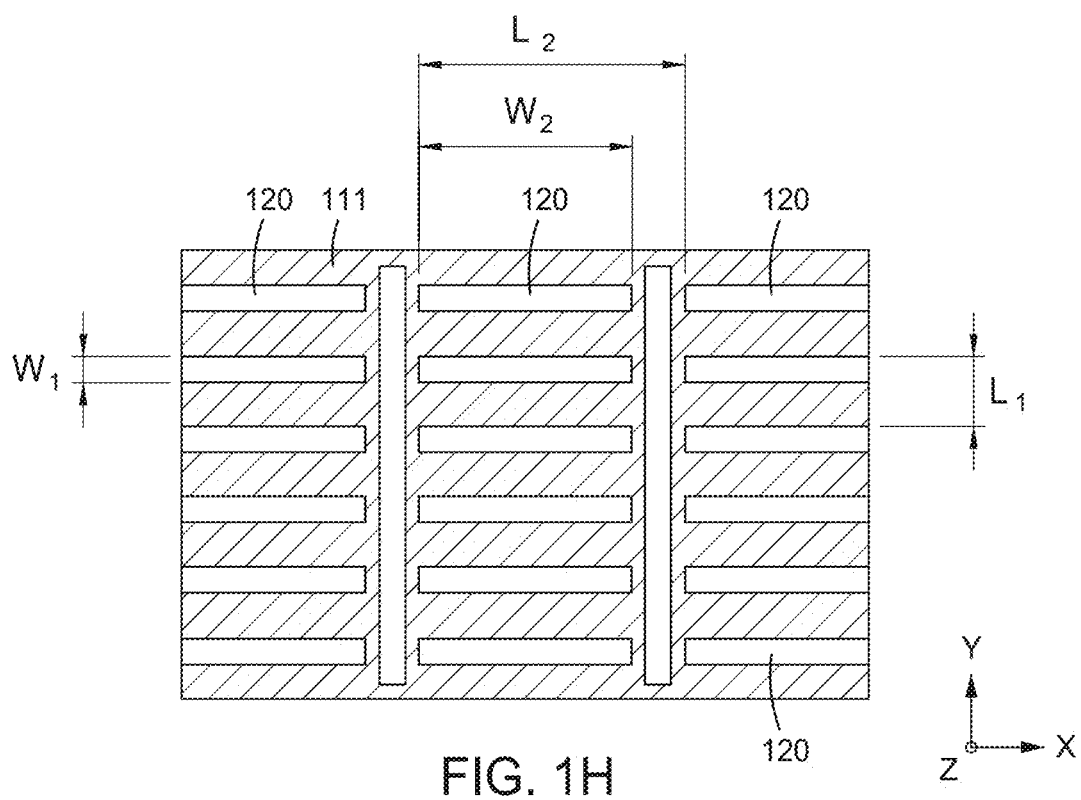
Figure 2A:
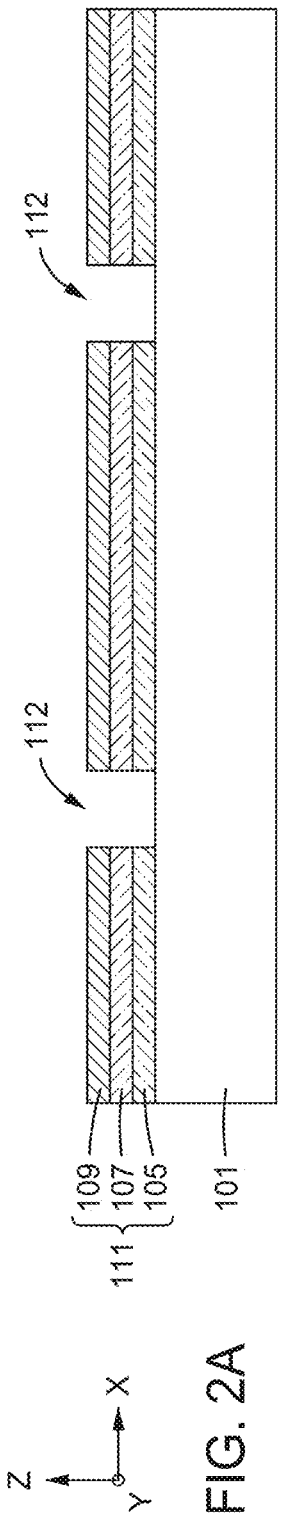
FIGS. 2A, 2B, and 2C are simplified diagrams illustrating an epitaxial lateral overgrowth process for forming a large area group III metal nitride crystal, according to an embodiment of the present disclosure.

In certain embodiments, the exposed growth center regions (or also referred to herein as growth centers 120) are arranged in a one-dimensional (1D) array in the y-direction, such as a single column of exposed growth centers 120 as shown in FIG. 1E. In certain embodiments, the exposed growth centers 120 are arranged in a two-dimensional (2D) array in x- and y-directions, such as illustrated in FIGS. 1B-1D and 1F-1H. The openings in patterned mask layer 111, and thus exposed growth centers 120, may be round, square, rectangular, triangular, hexagonal, or the like, and may have an opening dimension or diameter W between about 1 micrometer and about 5 millimeters, or between about 10 micrometers and about 500 micrometers, such as illustrated in FIGS. 1B-1H. The exposed growth centers 120 may be arranged in a 2D hexagonal or square array with a pitch dimension L between about 5 micrometers and about 20 millimeters, between about 200 micrometers and about 15 millimeters, or between about 500 micrometers and about 10 millimeters, or between about 0.8 millimeter and about 5 millimeters, such as illustrated in FIGS. 1B and 1C. The exposed growth centers 120 may be arranged in a 2D array, in which the pitch dimension $L_1$ in the y-direction and pitch dimension $L_2$ in the x-direction may be different from one another, as illustrated in FIGS. 1D and 1F-1H. The exposed growth centers 120 may be arranged in a rectangular, parallelogram, hexagonal, or trapezoidal array (not shown), in which the pitch dimensions $L_1$ in the y-direction and $L_2$ in the x-direction may be different from one another, as illustrated in FIGS. 1D and 1F-1H). The array of exposed growth centers 120 may also be linear or irregular shaped. The exposed growth centers 120 in patterned mask layer(s) 111 may be placed in registry with the structure of substrate 101. For example, in certain embodiments, large-area surface 102 is hexagonal in shape in the X-Y plane (FIG. 1), e.g., a (0001) or (000-1) crystallographic orientation, and the openings in patterned mask layer(s) 111 comprise a 2D hexagonal array such that the separations between nearest-neighbor openings are parallel to <11-20> or <10-10> directions in large-area surface 102. In certain embodiments, large-area surface 102 of the substrate is nonpolar or semipolar and the exposed growth centers 120 comprise a 2D square or rectangular array such that the separations between nearest-neighbor openings are parallel to the projections of two of the c-axis, an m-axis, and an a-axis on large-area surface 102 of substrate 101. In certain embodiments, the pattern of exposed growth centers 120 is obliquely oriented with respect to the structure of substrate 101, for example, wherein the exposed growth centers 120 are rotated by between about 1 degree and about 44 degrees with respect to a high-symmetry axis of the substrate, such as a projection of the c-axis, an m-axis, or an a-axis on large-area surface 102 of substrate 101 that has a hexagonal crystal structure, such as a Wurtzite crystal structure. In certain embodiments, the exposed growth centers 120 are substantially linear rather than substantially round. In certain embodiments, the exposed growth centers 120 are slits having a width W and period L that run across the entire length of substrate 101, as illustrated in FIG. 1E. In certain embodiments, the exposed growth centers 120 are slits that have a width $W_1$ in the y-direction and a predetermined length $W_2$ in the x-direction that is less than the length of substrate 101 and may be arranged in a 2D linear array with period $L_1$ in the y-direction and period $L_2$ in the x-direction, as illustrated in FIGS. 1F-1H. In some embodiments, adjacent rows of exposed growth centers 120 (e.g., slits) may be offset in the x-direction from one another rather than arranged directly adjacent, as shown in FIG. 1G. In certain embodiments, the adjacent rows of exposed growth centers 120 (e.g., slits) may be offset in the longitudinal y-direction from one another. In certain embodiments, the exposed growth centers 120 include slits that extend in two or more different directions, for example, the x-direction and the y-direction, as shown in FIG. 1H. In certain embodiments, the exposed growth centers 120 (e.g., slits) may be arranged in a way that reflects the hexagonal symmetry of the substrate. In certain embodiments, the exposed growth centers 120 (e.g., slits) may extend to the edge of the substrate 101.

In certain embodiments, the backside of substrate 101 is masked, with similar materials as the patterned mask layer 111, with a pattern similar to one of the patterns described above. In certain embodiments, the backside of substrate 101 is masked, with similar materials as the patterned mask layer 111, with no openings or growth centers on the backside, so that subsequent crystal growth takes place only on the frontside and, perhaps, the edges, of substrate 101. In certain embodiments, the backside of substrate 101 is unmasked but is covered, for example, using a metal foil or a seed mounting fixture, so that subsequent crystal growth takes place only on the frontside and, perhaps, the edges, of substrate 101. In certain embodiments, the backside of substrate 101 is left open and is subsequently exposed to a crystal growth environment, so that crystal growth occurs on both the frontside and backside and, perhaps, also the edges, of substrate 101.

Additional details on the preparation of a substrate with patterned exposed regions may be found in U.S. Pat. No. 9,589,792 and in U.S. Pat. Appl. No. 2021/0249252.

Substrate 101, which may be unmasked (FIG. 1A), may have a patterned mask (FIG. 2A), or may have a patterned mask with patterned trenches 115 (FIG. 3A), is then used as a substrate for bulk crystal growth, for example, comprising ammonothermal growth, HVPE growth, or flux growth. In the discussion below the grown GaN layer will be referred to as an ammonothermal layer, even though other bulk growth methods, such as HVPE or flux growth, may be used instead. In certain embodiments, comprising ammonothermal bulk growth, the substrate 101, which may be patterned, may then be suspended on a seed rack and placed in a sealable container, such as a capsule, an autoclave, or a liner within an autoclave. In certain embodiments, one or more pairs of patterned substrates are suspended back to back, with the patterned large area surfaces facing outward. A group III metal source, such as polycrystalline group III metal nitride, at least one mineralizer composition, and ammonia (or other nitrogen containing solvent) are then added to the sealable container (e.g., capsule or autoclave) and the sealable container is sealed. The mineralizer composition may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one, two, or more of F, Cl, Br, I, HF, HCl, HBr, HI, Ga, GaN, and $NH_3$. The mineralizer may comprise other alkali, alkaline earth, or ammonium salts, other halides, urea, sulfur or a sulfide salt, or phosphorus or a phosphorus-containing salt. The sealable container (e.g., capsule) may then be placed in a high pressure apparatus, such as an internally heated high pressure apparatus or an autoclave, and the high pressure apparatus sealed. The sealable container, containing the substrates 101, which may be patterned, is then heated to a temperature above about 400 degrees Celsius and pressurized above about 50 megapascals to perform ammonothermal crystal growth. In certain embodiments, the substrate is exposed to an etch-back process, for example, by applying a reverse or reduced temperature gradient, that is, a temperature gradient opposite in sign and/or reduced in magnitude from that used for crystal growth. For example, a reverse temperature gradient may have a value between approximately 1 degree Celsius and approximately 50 degrees Celsius and may be held for a time between approximately 1 minute and approximately 24 hours. A reduced temperature gradient may have a magnitude between zero and 5 degrees Celsius and may be held for a time between approximately 1 minute and approximately 24 hours. In certain embodiments, the etch-back process removes a thickness between about 1 micrometer and about 50 micrometers from one or more surfaces of substrate 101 before the onset of growth.

Figure 2B:
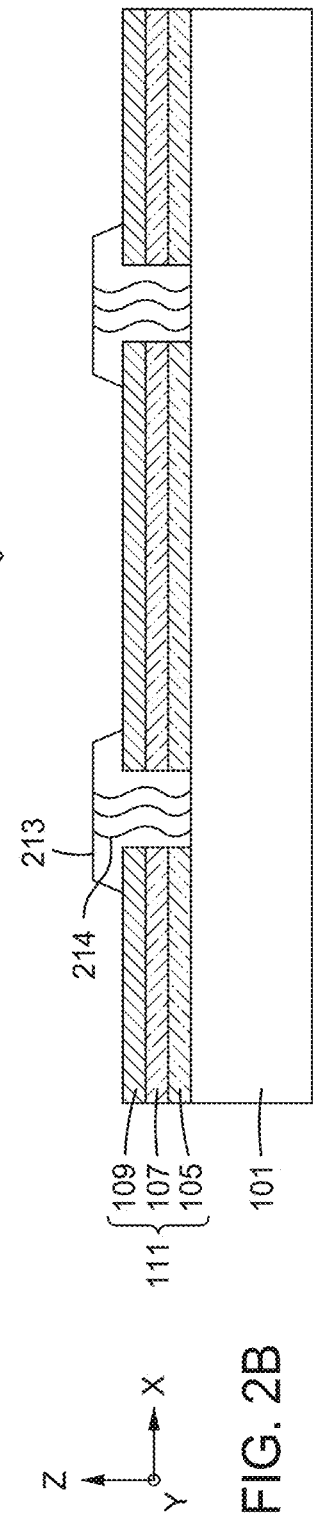
Figure 2C:
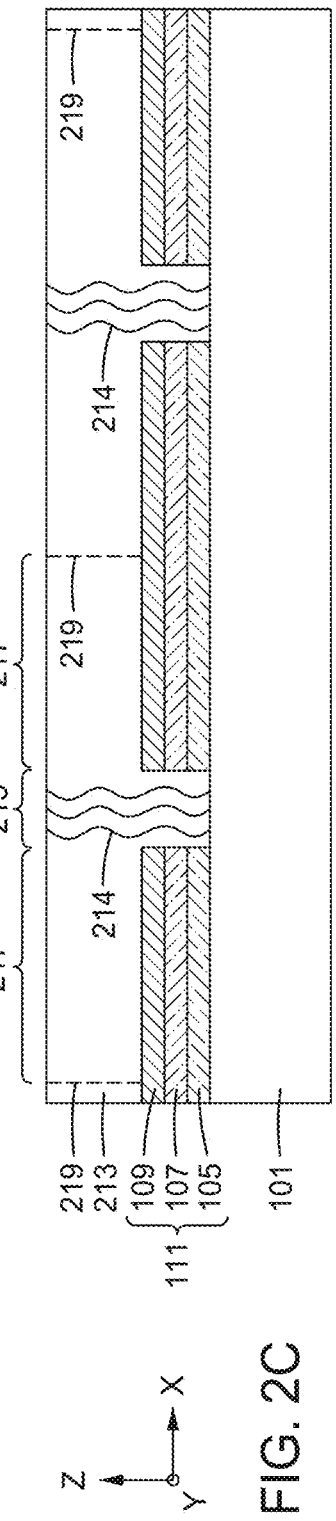
Figure 5D:
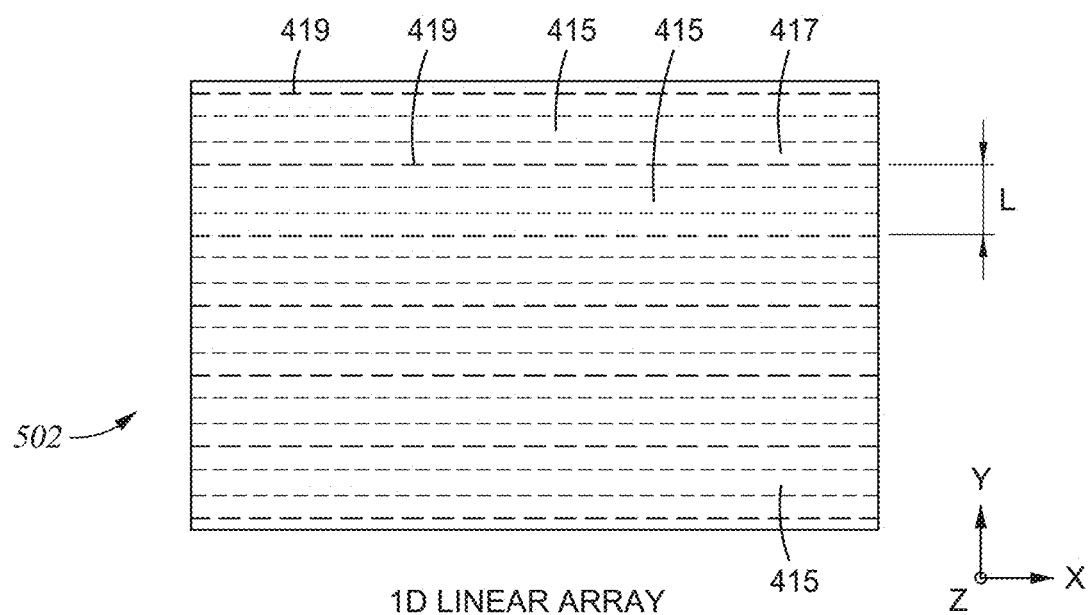
Figure 5E:
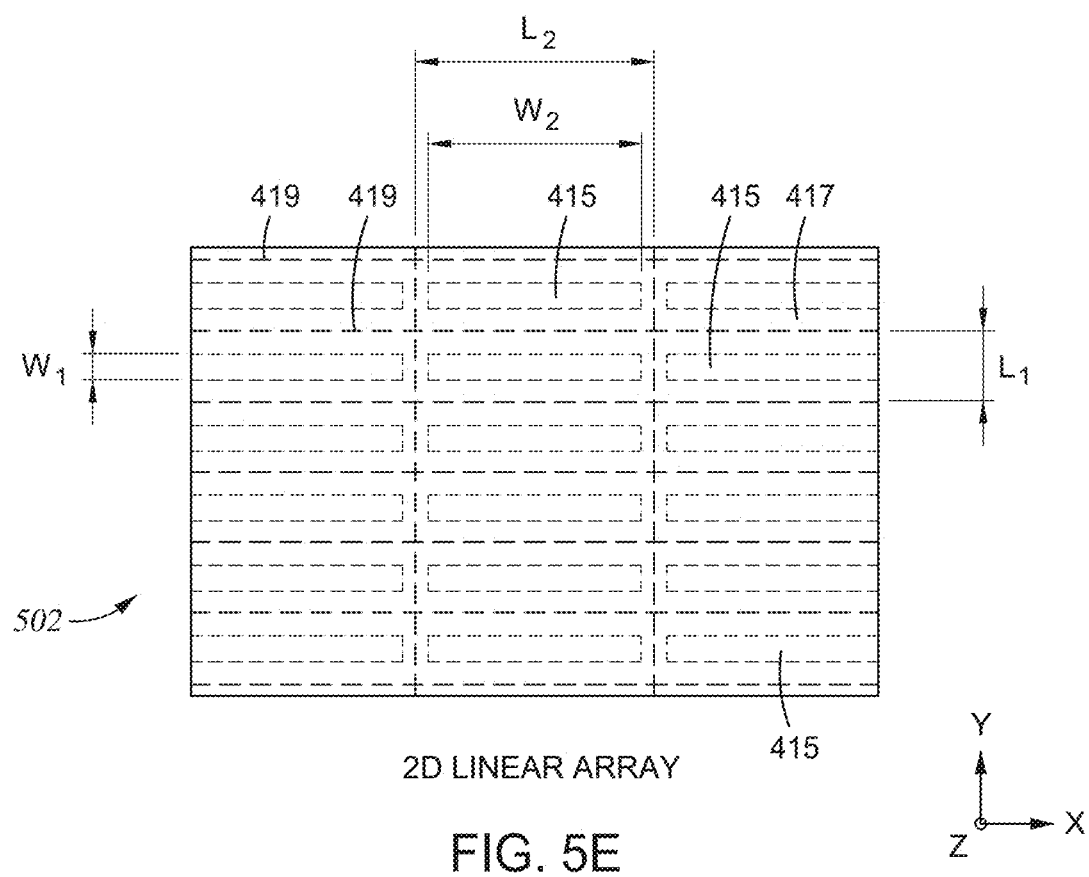

FIG. 1A illustrates bulk crystal growth on a substrate that is not masked on the large-area surface 102. FIGS. 2A-2C illustrate bulk crystal growth by a lateral epitaxial overgrowth (LEO) process with no trenches below mask openings. During a bulk crystal growth process, group III metal nitride layer 213 grows through the openings 112 of patterned mask layer 111, grows outward through the openings, as shown in FIG. 2B, grows laterally over patterned mask layer 111, and coalesces, as shown in FIG. 2C. After coalescence, group III metal nitride layer 213 comprises window regions 215, which have grown vertically with respect to the openings in patterned mask layer 111, wing regions 217, which have grown laterally over patterned mask layer 111, and coalescence fronts 219, which form at the boundaries between wings growing from adjacent openings in patterned mask layer 111. Threading dislocations 214 may be present in window regions 215, originating from threading dislocations that were present at the surface of the substrate 101.

FIGS. 3A-3C illustrate a bulk group III nitride sidewall LEO process. FIG. 3A illustrates a substrate that includes a patterned, masked trench 115, for example, formed by wet etching and/or by laser patterning. In a sidewall LEO process, a group III metal nitride material 221 grows on the sides and bottoms of the patterned, masked trenches 115 as shown in FIG. 3B. As group III metal nitride material 221 on the sidewalls of trenches 115 grow inward, it becomes progressively more difficult for group III nitride nutrient material to reach the bottom of the trenches, whether the nutrient material comprises an ammonothermal complex of a group III metal (in the case of ammonothermal growth), a group III metal halide (in the case of HVPE), or a group III metal alloy or inorganic complex (in the case of flux growth). Eventually group III metal nitride material 221 pinches off the lower regions of the trenches, forming voids 225 as shown in FIG. 3C. It has been found that the concentration of threading dislocations in group III metal nitride material 221, which has grown laterally, is lower than that in substrate 101. Many threading dislocations 223, originating from substrate 101, terminate on the surfaces of voids 225. Concomitantly, the group III metal nitride layer 213 grows upward through openings 112 (or windows) in patterned mask layer 111. However, since laterally-grown group III metal nitride material 221 has a lower concentration of threading dislocations than substrate 101 and many dislocations from substrate 101 have terminated at surfaces of voids 225, the dislocation density in the vertically grown group III metal nitride layer 213 is considerably reduced, relative to a conventional LEO process, as described above in conjunction with FIG. 2A-2C.

FIGS. 3D-3E illustrate the continuation of the sidewall LEO growth process. As in the conventional LEO process (FIGS. 2A-2C), group III metal nitride layer 213 grows within the openings 112 of patterned mask layer 111, grows outward through the openings as shown in FIG. 3D, grows laterally over patterned mask layer 111, and coalesces, as shown in FIG. 3E. After coalescence, group III metal nitride layer 213 comprises window regions 215 (FIG. 3E), which have grown vertically with respect to the openings 112 in patterned mask layer 111, wing regions 217, which have grown laterally over patterned mask layer 111, and coalescence fronts 219, which form at the boundaries between wings growing from adjacent openings in patterned mask layer 111, as shown in FIG. 3E. Since laterally-grown group III metal nitride material 221 has a lower concentration of threading dislocations than substrate 101 and many threading dislocations from substrate 101 have terminated in voids 225, the concentration of threading dislocations in window regions 215 is significantly lower than in the case of conventional LEO.

Ammonothermal group III metal nitride layer 213 may have a thickness between about 10 micrometers and about 100 millimeters, or between about 100 micrometers and about 20 millimeters as measured in the Z-direction shown in FIG. 3E.

In certain embodiments, ammonothermal group III metal nitride layer 213 is subjected to one or more processes, such as at least one of sawing, lapping, grinding, polishing, chemical-mechanical polishing, or etching.

In certain embodiments, the concentration of extended defects, such as threading dislocations and stacking faults, in the ammonothermal group III metal nitride layer 213 may be quantified by defect selective etching. Defect-selective etching may be performed, for example, using a solution comprising one or more of $H_3PO_4$, $H_3PO_4$ that has been conditioned by prolonged heat treatment to form polyphosphoric acid, and $H_2SO_4$, or a molten flux comprising one or more of NaOH and KOH. Defect-selective etching may be performed at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers, then removing the ammonothermal group III metal nitride layer, crystal, or wafer from the etchant solution.

The concentration of threading dislocations in the surface of the window regions 215 may be less than that in the underlying substrate 101 by a factor between about 10 and about $10^4$. The concentration of threading dislocations in the surface of the window regions 215 may be less than about $10^8$ cm$^{-2}$, less than about $10^7$ cm$^{-2}$, less than about $10^6$ cm$^{-2}$, less than about $10^5$ cm$^{-2}$, or less than about $10^4$ cm$^{-2}$. The concentration of threading dislocations in the surface of wing regions 217 may be lower, by about one to about three orders of magnitude, than the concentration of threading dislocations in the surface of the window regions 215, and may be below about $10^5$ cm$^{-2}$, below about $10^4$ cm$^{-2}$, below about $10^3$ cm$^{-2}$, below about $10^2$ cm$^{-2}$, or below about 10 cm$^{-2}$. Some stacking faults, for example, at a concentration between about 1 cm$^{-1}$ and about $10^4$ cm$^{-1}$, may be present at the surface of the window regions 215. The concentration of stacking faults in the surface of wing regions 217 may be lower, by about one to about three orders of magnitude, than the concentration of stacking faults in the surface of the window regions 215, and may be below about $10^2$ cm$^{-1}$, below about 10 cm$^{-1}$, below about 1 cm$^{-1}$, or below about 0.1 cm$^{-1}$, or may be undetectable. Threading dislocations, for example, edge dislocations, may be present at coalescence fronts 219, for example, with a line density that is less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than $1\times10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

In certain embodiments, the process of masking and bulk group III nitride crystal growth is repeated one, two, three, or more times. In some embodiments, these operations are performed while the first bulk group III metal nitride layer remains coupled to substrate 101. In other embodiments, substrate 101 is removed prior to a subsequent masking and bulk crystal growth operation, for example, by sawing, lapping, grinding, and/or etching.

FIGS. 4A and 4B are simplified diagrams illustrating a method of forming a free-standing group III metal nitride boule and free-standing group III metal nitride wafers. In certain embodiments, substrate 101 is removed from ammonothermal group III metal nitride layer 213 (FIG. 3E), or the last such layer deposited, to form free-standing ammonothermal group III metal nitride boule 413. Removal of substrate 101 may be accomplished by one or more of sawing, grinding, lapping, polishing, laser lift-off, self-separation, and etching to form a processed free-standing laterally-grown group III metal nitride boule 413. The processed free-standing laterally-grown group III metal nitride boule 413 may include a similar or essentially identical composition as the ammonothermal group III metal nitride layer and etching may be performed under conditions where the etch rate of the back side of substrate 101 is much faster than the etch rate of the front surface of the ammonothermal group III metal nitride layer. In certain embodiments a portion of ammonothermal group III metal nitride layer 213, or the last such layer deposited, may be protected from attack by the etchant by deposition of a mask layer, wrapping the portion of the layer with Teflon, clamping the portion of the layer against Teflon, painting with Teflon paint, or the like. In a specific embodiment, substrate 101 comprises single crystal gallium nitride, large-area surface 102 of substrate 101 has a crystallographic orientation within about 5 degrees of a (0001) crystallographic orientation, and substrate 101 is preferentially etched by heating in a solution comprising one or more of $H_3PO_4$, $H_3PO_4$ that has been conditioned by prolonged heat treatment to form polyphosphoric acid, and $H_2SO_4$ at a temperature between about 150 degrees Celsius and about 500 degrees Celsius for a time between about 30 minutes and about 5 hours, or by heating in a molten flux comprising one or more of NaOH and KOH. Surprisingly, patterned mask layer(s) 111 may facilitate preferential removal of substrate 101 by acting as an etch stop. The processed free-standing ammonothermal group III metal nitride boule 413 may include one or more window regions 415 that were formed above exposed growth centers 120, such as openings 112 in patterned mask layer(s) 111, on a substrate 101. The processed free-standing laterally-grown group III metal nitride boule 413 may also include one or more wing regions 417 that were formed above non-open regions in patterned mask layer(s) 111, and a pattern of locally-approximately-linear arrays 419 of threading dislocations, as shown in FIG. 4A. One or more of front surface 421 and back surface 423 of free-standing ammonothermal group III metal nitride boule 413 may be lapped, polished, etched, and chemical-mechanically polished. As similarly discussed above, the pattern of locally-approximately-linear arrays 419 may include a coalescence front region that includes a "sharp boundary" that has a width less than about 25 micrometers or less than about 10 micrometers that is disposed between the adjacent wing regions 417, or an "extended boundary" that has a width between about 25 micrometers and about 1000 micrometers or between about 30 micrometers and about 250 micrometers that is disposed between the adjacent wing regions 417, depending on the growth conditions.

In certain embodiments, the edge of free-standing ammonothermal group III metal nitride boule 413 is ground to form a cylindrically-shaped ammonothermal group III metal nitride boule. In certain embodiments, one or more flats is ground into the side of free-standing ammonothermal group III metal nitride boule 413. In certain embodiments, free-standing ammonothermal group III metal nitride boule 413 is sliced into one or more free-standing ammonothermal group III metal nitride wafers 431, as shown in FIG. 4B. The slicing may be performed by multi-wire sawing, multi-wire slurry sawing, slicing, inner-diameter sawing, outer-diameter sawing, cleaving, ion implantation followed by exfoliation, spalling, laser cutting, or the like. One or more large-area surface of free-standing ammonothermal group III metal nitride wafers 431 may be lapped, polished, etched, electrochemically polished, photoelectrochemically polished, reactive-ion-etched, and/or chemical-mechanically polished according to methods that are known in the art. In certain embodiments, a chamfer, bevel, or rounded edge is ground into the edges of free-standing ammonothermal group III metal nitride wafers 431. The free-standing ammonothermal group III metal nitride wafers may have a diameter of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters and may have a thickness between about 50 micrometers and about 10 millimeters or between about 150 micrometers and about 1 millimeter. One or more large-area surface of free-standing ammonothermal group III metal nitride wafers 431 may be used as a substrate for group III metal nitride growth by chemical vapor deposition, metalorganic chemical vapor deposition, hydride vapor phase epitaxy, molecular beam epitaxy, flux growth, solution growth, ammonothermal growth, among others, or the like.

FIGS. 5A-5E are simplified diagrams illustrating threading dislocation patterns formed in a free-standing group III metal nitride boule 413 or wafer 431. The large-area surfaces (e.g., front surface 421 or back surface 423) of the free-standing ammonothermal group III metal nitride boule 413 or wafers 431 may be characterized by a pattern of locally-approximately-linear arrays 419 of threading dislocations that propagated from coalescence fronts 219 formed during the epitaxial lateral overgrowth process, as discussed above in conjunction with FIGS. 3A-3E. The pattern of locally-approximately-linear arrays of threading dislocations may be 2D hexagonal, square, rectangular, trapezoidal, triangular, 1D linear, or an irregular pattern that is formed at least partially due to the pattern of the exposed growth centers 120 (FIGS. 1F-1L) used during the process to form free-standing laterally-grown group III metal nitride boule 413. One or more window regions 415 are formed above the exposed growth centers 120 (FIGS. 1F-1L), and one or more wing regions 417 are formed on portions that are not above the exposed growth centers 120, that is, were formed by lateral growth. As discussed above, the formed coalescence fronts 219 or pattern of locally-approximately-linear arrays 419 may include coalescence front regions that have a lateral width (i.e., measured parallel to the surface of the page containing FIGS. 5A-5E) that can vary depending on the growth conditions.

More complex patterns are also possible and may be advantageous, for example, in being more resistant to cracking or cleaving. The pattern 502 may be elongated in one direction compared to another orthogonal direction, for example, due to the free-standing laterally-grown group III metal nitride boule 413 being sliced at an inclined angle relative to the large-area surface of a free-standing ammonothermal group III metal nitride boule 413. The pattern 502 of locally-approximately-linear arrays of threading dislocations may be characterized by a linear array of threading dislocations (FIG. 5D) that have a pitch dimension L between about 5 micrometers and about 20 millimeters or between about 200 micrometers and about 5 millimeters. The pattern 502 of locally-approximately-linear arrays of threading dislocations may be characterized by a pitch dimension L (FIGS. 5A, 5B), or by pitch dimensions $L_1$ and $L_2$ in two orthogonal directions (FIGS. 5C and 5E), between about 5 micrometers and about 20 millimeters or between about 200 micrometers and about 5 millimeters, or between about 500 micrometers and about 2 millimeters. In certain embodiments, the pattern 502 of locally-approximately-linear arrays of threading dislocations is approximately aligned with the underlying crystal structure of the group III metal nitride, for example, with the locally-approximately-linear arrays lying within about 5 degrees, within about 2 degrees, or within about 1 degree of one or more of <1 0 −1 0>, <1 1 −2 0>, or [0 0 0 ±1] or their projections in the plane of the surface of the free-standing ammonothermal group III metal nitride boule 413 or group III metal nitride wafer 431. The linear concentration of threading dislocations in the pattern may be less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than about $1\times10^2$ cm$^{-1}$. The linear concentration of threading dislocations in the pattern 502 may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

Referring again to FIGS. 5A-5E, the large-area surfaces (e.g., front surface 421 or back surface 423 in FIGS. 4A-4B) of the free-standing ammonothermal group III metal nitride boule or wafer may further be characterized by an array of wing regions 417 and by an array of window regions 415. Each wing region 417 may be positioned between adjacent locally-approximately-linear arrays 419 of threading dislocations. Each window region 415 may be positioned within a single wing region 417 or may be positioned between two adjacent wing regions 417 and may have a minimum dimension between 10 micrometers and 500 micrometers and be characterized by concentration of threading dislocations between $10^3$ cm$^{-2}$ and $10^8$ cm$^{-2}$, resulting from residual threading dislocations that propagated vertically from window regions during the bulk crystal growth process, and by a concentration of stacking faults below $10^3$ cm$^{-1}$. In some embodiments the boundary between the window regions and the wing regions may be decorated with dislocations, for example, with a line density between about 5 cm$^{-1}$ and $10^5$ cm$^{-1}$.

The arrays may be elongated in one direction compared to another orthogonal direction, for example, due to the boule being sliced at an inclined angle relative to the large-area surface of a free-standing ammonothermal group III metal nitride boule. The pattern of locally-approximately-linear arrays 419 of threading dislocations may be characterized by a pitch dimension L, or by pitch dimensions $L_1$ and $L_2$ in two orthogonal directions, between about 5 micrometers and about 20 millimeters or between about 200 micrometers and about 5 millimeters. In certain embodiments, the pattern of locally-approximately-linear arrays 419 of threading dislocations is approximately aligned with the underlying crystal structure of the group III metal nitride, for example, with the locally-approximately-linear arrays lying within about 5 degrees, within about 2 degrees, or within about 1 degree of one or more of <1 0 −1 0>, <1 1 −2 0>, or [0 0 0 ±1] or their projections in the plane of the surface of the free-standing ammonothermal group III nitride boule or wafer. The linear concentration of threading dislocations in the pattern may be less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than about $1\times10^2$ cm$^{-1}$. The linear concentration of threading dislocations in the pattern may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

The concentration of threading dislocations in the wing regions 417 between the locally-approximately-linear arrays of threading dislocations may be below about $10^5$ cm$^{-2}$, below about $10^4$ cm$^{-2}$, below about $10^3$ cm$^{-2}$, below about $10^2$ cm$^{-1}$, or below about 10 cm$^{-2}$. The concentration of threading dislocations in the surface of the window regions 415 may be less than about $10^8$ cm$^{-2}$, less than about $10^7$ cm$^{-2}$, less than about $10^6$ cm$^{-2}$, less than about $10^5$ cm$^{-2}$, or less than about $10^4$ cm$^{-2}$. The concentration of threading dislocations in the surface of the window regions may be higher than the concentration of threading dislocations in the surface of the wing regions by at least a factor of two, by at least a factor of three, by at least a factor of ten, by at least a factor of 30, or by at least a factor of 100. The concentration of threading dislocations in the surface of the window regions may be higher than concentration of threading dislocations in the surface of the wing regions by less than a factor of $10^4$, by less than a factor of 3000, by less than a factor of 1000, by less than a factor of 300, by less than a factor of 100, or by less than a factor of 30. In some embodiments the boundary between the window regions 415 and the wing regions 417 may be decorated with dislocations, for example, with a line density between about 5 cm$^{-1}$ and $10^5$ cm$^{-1}$. The concentration of threading dislocations, averaged over a large area surface of the free-standing ammonothermal group III nitride boule or wafer, may be below about $10^7$ cm$^{-2}$, below about $10^6$ cm$^{-2}$, below about $10^5$ cm$^{-2}$, below about $10^4$ cm$^{-2}$, below about $10^3$ cm$^{-2}$, or below about $10^2$ cm$^{-2}$. The concentration of stacking faults, averaged over a large area surface of the free-standing ammonothermal group III nitride boule or wafer, may be below about $10^3$ cm$^{-1}$, below about $10^2$ cm$^{-1}$, below about 10 cm$^{-1}$, below about 1 cm$^{-1}$, or below about 0.1 cm$^{-1}$, or may be undetectable. In some embodiments, for example, after repeated re-growth on a seed crystal with a patterned array of dislocations and/or growth to a thickness greater than 2 millimeters, greater than 3 millimeters, greater than 5 millimeters, or greater than 10 millimeters, the positions of the threading dislocations may be displaced laterally to some extent with respect to the pattern on the seed crystal. In such a case the regions with a higher concentration of threading dislocations may be somewhat more diffuse than the relatively sharp lines illustrated schematically in FIGS. 5A-5E. However, the concentration of threading dislocations as a function of lateral position along a line on the surface will vary periodically, with a period between about 5 micrometers and about 20 millimeters or between about 200 micrometers and about 5 millimeters. The concentration of threading dislocations within the periodically-varying region may vary by at least a factor of two, at least a factor of 5, at least a factor of 10, at least a factor of 30, at least a factor of 100, at least a factor of 300, or at least a factor of 1000.

The free-standing ammonothermal group III metal nitride boule or wafer may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001) +c-plane, (000-1) −c-plane, {10-10} m-plane, {1 1 −2 0} a-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, {2 1 −3 ±1}, or {3 0 −3 ±4}. The free-standing ammonothermal group III metal nitride boule or wafer may have an (h k i l) semipolar large-area surface orientation, where i=−(h+k) and l and at least one of h and k are nonzero.

In certain embodiments, a large-area surface of a free-standing ammonothermal group III metal nitride crystal or wafer has a crystallographic orientation that is miscut from {10-10} m-plane by between about −60 degrees and about +60 degrees toward [0001] +c-direction and by up to about 10 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about −30 degrees and about +30 degrees toward [0001] +c-direction and by up to about 5 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about −5 degrees and about +5 degrees toward [0001] +c-direction and by up to about 1 degree toward an orthogonal <1-210> a-direction. In certain embodiments, a large-area surface of the free-standing ammonothermal group III metal nitride crystal or wafer has a crystallographic orientation that is miscut from a semipolar plane selected from one of {10-1±1}, {20-2±1}, {30-3±1}, or {60-6±1} by between about −5 degrees and about +5 degrees, by between about −1 degree and about +1 degree, by between about −0.5 degree and about +0.5 degree, or by between about −0.25 degree and about +0.25 degree toward [0001] +c-direction, and by up to about 1 degree, up to about 0.3 degree, up to about 0.1 degree, or up to about 0.05 degree toward an orthogonal <1-210> a-direction. The free-standing ammonothermal group III metal nitride crystal or wafer may have a stacking fault concentration below $10^2$ cm$^{-1}$, below 10 cm$^{-1}$, or below 1 cm$^{-1}$, and a very low dislocation density, below about $10^5$ cm$^{-2}$, below about $10^4$ cm$^{-2}$, below about $10^3$ cm$^{-2}$, below about $10^2$ cm$^{-2}$, or below about 10 cm$^{-2}$ on one or both of the two large area surfaces.

The free-standing ammonothermal group III metal nitride boule or wafer may have a symmetric x-ray rocking curve full width at half maximum (FWHM) less than about 200 arcsec, less than about 100 arcsec, less than about 50 arcsec, less than about 35 arcsec, less than about 25 arcsec, or less than about 15 arcsec. The free-standing ammonothermal group III metal nitride boule or wafer may have a crystallographic radius of curvature greater than 0.1 meter, greater than 1 meter, greater than 10 meters, greater than 100 meters, or greater than 1000 meters, in at least one, at least two, or in three independent or orthogonal directions.

In certain embodiments, at least one surface of the free-standing ammonothermal group III metal nitride boule or wafer has atomic impurity concentrations of at least one of oxygen (O), and hydrogen (H) above about $1\times10^{16}$ cm$^{-3}$, above about $1\times10^{17}$ cm$^{-3}$, or above about $1\times10^{18}$ cm$^{-3}$. In certain embodiments, a ratio of the atomic impurity concentration of H to the atomic impurity concentration of O is between about 0.3 and about 1000, between about 0.35 and about 10, between about 0.4 and about 3, between about 0.5 and 1.0, or between about 10 and about 100. In certain embodiments, at least one surface of the free-standing ammonothermal group III metal nitride boule or wafer has impurity concentrations of at least one of lithium (Li), sodium (Na), potassium (K), fluorine (F), chlorine (Cl), bromine (Br), or iodine (I) above about $1\times10^{15}$ cm$^{-3}$, above about $1\times10^{16}$ cm$^{-3}$, or above about $1\times10^{17}$ cm$^{-3}$, above about $1\times10^{18}$ cm$^{-3}$. In certain embodiments, the top and bottom surfaces of the free-standing ammonothermal group III metal nitride boule or wafer may have impurity concentrations of O, H, carbon (C), Na, and K between about $1\times10^{16}$ cm$^{-3}$ and $5\times10^{19}$ cm$^{-3}$, between about $1\times10^{16}$ cm$^{-3}$ and $8\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, the top and bottom surfaces of the free-standing ammonothermal group III metal nitride boule or wafer may have impurity concentrations of O, H, C, and at least one of Na and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS). In still another embodiment, the top and bottom surfaces of the free-standing ammonothermal group III metal nitride boule or wafer may have impurity concentrations of O, H, C, and at least one of F and Cl between about $1\times10^{16}$ cm$^{-3}$ and $5\times10^{19}$ cm$^{-3}$, between about $1\times10^{16}$ cm$^{-3}$ and $8\times10^{19}$ cm$^{-3}$, below $1\times10^{17}$ cm$^{-3}$, and between about $1\times10^{15}$ cm$^{-3}$ and $1\times10^{19}$ cm$^{-3}$, respectively, as quantified by calibrated secondary ion mass spectrometry (SIMS). In some embodiments, the top and bottom surfaces of the free-standing ammonothermal group III metal nitride boule or wafer may have impurity concentrations of H between about $5\times10^{17}$ cm$^{-3}$ and $3\times10^{19}$ cm$^{-3}$, as quantified by calibrated secondary ion mass spectrometry (SIMS). In certain embodiments, the top and bottom surfaces of the free-standing ammonothermal group III metal nitride boule or wafers may have an impurity ratio of F to O between about 0.01% and about 25%, between about 0.1% and about 10%, or between about 0.3% and about 5%. In certain embodiments, at least one surface of the free-standing ammonothermal group III metal nitride boule or wafer has an impurity concentration of copper (Cu), manganese (Mn), and iron (Fe) between about $1\times10^{16}$ cm$^{-3}$ and $1\times10^{19}$ cm$^{-3}$. In a specific embodiment, the free-standing ammonothermal group III metal nitride boule or wafer has an infrared absorption peak at about 3175 cm$^{-1}$, with an absorbance per unit thickness of greater than about 0.01 cm$^{-1}$.

The free-standing ammonothermal group III metal nitride crystal or wafer may be characterized by a wurtzite structure substantially free from any cubic entities or other crystal structures, the other structures being less than about 0.1% in volume in reference to the substantially wurtzite structure.

Surprisingly, given the lattice mismatch between HVPE GaN and ammonothermal GaN, results of use of the herein-disclosed techniques show that ammonothermal lateral epitaxial overgrowth is capable of producing thick, large-area GaN layers that are free of cracks. In certain embodiments, the free-standing ammonothermal group III metal nitride crystal or wafer has a diameter larger than about 25 millimeters, larger than about 50 millimeters, larger than about 75 millimeters, larger than about 100 millimeters, larger than about 150 millimeters, larger than about 200 millimeters, larger than about 300 millimeters, or larger than about 600 millimeters, and a thickness greater than about 0.1 millimeter, greater than about 0.2 millimeter, greater than about 0.3 millimeter, greater than about 0.5 millimeter, greater than about 1 millimeter, greater than about 2 millimeters, greater than about 3 millimeters, greater than about 5 millimeters, greater than about 10 millimeters, or greater than about 20 millimeters, and is substantially free of cracks. By contrast, we find that ammonothermal growth on large-area, un-patterned HVPE GaN seed crystals leads to cracking if the layers are thicker than a few hundred microns, even if a patterning process had been used to form the HVPE GaN seed crystal.

A free-standing ammonothermal group III metal nitride wafer may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. A large-area surface of the free-standing ammonothermal group III metal nitride wafer may have a concentration of macro defects, with a diameter or characteristic dimension greater than about 100 micrometers, of less than about 2 $cm^{-2}$, less than about 1 $cm^{-2}$, less than about 0.5 $cm^{-2}$, less than about 0.25 $cm^{-2}$, or less than about 0.1 $cm^{-2}$. The variation in miscut angle across a large-area surface of the free-standing ammonothermal group III metal nitride crystal or wafer may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a large-area surface of the free-standing ammonothermal group III metal nitride wafer, as measured over an area of at least 10 μm×10 μm, may be less than about 0.5 nanometer, less than about 0.2 nanometer, less than about 0.15 nanometer, less than about 0.1 nanometer, or less than about 0.10 nanometer. The free-standing ammonothermal group III metal nitride wafer may be characterized by n-type electrical conductivity, with a carrier concentration between about $1 \times 10^{17}$ $cm^{-3}$ and about $3 \times 10^{19}$ $cm^{-3}$ and a carrier mobility greater than about 100 $cm^2$/V-s. In alternative embodiments, the free-standing ammonothermal group III metal nitride wafer is characterized by p-type electrical conductivity, with a carrier concentration between about $1 \times 10^{15}$ $cm^{-3}$ and about $1 \times 10^{19}$ $cm^{-3}$. In still other embodiments, the free-standing ammonothermal group III metal nitride wafer is characterized by semi-insulating electrical behavior, with a room-temperature resistivity greater than about $10^7$ ohm-centimeter, greater than about $10^8$ ohm-centimeter, greater than about $10^9$ ohm-centimeter, greater than about $10^{10}$ ohm-centimeter, or greater than about $10^{11}$ ohm-centimeter. In certain embodiments, the free-standing ammonothermal group III metal nitride wafer is highly transparent, with an optical absorption coefficient at a wavelength of 400 nanometers that is less than about 10 $cm^{-1}$, less than about 5 $cm^{-1}$, less than about 2 $cm^{-1}$, less than about 1 $cm^{-1}$, less than about 0.5 $cm^{-1}$. less than about 0.2 $cm^{-1}$, or less than about 0.1 $cm^{-1}$.

In some embodiments, the free-standing ammonothermal group III metal nitride crystal or wafer is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HVPE. The further-grown crystal may be sliced, lapped, ground, polished, etched, and/or chemically-mechanically polished into wafers by methods that are known in the art. The surface of the wafers may be characterized by a root-mean-square surface roughness measured over a 10-micrometer by 10-micrometer area that is less than about 1 nanometer or less than about 0.2 nanometers.

A wafer may be incorporated into a semiconductor structure. The semiconductor structure may comprise at least one $Al_xIn_yGa_{(1-x-y)}N$ epitaxial layer, where 0≤x, y, x+y≤1. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a power-conversion photodiode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a lamp or a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ $cm^{-2}$, a substantial fraction of 0.1×0.1 $mm^2$ devices could be expected to be free of dislocations. At a dislocation density of $10^2$ $cm^{-2}$, a substantial fraction of 1×1 $mm^2$ devices could be expected to be free of dislocations. The gallium-nitride-based electronic or optoelectronic device may be entirely free of stacking faults throughout its volume. For example, at a stacking fault density of 1 $cm^{-1}$, a substantial fraction of 10×1 $mm^2$ stripe-shaped devices, such as laser diodes with nonpolar or semipolar large area surfaces and c-plane facets, could be expected to be free of stacking faults.

Figure 6A:
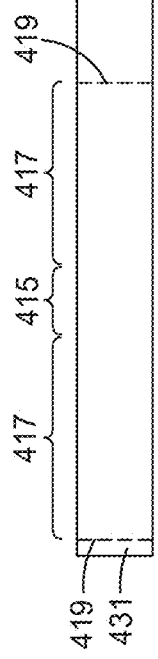
FIGS. 6A, 6B, 7A, and 7B are cross-sectional diagrams illustrating optical and electronic devices formed by one or more methods disclosed herein, according to embodiments of the present disclosure.
Figure 6B:
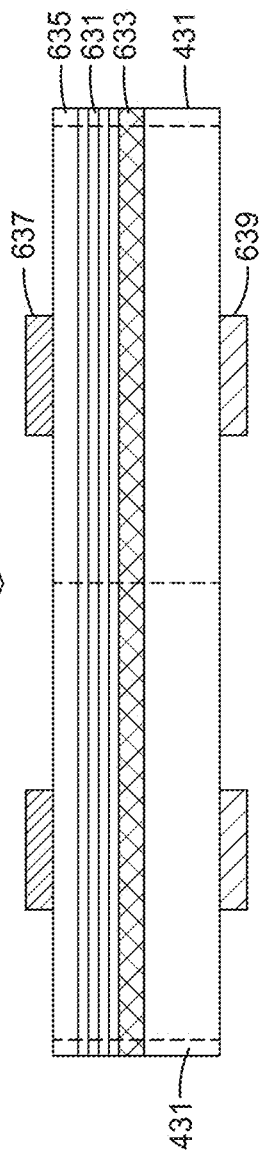

FIGS. 6A, 6B, 7A, and 7B are cross-sectional diagrams illustrating methods and resulting opto-electronic and electronic devices according to embodiments of the present disclosure. A two- or three-terminal device, such as an opto-electronic or electronic device, may be formed by a sequence of steps, including the step of epitaxial layer deposition on a free-standing, ammonothermal group III metal nitride wafer 431 or substrate having a pattern of locally-approximately-linear arrays 419 of threading dislocations and comprising at least one AlInGaN active layer or GaN drift layer 631, e.g., by MOCVD, as shown in FIG. 6B. In certain embodiments, the deposited layers include an n-type or n+ layer 633, a doped or unintentionally doped single quantum well (SQW), a multiple quantum well (MQW) structure, a double-heterostructure (DH structure), or an n⁻ drift layer 631, and a p-type layer 635, as shown. An n⁻ drift layer may be important, for example, in a vertical field-effect transistor. The device structures may be vertical, as illustrated schematically in FIG. 6B, or lateral, as illustrated schematically in FIG. 7A. During operation, the device may be electrically connected to an external circuit to provide a potential between an n-type contact 639 and a p-type contact 637. Additional layers may be deposited, such as separate confinement heterostructure (SCH) layers, claddings layers, an AlGaN electron-blocking layer, and a p+ contact layer, among others. In many cases, threading dislocations in the substrates (e.g., wafer 431), such as a pattern of locally-approximately-linear arrays 419, will propagate into the deposited layers and potentially impact device performance.

Figure 7A:
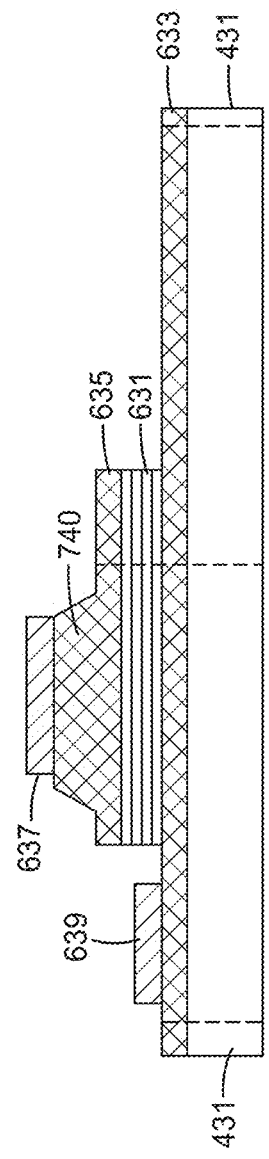

In a specific embodiment, the method also deposits an n-type contact 639, and a p-type contact 637 as shown in FIGS. 6B and 7A. In some embodiments, at least one of the set of n-type and p-type contacts is placed in specific registry respect to the coalescence fronts, wing regions, and/or window regions. A light emission portion may be centered over the coalescence front, or between coalescence fronts. In one specific embodiment, transparent p-type contacts are deposited and are placed in such a way that they avoid contact with coalescence fronts, which may have an elevated concentration of threading dislocations. In this way a light-emitting structure or photodiode structure may be formed has a relatively low concentration of threading dislocations. In this way a light-emitting structure, PN diode, photodiode, or Schottky barrier diode may be formed has a relatively low concentration of threading dislocations. In preferred embodiments, regions of light emission and/or maximum electric fields are designed to overlie wing regions 417 and to avoid the pattern of locally-approximately-linear arrays 419. In certain embodiments, a defective region associated with a coalescence front or a window region is utilized as a shunt path for reducing series resistance. In certain embodiments, n-type contacts are placed above coalescence fronts or window regions, with an edge dislocation density above $10^3$ cm⁻¹ and/or a threading dislocation density greater than about $10^5$ cm⁻².

Referring now to FIG. 7A, in some embodiments, e.g., a laser diode, a PN diode, a photodiode, or a Schottky barrier diode, the p-contact may be placed in a region substantially free of coalescence fronts. In certain embodiments, such as a laser diode, a laser ridge or stripe structure 740 may be place in a region substantially free of coalescence fronts. A mesa may be formed by conventional lithography and an n-type contact placed in electrical contact with the n-type layer and/or the substrate. Additional structures may be placed in registry with the coalescence fronts, such as sidewall passivation, an ion implanted region, field plates, and the like.

Figure 7B:
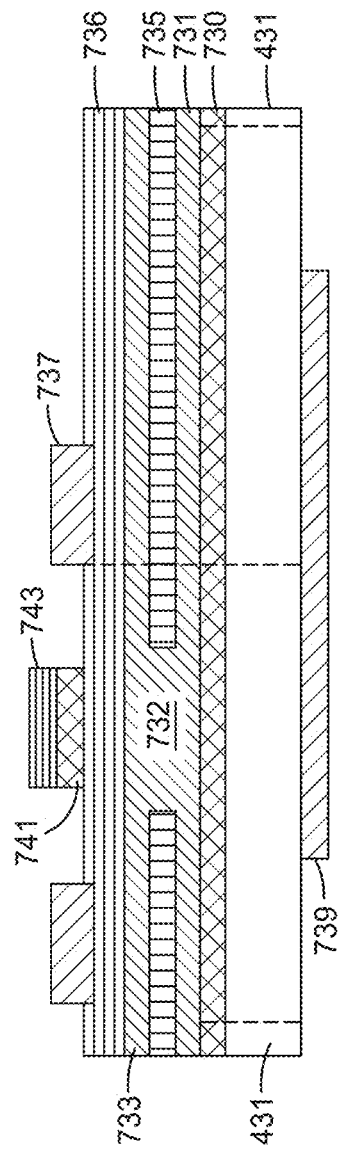

Referring now to FIG. 7B, in some embodiments, for example, a current aperture vertical electron transistor (CAVET), an n⁻ drift layer 731 is deposited over an n+ contact layer 730, which in turn is deposited on free-standing, merged ammonothermal group III metal nitride boule 413. P-type layer 735 is formed above n⁻ drift layer 731 with aperture 732. Following regrowth of the balance of n⁻ drift layer 731, an AlGaN 2D electron gas layer 736 is deposited. Finally, source contacts 737, drain contact 739, dielectric layer 741, and gate contact 743 are deposited. In preferred embodiments, aperture 732 is positioned away from coalescence front regions of the locally-approximately-linear arrays 419. In preferred embodiments, aperture 732 is positioned away from window regions 415. In preferred embodiments, aperture 732 is positioned over wing regions 417. Other types of three-terminal devices, such as trench CAVETs, MOSFETs, and the like are positioned so that the regions of maximum electric fields are located within wing regions 417.

The inventors have found that many of the processes described above, including growth on an un-patterned substrate, growth on a conventionally-masked, patterned substrate, growth on a trench-patterned substrate, certain wafering-related machining processes, and device fabrication, may be facilitated by an elevated oxygen concentration and/or by an oxygen gradient within the GaN crystal, within certain ranges, particularly when the GaN crystal has been grown predominantly in the [0 0 0 -1] direction. The inventors have further found that use of the methods provided herein that cause formation of an oxygen gradient within the GaN crystal can also desirably form similar gradients in hydrogen and fluorine, with H/O and F/O ratios falling within a prescribed range.

The concentration of oxygen and other impurities within a GaN crystal, including gradients, may usefully be quantified using calibrated secondary ion mass spectrometry (SIMS). In certain embodiments, impurity concentrations near a surface may be quantified by rastering a beam of primary ions, for example, Cs⁺, over an area of interest on the surface, and measuring a signal due to secondary O⁻, H⁻, or F⁻ ions, for example. In other embodiments, a beam of $O_2^+$ may be used to detect Na⁺, K⁺, or Mg⁺, for example. In certain embodiments, the primary ions are rastered over a square region between about 20 micrometers and about 300 micrometers on a side, or between about 50 micrometers and about 150 micrometers on a side. In certain embodiments, the secondary ion signals are collected only while the primary ion is being rastered over a subset of the square region, for example over a region between about 10 micrometers and about 250 micrometers or between about 25 micrometers and about 150 micrometers, in order to avoid edge effects associated with the perimeter of the ion-beam-induced sputter crater that forms on the surface. In certain embodiments, the SIMS signal is collected at sputter depths between about 0.5 micrometer and about 25 micrometers, between about 1 micrometer and about 20 micrometers, or between about 2 micrometers and about 10 micrometers. In certain embodiments, the SIMS signals are calibrated by performing similar measurements on crystals of similar composition and crystallographic orientation that have been implanted with precisely-known concentrations of oxygen, hydrogen, and/or fluorine. SIMS measurements may be performed at one region of a surface, two regions, three regions, four regions, five regions, ten regions, or at more than ten regions, for example, for the purpose of measuring average values or quantifying gradients.

Figure 8:
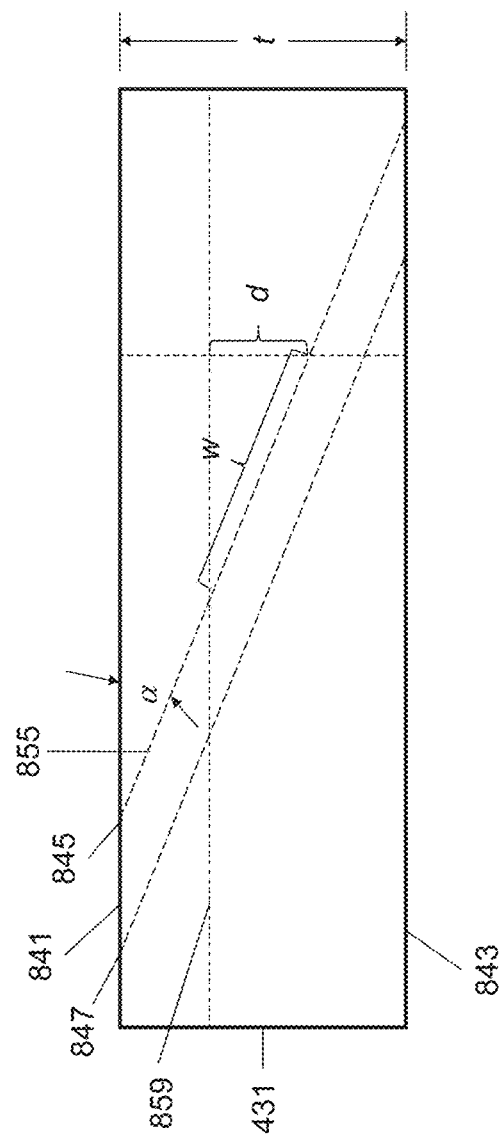
FIG. 8 is a simplified diagram illustrating a method for preparing an analysis sample from a free-standing crystal according to an embodiment of the present disclosure.

FIG. 8 illustrates a method for quantifying the concentration of oxygen and other impurities within free-standing ammonothermal group III metal nitride boule or wafer 431. In certain embodiments, the concentrations of oxygen and other impurities may be determined on first surface 841 and second surface 843, which is on the opposite side of free-standing ammonothermal group III metal nitride boule or wafer 431 from first surface 841 and is separated from the first surface 841 by a thickness t, using the SIMS techniques described above. In certain embodiments, the concentrations of oxygen and other impurities, and gradients thereof, within the free-standing ammonothermal group III metal nitride boule or wafer 431 may be quantified by performing a first cross cut 845 through free-standing ammonothermal group III metal nitride boule or wafer 431 at an angle α with respect to first surface 841, where α is between about 1 degree and 90 degrees, between about 2 degrees and about 90 degrees, or between about 4 degrees and about 30 degrees. First cross cut 845 may be performed using a single-wire saw, a multi-wire saw, a dicing saw, an inner-diameter saw, an outer-diameter saw, by grinding, or the like. In certain embodiments, a second cross cut 847 is also performed, approximately parallel to first cross cut 845. In certain embodiments, cross-cut surface 855, exposed by first cross cut 845, is subjected to one or more of lapping, grinding, polishing, and chemical-mechanical polishing. The concentration of oxygen and other impurities along cross-cut surface 855 can be quantified at one or more points by SIMS, as described above. The concentration of oxygen and other impurities at one or more depths d with respect to reference surface 859 within free-standing ammonothermal group III metal nitride boule or wafer 431 may be quantified by performing SIMS measurements at one or more lateral positions w along cross-cut surface 855 with respect to the intersection of reference surface 859 with cross-cut surface 855, with the depth d equal to the quantity w sin α. In certain embodiments, the reference surface 859 is chosen from one of first surface 841 and second surface 843. In certain embodiments, reference surface 859 is selected to be a regrowth interface, for example, surface 102 in FIG. 1A, which may be readily identifiable visually along surface cross-cut 855 by means of a different color, optical absorption coefficient (darkness level), or fluorescence characteristic.

The wedge-sample approach described above assumes that the impurity distributions in boule or wafer 431 are quasi-one-dimensional, that is, are approximately uniform along planes parallel to first surface 841 and second surface 843. This assumption should be valid when growth occurs predominantly in a single crystallographic orientation that is normal to first surface 841 and/or second surface 843. In cases where first surface 841 and second surface 843 have a different crystallographic orientation than a growth front, for example, where first surface 841 is prepared to have a controlled miscut with respect to (0 0 0 1) or (0 0 0 −1), a correction to the geometry shown in FIG. 8 can be made in straightforward fashion by a person of ordinary skill in the art. In any case, the lateral uniformity of impurity concentrations, for example, along reference surface 859, can be quantified experimentally by making additional cuts parallel to first cross cut 845 and second cross cut 847.

Referring again to FIG. 8, a similar approach can be used to quantify the efficacy of coalescence of laterally-grown wings (cf. FIGS. 2C and 3E) by preparing a double-normal section, that is, by making first cross cut 845 and second cross cut 847 with angle α=90°. In preferred embodiments, first cross cut 845 and second cross cut 847 are made in a plane that is perpendicular to the lateral growth directions, for example, in the plane of the page for FIGS. 2A-2C and FIGS. 3A-3E. Cross-cut surface 855 may be polished and the sliced sample may be examined by optical microscopy with transmitted light. Different crystallographic sectors may be readily distinguished by color differences resulting from differential impurity uptake.

Figure 9:
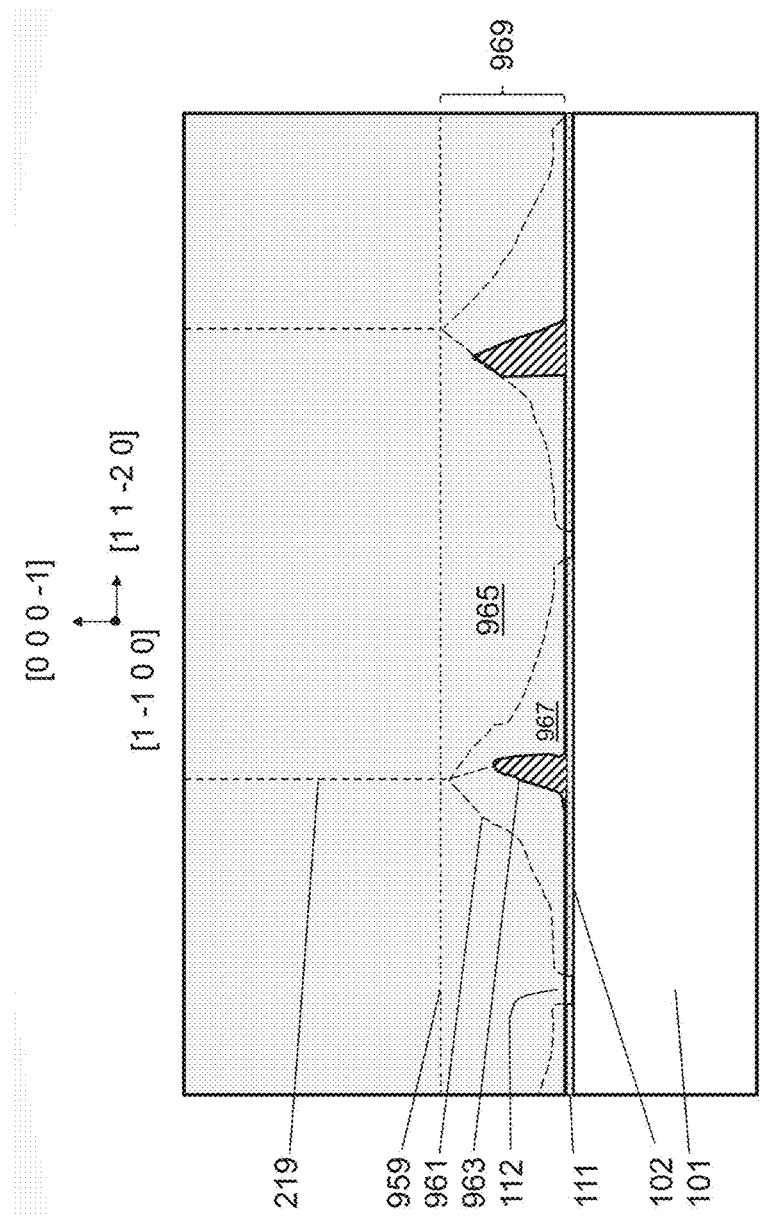
FIG. 9 is a simplified diagram illustrating growth sectors and coalescence boundaries in a sectioned sample from a laterally-grown ammonothermal group III metal nitride boule according to an embodiment of the present disclosure.

An example of lateral growth and coalescence is shown in FIG. 9, which is a schematic representation of an optical micrograph of a double-normal section of a GaN crystal with angle α=90° (cf. FIG. 6). In the specific embodiment shown in FIG. 9, vertical growth occurred in the [0 0 0 −1] direction and lateral growth occurred in the [1 1 −2 0] and [−1 −1 2 0] directions, with the [1 −1 0 0] direction extending out of the plane of the page. During the growth process, −c-sector material 965 (item 213 in FIG. 2B) grew from substrate 101 in the [0 0 0 −1] direction through openings 112 in patterned mask layer 111. After emerging from openings 112, material began growing in the [1 1 −2 0] and [−1 −1 2 0] directions, forming a-sector material 967 (item 217 in FIG. 2C). Sector boundary 961 between −c-sector material 965 and a-sector material 967 is readily observable by transmission microscopy or by fluorescence microscopy, as a-sector material 967 is lighter in color under normal visible illumination than −c-sector material 965 and has different fluorescence characteristics. As opposing laterally-growing wing regions begin to approach one another during the crystal growth process, nutrient material from the supercritical ammonia solvent begins to have difficulty reaching the lateral growth fronts, leading to formation of solvent-filled gaps 963 between opposing laterally-growing wing regions which may then become overgrown by a-sector material 967. Shortly after coalescence of the laterally-grown wings occurs, −c-sector material 965 may overgrow a-sector material 967. Coalescence fronts 219 are typically not visible in the double-normal section but can be observed as threading dislocations on the (0 0 0 −1) growth facet. The rate at which the laterally-growing wings coalesce and are overgrown by −c-sector material 965 may be quantified as the coalescence distance 969, defined as the separation between surface 102 and a coalescence plane 959 that is parallel to surface 102 of substrate 101 and intersects the uppermost portion of one or more a-sector regions 967.

Figure 10:
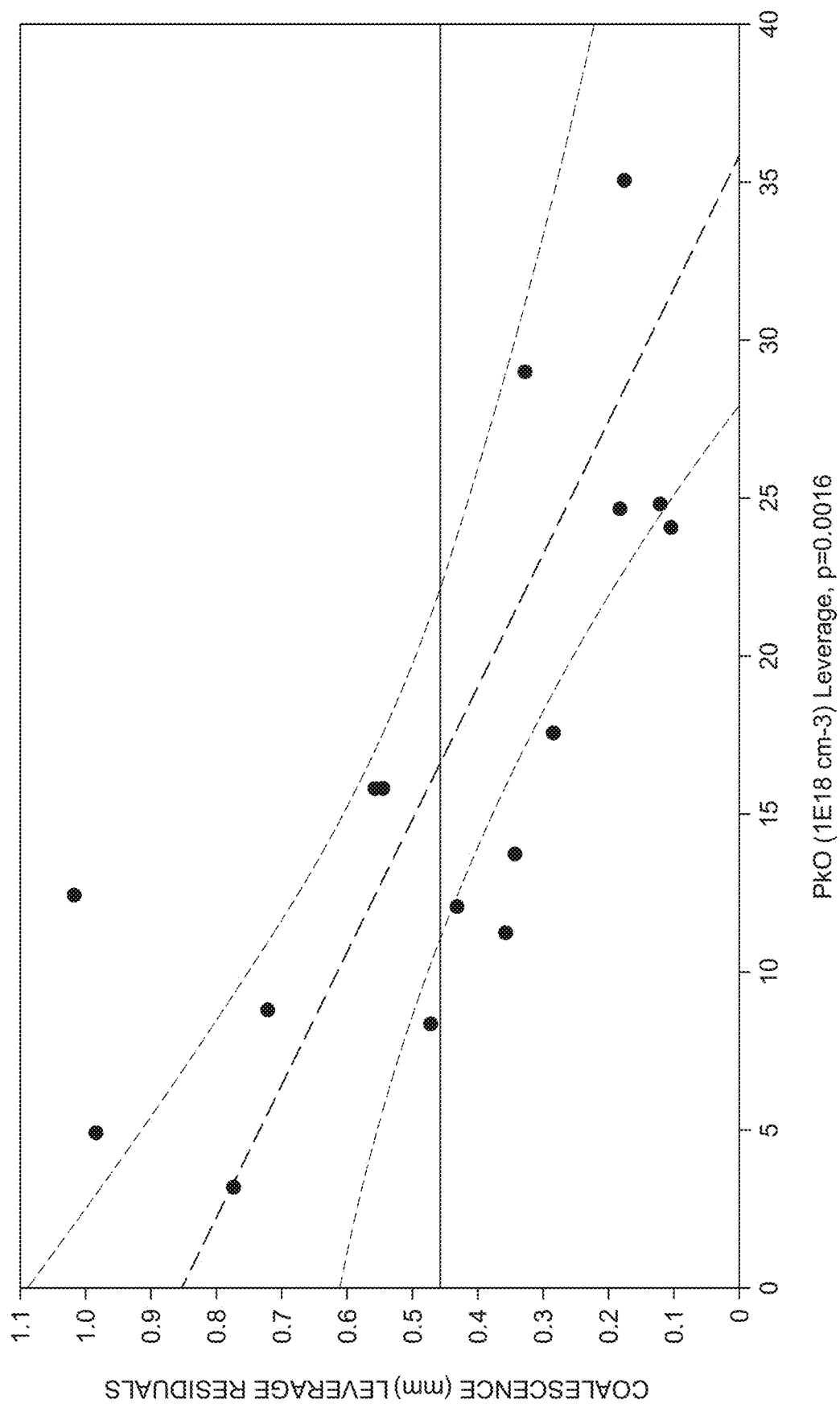
FIG. 10 is a simplified diagram illustrating the dependence of a coalescence distance on oxygen concentration, according to an embodiment of the present disclosure.

Coalescence distance 969 is found to depend on a number of crystal growth process variables. FIG. 10 is a schematic representation of a linear regression fit of the coalescence distance 969, in millimeters (y-axis), on the peak concentration of oxygen, in units of $10^{18}$ cm$^{-3}$ (x-axis) in the grown GaN layer, as measured by SIMS using the wedge-sampling technique shown in FIG. 8, after contributions due to other process variables, such as the temperature distribution in the growth capsule, have been subtracted. The P-value for the linear-regression fit (0.0016) is well below 0.05, indicating that this dependence on oxygen concentration is statistically significant. As is apparent from FIG. 10, the coalescence distance decreases from about 0.8 to 1 mm for peak oxygen concentrations in the low to mid $10^{18}$ cm$^{-3}$ range to approximately 0.2 mm as the peak oxygen concentration in the GaN layer is increased to about $3.5 \times 10^{19}$ cm$^{-3}$.

While calibrated SIMS, in conjunction with the sample preparation technique described above and in FIG. 8, provides a direct method for determination of oxygen concentrations and gradients within GaN crystals, in some cases it may be more convenient to infer an oxygen concentration from optical absorption measurements. It is well known that oxygen doping increases the optical absorption coefficient in GaN. There are at least two contributions. First, oxygen doping increases the concentration of free carriers, which give rise to sub-bandgap phonon-assisted optical absorption. Phonon-assisted optical absorption has been quantified using first-principles calculations by Kioupakis, et al., [Phys. Rev. B 81, 241201 (R) (2010); Appl. Phys. Express 3, 082101 (2010)] and by direct measurements on GaN crystals grown by a range of different growth techniques [Pimputkar, et al., J. Crystal Growth 432, 49 (2015)]. Second, gallium vacancies complexed with hydrogen and/or oxygen are well-documented as causing sub-bandgap optical absorption in ammonthermally-grown GaN [for example, Pimputkar, et al., J. Crystal Growth 432, 49 (2015); Jiang, et al., Appl. Phys. Express 10, 075506 (2017)].

Figure 11:
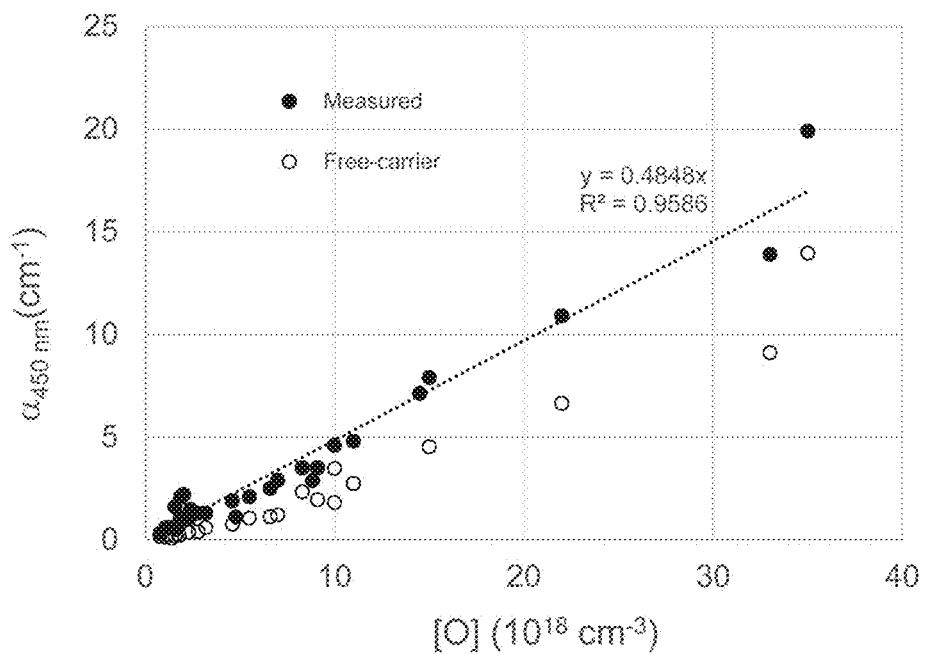
FIG. 11 is a simplified diagram showing the relationship between oxygen concentration and the optical absorption coefficient at a wavelength of 450 nm in sections prepared from ammonothermal group III metal nitride boules, according to an embodiment of the present disclosure.

FIG. 11 shows the dependence of the optical absorption coefficient $\alpha_{450}$ at a wavelength of 450 nm on the oxygen concentration in m-plane cross sections of GaN crystals that were grown ammonothermally in the [0 0 0 -1] direction. The contributions of phonon-assisted free carrier absorption were quantified by measurement of the optical absorption coefficient of the same sections at 539 nm (2.3 eV) and assignment of the latter to phonon-assisted free carrier absorption using the parameterization reported by Kioupakis, et al. The optical absorption coefficient is seen to be proportional to the oxygen concentration, to an excellent approximation, with approximately half of the absorption at 450 nm, on average, being due to phonon-assisted free-carrier absorption. The balance of the optical absorption is attributed to gallium vacancy complexes with hydrogen and/or oxygen [for example, Jiang, et al., Appl. Phys. Express 10, 075506 (2017)].

Figure 12:
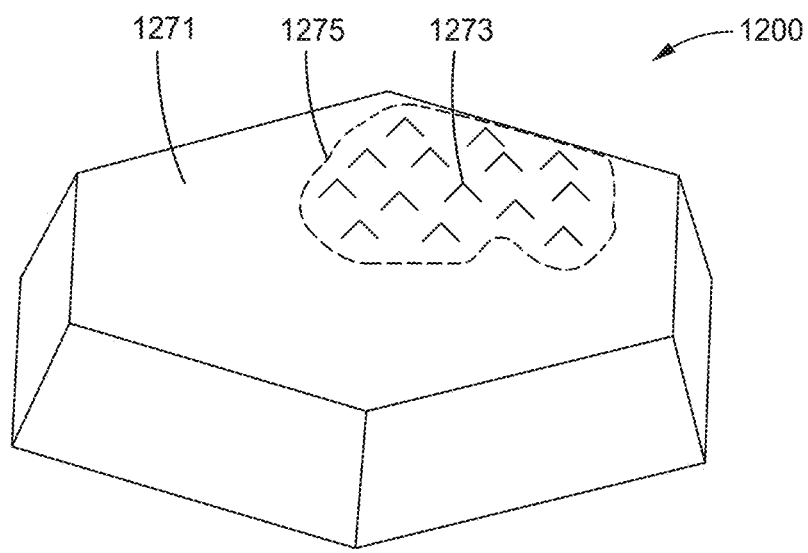
FIG. 12 is a simplified diagram showing regions of smooth and rough surface morphology on a boule formed by one or more methods disclosed herein, according to an embodiment of the present disclosure.

In ideal cases, as shown schematically in FIGS. 1A, 2C, and 3E, growth on an un-patterned or patterned seed crystal produces an as-grown boule with a smooth, flat surface, for example, a (0 0 0 -1) facet. In some cases, however, growth produces some regions that are smooth and other regions that are rough, as shown schematically in FIG. 12. FIG. 12 is a schematic illustration of an as-grown boule 1200 with an (0 0 0 -1) upper surface and {1 0 -1 -1} side facets. Portion 1271 of the (0 0 0 -1) upper surface has a smooth morphology, while portion 1273 has a rough morphology, with the portions separated by boundary 1275. The root-mean-square (rms) surface roughness within portion 1271 may be between about 0.1 nanometer and about 50 micrometers, or between about 10 nanometers and about 10 micrometers, and may include areas dominated by step growth, including both single steps and multiple steps. The smooth morphology indicates that growth has proceeded predominantly in the [0 0 0 -1] direction, that impurity concentrations should be relatively uniform, and that minimal yield loss may occur during wafering operations. The root-mean-square surface roughness within portion 1273 may be between about 10 micrometers and about 10 millimeters, between about 50 micrometers and about 5 millimeters, or between about 100 micrometers and about 2 millimeters. Morphological features within portion 1273 may include one or more of incompletely-coalesced trenches, macroscopic step-bunching growth, cellular growth, hillocks, depressions, or dendritic growth. The rough morphology indicates that growth may not have occurred predominantly in the [0 0 0 -1] direction in these regions, that impurity concentrations may have significant lateral and axial variations, that significant stresses may be present, and that significant yield loss may occur during wafering operations such as sawing, grinding, and polishing.

Figure 13:
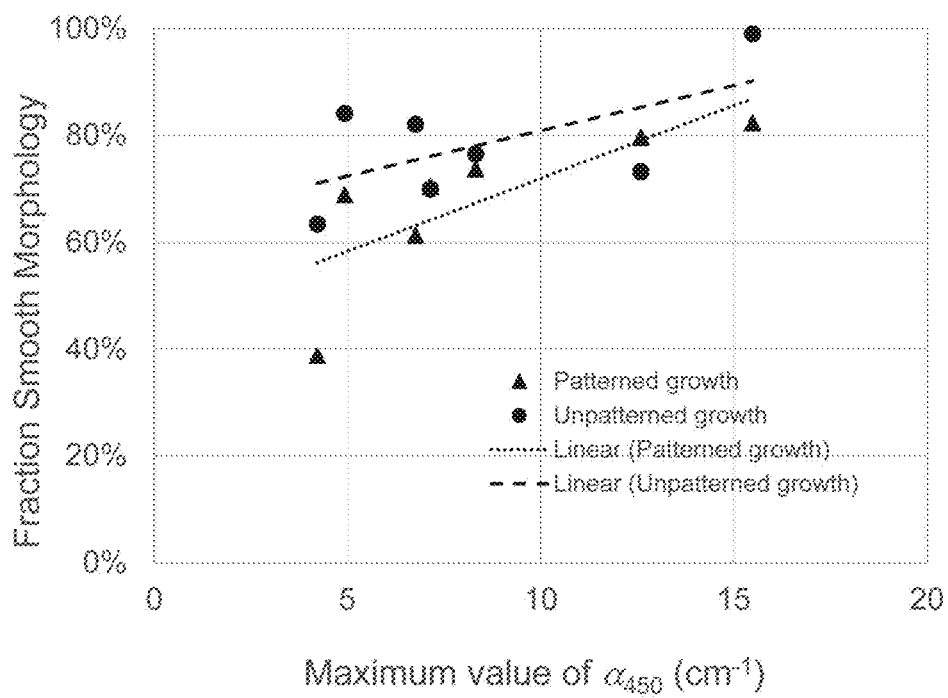
FIG. 13 is a graph illustrating the effect of an optical absorption coefficient value on a fraction of surface exhibiting a smoother morphology, according to an embodiment of the present disclosure.

We have found that, other contributing factors notwithstanding, the maximum oxygen concentration in a growing boule or, equivalently, the maximum optical absorption coefficient at 450 nm $\alpha_{450}$ (cf. FIG. 11), has a significant effect on the fraction of growing (0 0 0 -1) facets that grow with a smooth, rather than rough, surface morphology, as shown in FIG. 13. In the case of patterned growth, the average area fraction of (0 0 0 -1) surfaces with smooth morphology increases from approximately 40%, at a maximum value of $\alpha_{450}$ of about 4 (or a peak oxygen concentration near $8 \times 10^{18}$ cm$^{-3}$, FIG. 11), to above 80% for a maximum value of $\alpha_{450}$ above 15 (or a peak oxygen concentration above about $3 \times 10^{19}$ cm$^{-3}$). A similar effect is present with un-patterned growth, although the magnitude is smaller, with the fraction of smooth area increasing from about 70% to about 90% over a similar range.

Figure 14:
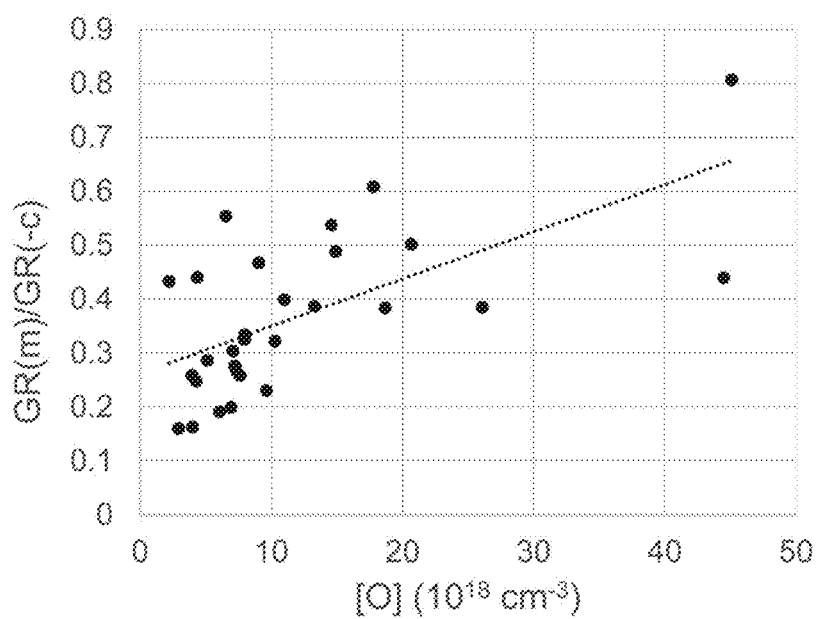
FIG. 14 is a graph illustrating the effect of an oxygen concentration on the ratio of growth rates in the m and −c directions, according to an embodiment of the present disclosure.

Without wishing to be bound by theory, the inventors believe that several mechanisms involving oxygen contribute to the effects shown in FIG. 13. First, in the case of patterned growth, the presence of oxygen in the growth environment initially, before coalescence has occurred, reduces the growth thickness required for coalescence (FIG. 10). Second, in addition to oxygen increasing the ratio between the growth rate in the a direction and the growth rate in the -c direction (cf. FIGS. 9 and 10), we find that oxygen also increases the ratio of the growth rate in the m direction to the growth rate in the -c direction, as shown in FIG. 14. While many other factors also contribute to the growth rate ratio, as indicated by an R-squared value of only 0.41 in the data shown in FIG. 14, the effect of oxygen is also clear, as the P-value is approximately 0.0002. As the average oxygen concentration is raised from about $2 \times 10^{18}$ cm$^{-3}$ to about $4 \times 10^{19}$ cm$^{-3}$ to, the growth rate ratio increases from about 0.3 to about 0.6. The combination of these first two effects indicates that, for growth in the -c direction, the ratio of the lateral growth rate to the vertical growth rate increases as the oxygen concentration is increased, leading to flatter growth fronts and smoother surfaces.

Figure 15:
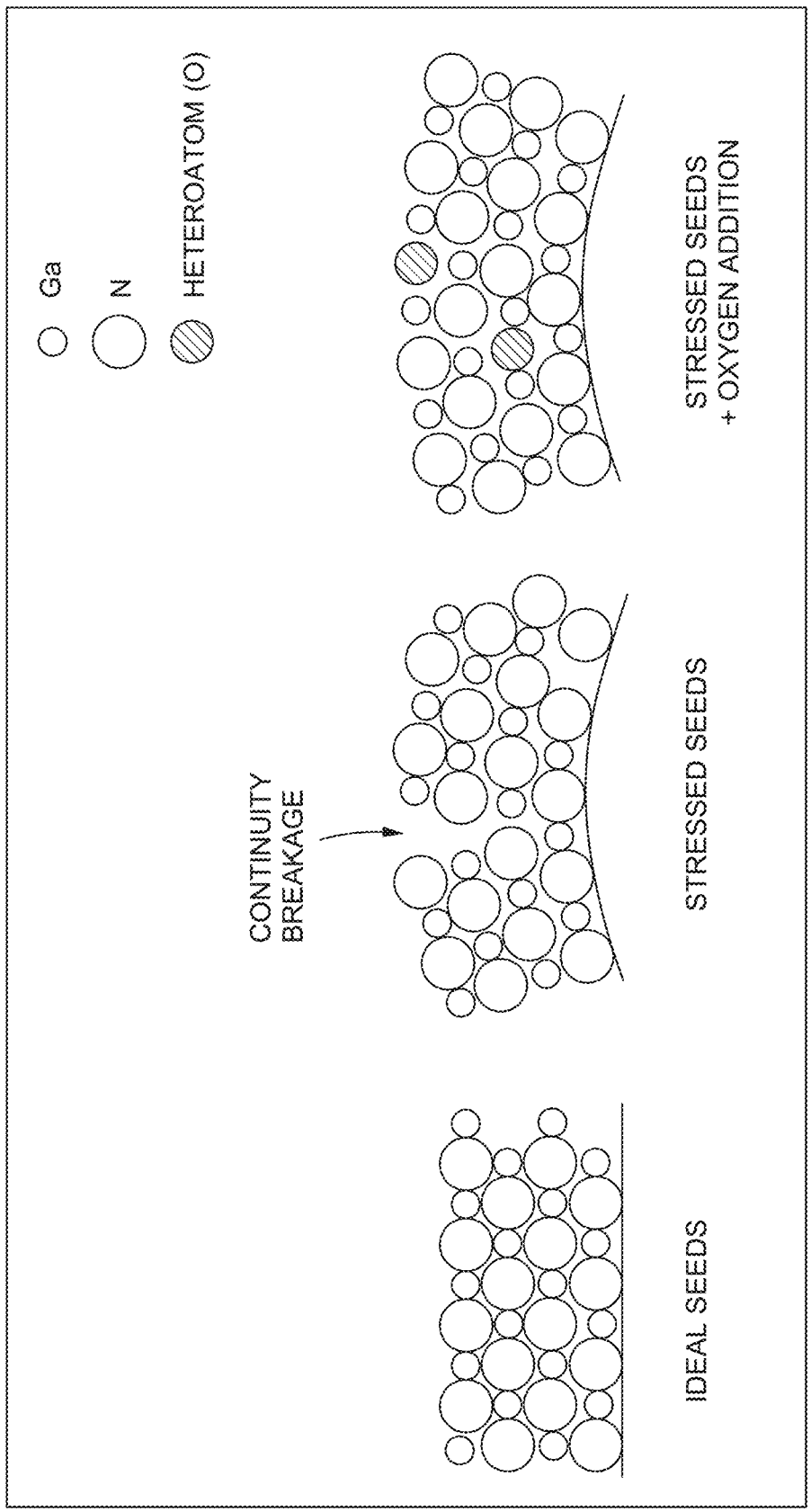
FIG. 15 is a simplified diagram illustrating a possible effect of oxygen incorporation on the growth of crystals on a seed crystal having a strain, according to an embodiment of the present disclosure.

A third mechanism by which oxygen and oxygen gradients may benefit the crystal growth process is shown schematically in FIG. 15. In an ideal seed crystal, Ga and N atoms reside in planes that are perfectly planar, with a crystallographic radius of curvature that is infinite. As growth proceeds, Ga and N atoms may simply continue to become incorporated into these planes without an increase in stress. In real seed crystals, however, for example, seed crystals that originated from a heteroepitaxial growth process, residual stresses, mosaic structures, or other defects may be present that give rise to a non-infinite radius of curvature. As growth on such a seed crystal proceeds, stresses may increase as growth proceeds vertically, giving rise to one or more forms of breakage of the continuity of the Ga—N planes. In some cases, the increased stresses may cause deviation from planarity of the growth front, as the crystal may be able to reduce its free energy by adopting a three-dimensional growth morphology such as cellular growth. In some cases, the increased stresses may be relaxed by formation of cracks. When a heteroatom that changes the lattice constant slightly when incorporated, such as oxygen, is present, however, these stresses may be relaxed without breaking the continuity of the Ga—N planes. A controlled oxygen gradient, in particular, may be able to improve the planarity of the crystals by relaxing the stress gradually, giving rise to more ideal Ga—N planes.

Gradients in hydrogen and fluorine concentrations, accompanying oxygen gradients, may also contribute to each of the effects described above.

In addition to benefits in preparing free-standing ammonothermal group III metal nitride boules and wafers, control of oxygen concentrations and gradients may also confer benefits to devices fabricated on these substrates, as shown in FIGS. 6A, 6B, 7A, and 7B. In many cases, an oxygen concentration above $3 \times 10^{18}$ cm$^{-3}$, above $5 \times 10^{18}$ cm$^{-3}$, above $1 \times 10^{19}$ cm$^{-3}$, or above $3 \times 10^{19}$ cm$^{-3}$ immediately below the n-type layer 633 or 730 is desirable to minimize ohmic losses during device operation, particularly at high current densities, particularly if the substrate is thinned during device processing. Additionally, devices having n-contacts on a (0 0 0 1) face of the substrate may benefit from a reduced contact resistance. Examples of such devices include a N-face transistor device (e.g., FIG. 7B and associated discussion) and a lateral Ga-face laser diode.

As the maximum oxygen concentration in a free-standing ammonothermal GaN substrate exceeds $5 \times 10^{19}$ cm$^{-3}$ or $1 \times 10^{20}$ cm$^{-3}$, the optical absorption coefficient becomes quite high, detracting from the performance of optical devices fabricated on the substrate, and the thermal conductivity may also be negatively impacted, detracting from the performance of high power devices fabricated on the substrate. Therefore, the maximum oxygen concentration in a free-standing ammonothermal group III metal nitride boule or wafer, for example, on a (0 0 0 1) surface, may be chosen to be less than about $1 \times 10^{20}$ cm$^{-3}$, less than about $5 \times 10^{19}$ cm$^{-3}$, or less than about $3 \times 10^{19}$ cm$^{-3}$, less than about $2 \times 10^{19}$ cm$^{-3}$, or less than about $1 \times 10^{19}$ cm$^{-3}$. As the minimum oxygen concentration in a free-standing ammonothermal GaN crystals decreases below about $2 \times 10^{18}$ cm$^{-3}$, below about $1 \times 10^{18}$ cm$^{-3}$, or below about $5 \times 10^{17}$ cm$^{-3}$, the electrical resistivity may increase to the point that ohmic losses become significant in devices fabricated on the substrate and yields in preparing the substrate may decrease to the point that the cost of manufacture becomes undesirably high. Therefore, the minimum oxygen concentration in a free-standing ammonothermal group III metal nitride boule may be adjusted by use of one or more of the techniques described below to be greater than about $2 \times 10^{18}$ cm$^{-3}$, greater than about $1 \times 10^{18}$ cm$^{-3}$, or greater than about $5 \times 10^{17}$ cm$^{-3}$. As the maximum oxygen gradient in the [0 0 0 1] direction becomes too large, for example, greater than about $1 \times 10^{21}$ cm$^{-4}$, greater about $5 \times 10^{20}$ cm$^{-4}$, or greater than about $2 \times 10^{20}$ cm$^{-4}$, stresses in the crystal may be large enough to cause cracking, either spontaneously or during wafer fabrication. Therefore, the maximum oxygen concentration gradient in the [0 0 0 1] direction in a free-standing ammonothermal group III metal nitride boule may be adjusted by use of one or more of the techniques described below to be less than about $1 \times 10^{21}$ cm$^{-4}$, less than about $5 \times 10^{20}$ cm$^{-4}$, or less than about $2 \times 10^{20}$ cm$^{-4}$. If the oxygen gradient is too low, for example, less than about $1 \times 10^{18}$ cm$^{-4}$, less than about $5 \times 10^{17}$ cm$^{-4}$, less than about $2 \times 10^{17}$ cm$^{-4}$, or less than about $5 \times 10^{16}$ cm$^{-4}$, too much residual stress may persist from a non-ideal seed crystal, or yields in preparing the substrate may decrease to the point that the cost of manufacture becomes undesirably high. Therefore, the minimum oxygen concentration gradient in a free-standing ammonothermal group III metal nitride boule in the [0 0 0 1] direction may be adjusted by use of one or more of the techniques described below to be greater than about $5 \times 10^{16}$ cm$^{-4}$, greater than about $2 \times 10^{17}$ cm$^{-4}$, greater than about $5 \times 10^{17}$ cm$^{-4}$, or greater than about $1 \times 10^{18}$ cm$^{-4}$.

Oxygen concentrations and oxygen concentration gradients within the beneficial ranges described above may be achieved by one or more of the methods described below. In certain embodiments, as described in detail above, growth on a seed crystal is caused to occur predominantly in the [0 0 0 -1] direction using ammonothermal methods. As the ammonothermal crystal growth process proceeds, polycrystalline group III metal nutrient dissolves, the dissolved material is transported to seed crystals and is deposited there as a single crystal layer. Oxygen present in the polycrystalline nutrient will, concomitantly, be released into the ammonothermal growth environment and be available for incorporation into the growing group III metal nitride layers. To the extent that the concentration of oxygen within the polycrystalline group III metal nitride nutrient is uniform and constant, the concentration of oxygen incorporated within the growing [0 0 0 -1] sector may similarly be uniform and constant. However, to the extent that oxygen becomes available in the ammonothermal growth environment at the beginning of the growth run in excess of the steady-state amount present during nutrient-dissolution and crystal growth processes, an elevated oxygen concentration can be incorporated into the initial growth layers. If the elevated oxygen level is not being fully replenished by nutrient dissolution, then its consumption by the growing group III metal nitride crystals themselves will cause its concentration within the ammonothermal growth environment to diminish with time, generating a negative oxygen gradient in the [0 0 0 -1] direction in the growing crystals.

Several process conditions may be chosen to generate and control an elevated oxygen concentration at the beginning of an ammonothermal crystal growth run. In certain embodiments, the nutrient material is chosen to be a polycrystalline material having a porosity between about 0.01 percent and about 10 percent or between about 0.1 percent and about 5 percent by volume, for example, as quantified by mercury porosimetry. The quantity of oxygen in the nutrient can be controlled by controlling one or more of the purity of the raw materials (for example, Ga metal and gases), by the time and temperature of a bakeout procedure applied before formation of the polycrystalline nutrient, and by intentional oxygen doping, for example, by adding $H_2O$ and/or $O_2$ to one or more of the input gases used to form the polycrystalline nutrient. After formation, the polycrystalline nutrient material may be cleaned by washing in acids, bases, oxidizers, and the like, and residual water may be present within the pores after the washing treatment. In some embodiments, the amount of residual moisture in the polycrystalline nutrient may be controlled by baking one or more of the polycrystalline nutrient itself or a sealable container, such as a capsule or autoclave, into which it is placed, at a temperature between about 50 degrees Celsius and about 600 degrees Celsius, between about 100 degrees Celsius and about 400 degrees Celsius, or between about 150 degrees Celsius and about 250 degrees Celsius, for a period between about one hour and about 96 hours before adding ammonia to the sealable container. Any remaining moisture in the polycrystalline nutrient should be released into the ammonothermal growth environment very early in a growth run, leading to an elevated oxygen concentration in the initially-grown group III metal nitride layers that gradually diminishes. By adjusting the porosity of the polycrystalline group III metal nitride and the bakeout temperature and time, the magnitude of the elevated oxygen concentration can be controlled.

In a similar way, an oxide, for example, $Ga_2O_3$, can be formed on the surface of the polycrystalline group III metal nitride by heating in an oxidizing acid, such as 10% $HNO_3$ in $H_2SO_4$ or $HClO_4$, to a temperature between about 25 degrees Celsius and about 200 degrees Celsius for a period between about 0.5 hour and about 10 hours, or by heating in $O_2$ or air, to a temperature between about 300 degrees Celsius and about 1000 degrees Celsius, or between about 500 degrees Celsius and about 850 degrees Celsius, for a period between about 1 hour and about 24 hours. During the initial stages of ammonothermal growth, a metal oxide such as $Ga_2O_3$ may quickly react with $NH_3$ to form a metal nitride and $H_2O$, which can be available to form an initially-elevated concentration of oxygen within the growing group III metal nitride crystals. Therefore, by controlling or adjusting the thickness of the formed metal oxide layer on the polycrystalline group III metal nitride the relative amount of oxygen that is present at the initial stages of ammonothermal growth can be controlled.

In certain embodiments, polycrystalline nutrient material having relatively large grains, for example, with an average grain dimension between about 50 micrometers and about 5 millimeters, is provided along with polycrystalline nutrient material having relatively small grains, for example, with an average grain dimension between about 1 micrometer and about 25 micrometers. The grain boundaries may have an elevated oxygen concentration, for example, as $Ga_2O_3$, and may be preferentially etched during the initial stages of the crystal growth process, leading to an initially-elevated concentration of oxygen in the growth environment and in the growing GaN layers. In certain embodiments, the fine-grained polycrystalline nutrient is intentionally doped with oxygen, for example, to a concentration between about $3 \times 10^{18}$ $cm^{-3}$ and about $1 \times 10^{20}$ $cm^{-3}$. The magnitude of the maximum oxygen concentration and of the oxygen gradient may be adjusted by controlling the relative amounts of large-grain and small-grain polycrystalline nutrient material and the oxygen concentrations in the large-grain and fine-grain polycrystalline nutrient material and in the grain boundaries. In certain embodiments, the relatively small-grain polycrystalline nutrient or oxygen-doped nutrient is placed in the sealable ammonothermal container in a location where this nutrient is etched first, such that the larger-grained nutrient with lower oxygen content may be etched later during the growth process. For example, in an ammonothermal process with retrograde solubility, the high-oxygen-content nutrient material could be placed physically above the low-oxygen-content nutrient (e.g., in a cooler region of the nutrient region of the chamber) and in a region where the applied temperature is lower than the temperature for the low-oxygen-content nutrient, causing preferential etching of the high-oxygen-content nutrient during the initial stages of growth.

In certain embodiments, the timing of the oxygen release and hence the oxygen gradient in the grown boules may be controlled by introducing etchable barriers or structures within the nutrient source zone. Dissolution of these barriers may allow communication between the dissolving fluid and certain volumes or regions of nutrient material or other materials that have desirable compositions, physical structures and/or grain sizes. These revealed regions may include material containing one or more selected oxygen concentrations or selected oxygen release rates due to varying porosity, grain size, or the like. In certain embodiments, a plate of polycrystalline GaN may serve as an etchable barrier. In certain embodiments, an etchable barrier or structure is provided as a cover for a crucible. In certain embodiments, the crucible consists of or includes silver, gold, platinum, palladium, copper, nickel, and molybdenum. In certain embodiments, a low-oxygen-content polycrystalline nutrient material is placed inside the crucible and loaded into the sealable container prior to ammonothermal crystal growth.

In certain embodiments, silver metal is present in the ammonothermal crystal growth environment. In certain embodiments, a capsule within which the ammonothermal crystal growth environment is formed consists of or includes silver. It is well known that silver can dissolve significant quantities of oxygen and that oxygen can readily permeate silver, for example, at temperatures above 500 degrees Celsius or 600 degrees Celsius. In certain embodiments, silver metal, having an oxygen concentration between about 10 parts per million and about 200 parts per million, or between about 20 parts per million and about 100 parts per million, is provided to the ammonothermal growth environment such that a ratio of the weight of silver to the weight of polycrystalline group III metal nitride nutrient is between about 0.01 and about 10, between about 0.1 and about 5, or between about 0.3 and about 2. During the initial stages of the crystal growth process, as the temperature of silver in contact with supercritical ammonia rises above about 500 degrees Celsius, oxygen diffuses out from the silver into the growth environment, leading to an initially-elevated concentration of oxygen in the growth environment and in the growing GaN layers. The rate of out-diffusion can be reduced by the presence of a coating on the interface between the silver and the ammonia within the processing environment. In certain embodiments, the coating includes or consists of one or more of gold, platinum, or palladium. The magnitude of the maximum oxygen concentration and of the oxygen gradient may be adjusted by controlling the concentration of oxygen in the silver, the ratio of the weight of silver to the weight of polycrystalline GaN, and the composition and thickness of the coating on the silver.

In certain embodiments, the oxygen content of silver components within the sealable container, including one or more of a capsule, at least one baffle, furniture for support of seed crystals, and other components, is minimized to enable more precise oxygen control by means of other process factors. In certain embodiments, the oxygen content of silver components is minimized, for example, held below 10 parts per million or below 5 parts per million, by one or more of re-using silver components from a previous crystal growth run in supercritical ammonia, or firing to a temperature between 400 degrees Celsius and 950 degrees Celsius in a suitable atmosphere. In certain embodiments, the firing atmosphere includes or consists of an inert gas such as nitrogen, argon, or helium. In certain embodiments, the firing atmosphere contains greater than 1%, greater than 2%, or greater than 4% hydrogen or ammonia. In certain embodiments, the firing atmosphere contains less than 6% hydrogen or ammonia. In certain embodiments, all welding operations involving silver components within the sealable container are performed in an inert atmosphere, for example, argon or nitrogen, with an oxygen content below 1% or below 0.1%, or in close proximity to a getter such as graphite foil. In certain embodiments, a graphite foil is placed on the backside of a weld, in direct contact with one or more silver components or with a gap of less than 2 millimeters, less than 1 millimeter, or less than 0.5 millimeter. In certain embodiments, the graphite foil is covered by a metal foil, for example, stainless steel, that protects the graphite foil from direct exposure to air.

In certain embodiments, $H_2O$ is weighed and added to the sealable container, after an optional bake-out step and either before or after adding ammonia. During the initial stages of the crystal growth process, the added $H_2O$ is available to dope growing GaN layers at an elevated level compared to GaN layers formed later in the growth run. The magnitude of the maximum oxygen concentration and of the oxygen gradient may be adjusted by controlling the weight of added $H_2O$.

In certain embodiments, $Ga_2O_3$ is weighed and added to the sealable container along with the polycrystalline group III metal nitride. In certain embodiments, the $Ga_2O_3$ consists of or includes a powder, grit, or a polycrystalline ceramic. During the initial stages of the crystal growth process, the $Ga_2O_3$ may react with $NH_3$ to form GaN (which can subsequently dissolve) and $H_2O$, with the latter available to dope growing GaN layers at an elevated level compared to GaN layers formed later in the growth run. The magnitude of the maximum oxygen concentration and of the oxygen gradient may be adjusted by controlling the weight of added $Ga_2O_3$, the particle size of the powder or grit, and the grain size and porosity of the ceramic, as the latter factors will affect the dissolution/reaction rate of the $Ga_2O_3$ with the $NH_3$.

Other factors may also contribute to the maximum oxygen concentration and oxygen gradient, along with maximum hydrogen and fluorine concentrations and gradients therein. For example, the purity of the ammonia and of the mineralizer(s) used may be controlled to introduce target amounts of impurities into the growth environment. The ratio of the concentration of Ga vacancies, and the number of hydrogen atoms complexed therewith, to the concentration of oxygen may depend on the growth temperature. The atomic structure of fluorine in ammonothermal GaN seems not to be well understood, but fluorine may reside at nitrogen vacancies, whose concentration relative to oxygen may also depend on the growth temperature and other growth-related conditions such as supersaturation. The supersaturation, growth rate, and growth onset temperature may similarly impact the uptake of oxygen, hydrogen, and fluorine, and their ratios.

In certain embodiments, a ratio of the hydrogen concentration to the oxygen concentration, measured at discrete regions and averaged over at least a portion of a surface of a GaN crystal, wafer, or boule, is between about 0.3 and about 10, between about 0.4 and about 5, or between about 0.5 and about 3. In certain embodiments, a ratio of the fluorine concentration to the oxygen concentration, measured at discrete regions and averaged over at least a portion of a surface of a GaN crystal, wafer, or boule, is between about 0.05% and about 10%, between about 0.1% and about 6%, or between about 0.2% and about 1%.

The oxygen concentration as a function of depth within a GaN crystal, wafer, or boule may also be modified using ion implantation, for example, to an ion dose or fluence between about $10^{16}$ $cm^{-2}$ and about $10^{20}$ $cm^{-2}$, at depths between about 0.1 micrometers and about 10 micrometers, or by treatment with an oxygen-containing plasma. Implantation of oxygen ions may cause damage to the crystalline lattice, for example, vacancy and interstitial point defects and, concomitantly, stresses. These stresses may provide a benefit in controlling bow and/or crystallographic curvature and may also help to counter other sources of stress. However, the damage associated with ion implantation or plasma treatments may also have a number of undesirable effects, including risk of spallation within the damaged layer, a risk of property changes during thermal treatments, including growth of one or more epitaxial layers by MOCVD or MBE, degradation of electrical properties, and degradation of thermal properties. In preferred embodiments, the GaN crystals, wafers, and boules of the present disclosure have not been ion implanted or plasma treated and are substantially free of ion implantation or plasma damage.

By controlling the maximum concentration of oxygen and the oxygen gradient within a free-standing ammonothermal GaN boule, wafers with an engineered oxygen profile may be prepared with good yields. For example, a c-plane wafer, having a first surface with a crystallographic orientation within 10 degrees, within 5 degrees, within 2 degrees, or within 1 degree of (0001) may be prepared using the methods described above. The wafer may have a diameter of at least 40 millimeters, at least 70 millimeters, at least 90 millimeters, at least 140 millimeters, or at least 190 millimeters, and a thickness between about 200 micrometers and about 2000 micrometers, between about 225 micrometers and about 1000 micrometers, or between about 250 micrometers and about 600 micrometers. The average oxygen concentration within a depth of 2 to 10 micrometers on the first surface may be greater, by a factor between about 1.1 and about 10, or by a factor between about 1.1 and about 3, than the average oxygen concentration within a depth of 2 to 10 micrometers on the opposing surface, as quantified by calibrated secondary ion mass spectrometry. The first surface may be characterized by a stacking fault concentration below about $10^3$ $cm^{-1}$, below about $10^2$ $cm^{-1}$, below about 10 $cm^{-1}$, or below about 1 $cm^{-1}$. The wafer may be characterized by a total thickness variation (TTV) below about 30 micrometers, below about 20 micrometers, below about 10 micrometers, or below about 5 micrometers.

In another embodiment, a nonpolar or semipolar wafer, having a first surface with a crystallographic orientation within 30 degrees of {10-10}, a maximum dimension greater than 5 millimeters in a first direction, the first direction consisting of a projection of [0001] on the first surface, and a maximum dimension greater than 15 millimeters in a second direction orthogonal to the first direction may be prepared using the methods described above. The wafer may have a thickness between about 100 micrometers and about 1000 micrometers, or between about 200 micrometers and about 600 micrometers. By virtue of the presence of an oxygen gradient in the [0 0 0 1] direction, the wafer may be characterized by an optical absorption coefficient at a wavelength of 450 nanometers having a minimum value, as measured by scanning in the first direction, between about 0.1 $cm^{-1}$ and about 5 $cm^{-1}$, or between about 0.25 $cm^{-1}$ and about 3 $cm^{-1}$, at a first position along the first surface, and increasing to a maximum value between about 0.5 $cm^{-1}$ and about 25 $cm^{-1}$, between about 0.75 $cm^{-1}$ and about 10 $cm^{-1}$, or between about 1 $cm^{-1}$ and about 6 $cm^{-1}$, at a second position along the first direction, the second position being separated from the first position in the first direction by a distance between 1 millimeter and 25 millimeters, or between about 2 millimeters and about 10 millimeters. In certain embodiments, the crystal from which the wafer has been prepared has been regrown one, two, three, or more times using the techniques described above. In certain embodiments, the wafer may be characterized by two, three, four, or more local maxima and minima in the optical absorption coefficient at a wavelength of 450 nanometers, and also in the oxygen concentration, as measured by calibrated secondary ion mass spectrometry (SIMS), along the first direction. In certain embodiments, the wafer may be characterized by an optical absorption coefficient at a wavelength of 450 nanometers having a locally-minimum value between about 0.1 $cm^{-1}$ and about 5 $cm^{-1}$, or between about 0.25 $cm^{-1}$ and about 3 $cm^{-1}$, at a third position along the first direction, the third position being separated from the second location in the first direction by a distance between 1 millimeter and 25 millimeters, or between about 2 millimeters and about 10 millimeters. In certain embodiments, the wafer may be characterized by an optical absorption coefficient at a wavelength of 450 nanometers having a locally-maximum value between about 0.5 $cm^{-1}$ and about 25 $cm^{-1}$, between about 0.75 $cm^{-1}$ and about 10 $cm^{-1}$, or between about 1 $cm^{-1}$ and about 6 $cm^{-1}$, at a fourth position along the first direction, the fourth position being separated from the third position in the first direction by a distance between 1 millimeter and 25 millimeters, or between about 2 millimeters and about 10 millimeters. By virtue of the presence of an oxygen gradient in the [0 0 0 1] direction, the wafer may be characterized by an oxygen concentration having a minimum value, as measured by scanning in the first direction, between about $2\times10^{17}$ $cm^{-3}$ and about $1\times10^{19}$ $cm^{-3}$, or between about $5\times10^{17}$ $cm^{-3}$ and about $6\times10^{18}$ $cm^{-3}$, at a first position along the first surface, and increasing to a maximum value between about $1\times10^{18}$ $cm^{-3}$ and about $5\times10^{19}$ $cm^{-3}$, between about $1.5 \times 10^{18}$ cm$^{-3}$ and about $2 \times 10^{19}$ cm$^{-3}$, or between about $2 \times 10^{18}$ cm$^{-3}$ and about $1.2 \times 10^{19}$ cm$^{-3}$, at a second position along the first direction, the second position being separated from the first position in the first direction by a distance between 1 millimeter and 25 millimeters, or between about 2 millimeters and about 10 millimeters. In certain embodiments, the crystal from which the wafer has been prepared has been regrown one, two, three, or more times using the techniques described above. In certain embodiments, the wafer may be characterized by an oxygen concentration having a locally-minimum value between about $2 \times 10^{17}$ cm$^{-3}$ and about $1 \times 10^{19}$ cm$^{-3}$, or between about $5 \times 10^{17}$ cm$^{-3}$ and about $6 \times 10^{18}$ cm$^{-3}$, at a third position along the first direction, the third position being separated from the second location in the first direction by a distance between 1 millimeter and 25 millimeters, or between about 2 millimeters and about 10 millimeters. In certain embodiments, the wafer may be characterized by an oxygen concentration having a locally-maximum value between about $1 \times 10^{18}$ cm$^{-3}$ and about $5 \times 10^{19}$ cm$^{-3}$, between about $1.5 \times 10^{18}$ cm$^{-3}$ and about $2 \times 10^{19}$ cm$^{-3}$, or between about $2 \times 10^{18}$ cm$^{-3}$ and about $1.2 \times 10^{19}$ cm$^{-3}$, at a fourth position along the first direction, the fourth position being separated from the third position in the first direction by a distance between 1 millimeter and 25 millimeters, or between about 2 millimeters and about 10 millimeters. The first surface may be characterized by a stacking fault concentration below about $10^3$ cm$^{-1}$, below about $10^2$ cm$^{-1}$, below about 10 cm$^{-1}$, or below about 1 cm$^{-1}$. The wafer may be characterized by a total thickness variation (TTV) below about 5 micrometers, below about 4 micrometers, below about 3 micrometers, or below about 2 micrometers.

Figure 19:
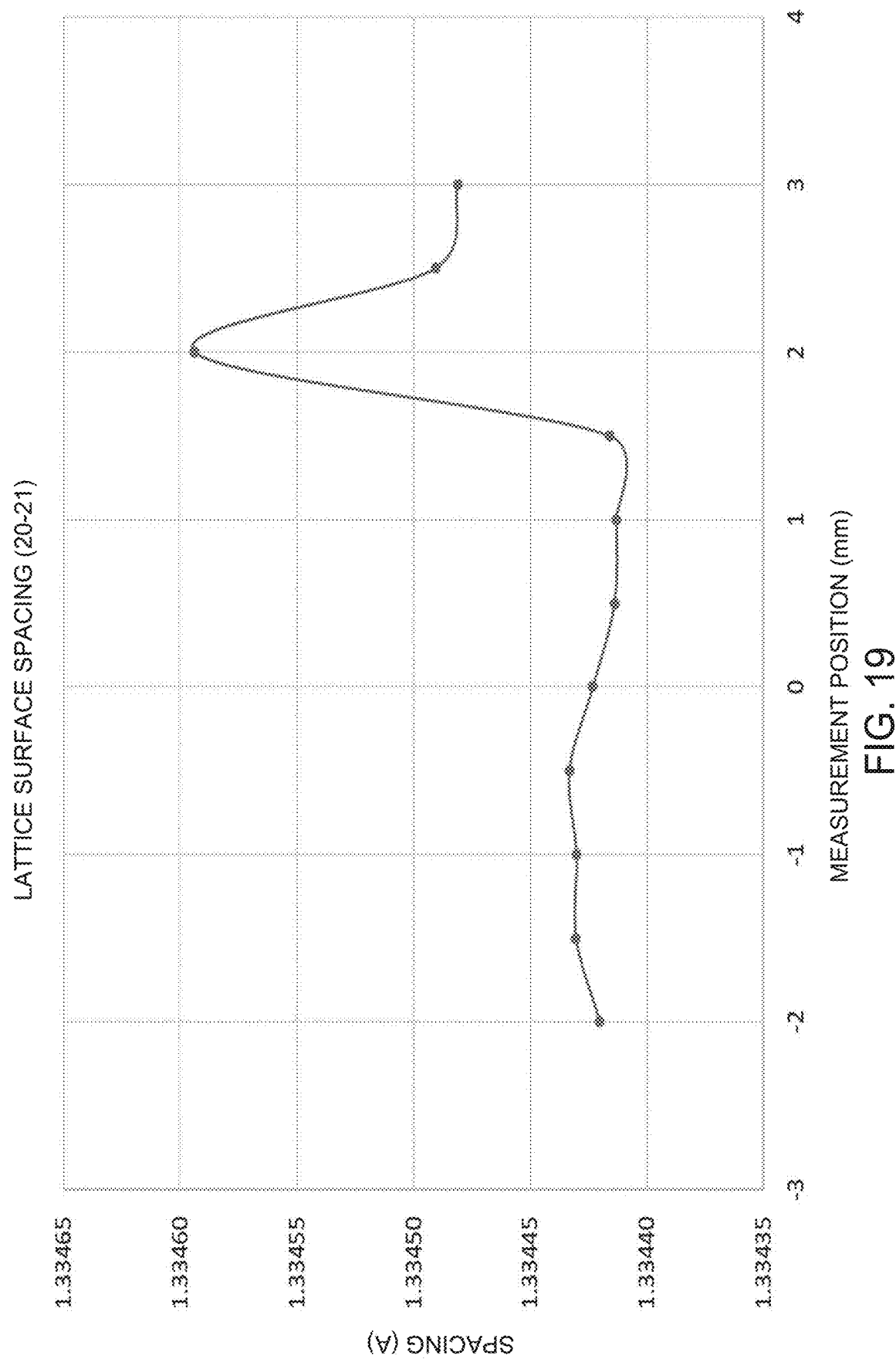
FIG. 19 is a graph illustrating the dependence of a {20-21} lattice spacing on measurement position on a surface of a semipolar wafer.

In certain embodiments, a nonpolar or semipolar wafer, having a first surface with a crystallographic orientation within 30 degrees of {10-10}, a maximum dimension greater than 5 millimeters in a first direction, the first direction consisting of a projection of [0001] on the first surface, and a maximum dimension greater than 15 millimeters in a second direction orthogonal to the first direction may be prepared using the methods described above. In certain embodiments, the spacing between {20-21} lattice planes as a function of position on the first surface along the first direction of the wafer may be determined from the $2\theta$ value of a (201) x-ray reflection as the sample is translated in the first direction under the x-ray beam in a diffractometer, using the Bragg equation and methods that are known in the art. By virtue of the presence of an oxygen gradient in the [0 0 0 1] direction, the wafer may be characterized by a {20-21} lattice spacing that varies along with the local concentration of oxygen. An example of this behavior is shown in FIG. 19. In certain embodiments, the difference between a minimum value of the {20-21} lattice spacing and a maximum value of the {20-21} lattice spacing along the first direction is at least $2 \times 10^{-5}$ Å and not more than $3 \times 10^{-4}$ Å or at least $4 \times 10^{-5}$ Å and not more than $2 \times 10^{-4}$ Å. In certain embodiments, the separation between a locally-maximum {20-21} lattice constant and a locally-minimum {20-21} lattice constant along the first direction is between about 1 millimeter and about 25 millimeters.

In a specific embodiment, a Phase 1 seed wafer is prepared by the following process. In some embodiments of the process, the substrate 101 includes an intermediate-quality substrate, which may be a c-plane HVPE substrate, for example, having a front side crystallographic orientation that is miscut from (0001) by between 0.2 and 0.8 degree toward an m-direction and by less than 0.2 degrees toward an orthogonal a-direction and an average dislocation density between about $5 \times 10^5$ cm$^{-2}$ and about $3 \times 10^7$ cm$^{-2}$. The intermediate-quality substrate is patterned on the N (back) surface, as described above, and masked or covered on the Ga (front) surface. An ammonothermal layer, with a thickness between about 1 millimeters and about 15 millimeters, or between about 2 millimeters and about 10 millimeters, is grown in the [000-1] direction, with an initial oxygen concentration between about $1 \times 10^{19}$ cm$^{-3}$ and about $6 \times 10^{19}$ cm$^{-3}$. Since the influence of oxygen relaxes not only the macroscopic strain of the HVPE substrate but also the local strain center and the mismatch caused by the lattice mismatch, the crystal can be thickened without generating a rough growth surface, such as that shown schematically in FIG. 12. One or more slices may be prepared by multi-wire sawing, with a pitch between about 0.5 millimeters and about 2 millimeters, or between about 0.6 millimeters and about 1.5 millimeters, from the ammonothermal layer. In certain embodiments, after additional optional preparation steps, such as one or more of grinding, polishing, chemical-mechanical polishing, or final cleaning, a slice may be used for device fabrication if specifications permit. In certain embodiments, one or more of a grinding process, a polishing process, or a chemical mechanical polishing process may be performed in addition to or instead of a multiwire sawing process. In certain embodiments, the crystal quality can be further improved by repeating a similar procedure using these slices as Phase 1 seed wafers. Phase 1 seed wafers may then be prepared from the slices by etching in phosphoric acid at a temperature between about 100 degrees Celsius and about 300 degrees Celsius for a time between about 30 seconds and about three hours or, alternatively, by etching in aqueous potassium hydroxide at a temperature between about 60 degrees Celsius and about 120 degrees Celsius for a time between about 30 minutes and about five hours. In a preferred embodiment, a slice containing the original intermediate-quality substrate is recovered and, after preparing the N-face surface by etching, reused as an intermediate-quality substrate for growth of additional Phase 1 seed wafers. Finally, when an as-grown (000-1) surface of an ammonothermal layer is found to be substantially flat and smooth after growth, that is, with at least 95% of the area of the as-grown (000-1) surface having a root-mean-square surface roughness in a first region (e.g., portion 1271 in FIG. 12) between about 0.1 nanometers and about 20 micrometers, or between about 0.1 micrometers and about 5 micrometers, and at least 90% of the area of the as-grown (000-1) surface being free of depressions having a depth greater than about 5 micrometers and less than about 100 micrometers, or greater than about 20 micrometers and less than 100 micrometers, with respect to the balance of the as-grown (000-1) surface (e.g., portion 1271 in FIG. 12), the crystal may be considered to be a Phase 2 crystal. In certain embodiments, some cracks may be present in the Phase 2 crystal.

Phase 2 seed crystals can be obtained from the ammonothermal layer portion of the Phase 2 crystal and may be regrown with the same procedure without a patterned mask. However, crystals grown using Phase 2 seeds are found to have a greatly improved growth yield even if the initial oxygen concentration is not increased to the same level. For example, in certain embodiments, the initial oxygen concentration is set to a level between about $3 \times 10^{18}$ cm$^{-3}$ and about $1 \times 10^{19}$ cm$^{-3}$ rather than to an initial concentration between about $1 \times 10^{19}$ cm$^{-3}$ and about $6 \times 10^{19}$ cm$^{-3}$. In addition, since it is not necessary to avoid a region having such a large initial oxygen content, the production efficiency also increases. When the as-grown (000-1) surface of an ammonothermal layer is found to be substantially flat and smooth after growth, that is, with 100% of the area of the (000-1) surface having a root-mean-square surface roughness in a first region (e.g., portion 1271 in FIG. 12) between about 0.1 nanometers and about 20 micrometers and 100% of the area of the (000-1) surface being free of cracks and free of depressions having a depth greater than about 5 micrometers and less than about 100 micrometers, or greater than about 20 micrometers and less than about 100 micrometers, with respect to the balance of the (000-1) surface (e.g., portion 1271 in FIG. 12), the crystal may be considered to be a Phase 3 crystal.

Phase 3 seed crystals can be obtained from the ammonothermal layer portion of the Phase 3 crystal and may be regrown with the same procedure without a patterned mask. Crystals grown using Phase 3 seeds are found to have a further improved growth yield even if the initial oxygen concentration is not increased to the same level. For example, in certain embodiments, the initial oxygen concentration is set to a level between about $3 \times 10^{18}$ cm$^{-3}$ and about $1 \times 10^{19}$ cm$^{-3}$ rather than to an initial concentration between about $1 \times 10^{19}$ cm$^{-3}$ and about $6 \times 10^{19}$ cm$^{-3}$. In addition, since it is not necessary to avoid a region having such a large initial oxygen content, the production yield, that is, the fraction of the crystal that can be fabricated into salable wafers, may also increase.

The above sequence of steps provides a method according to an embodiment of the present disclosure. Other alternatives can also be provided where steps are added, one or more steps are removed, or one or more steps are provided in a different sequence without departing from the scope of the claims herein.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

Figure 16A:
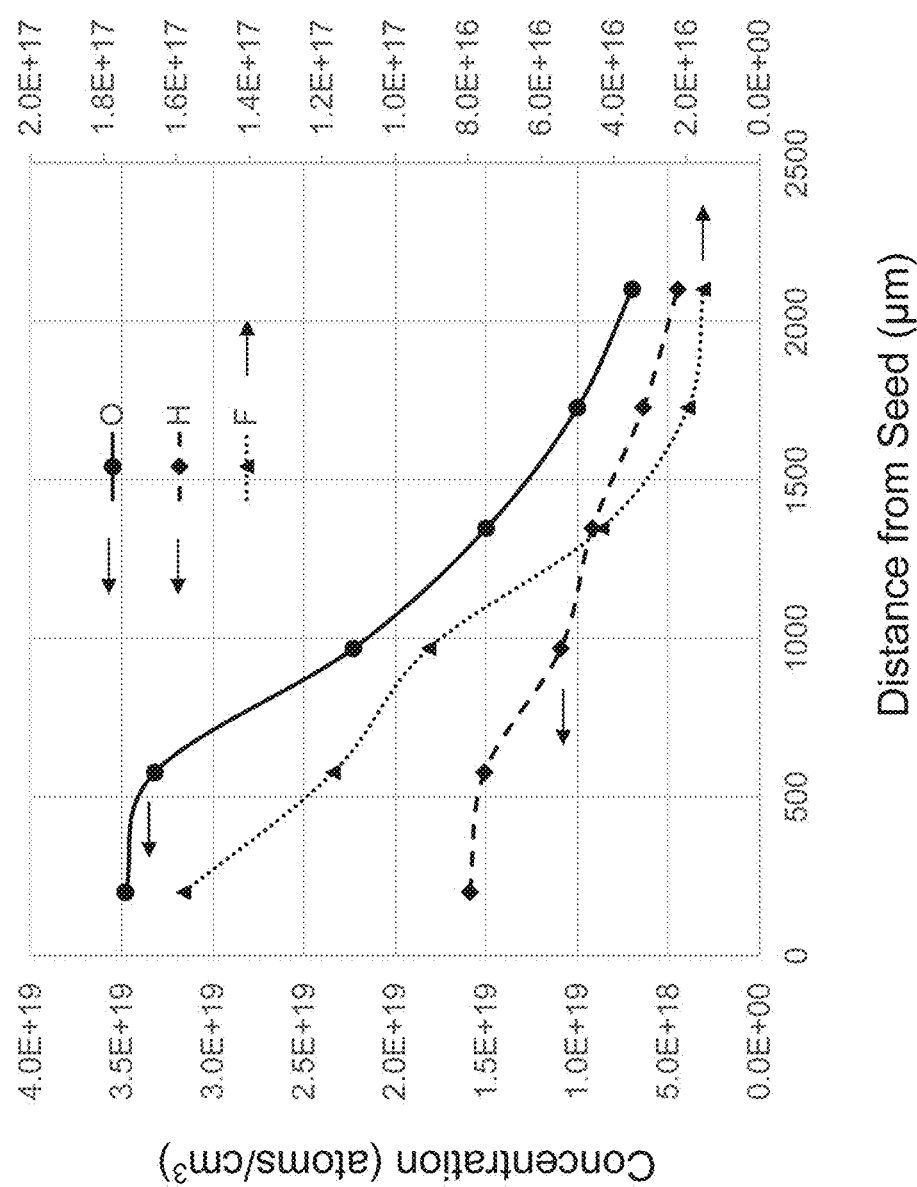
FIGS. 16A, 17A, and 18 are graphs illustrating the dependence of oxygen (●, left axis), hydrogen (♦, left axis), and fluorine (▲, right axis) concentrations on distance from a regrowth interface in the [0 0 0 −1] direction, according to embodiments of the present disclosure.
Figure 16B:
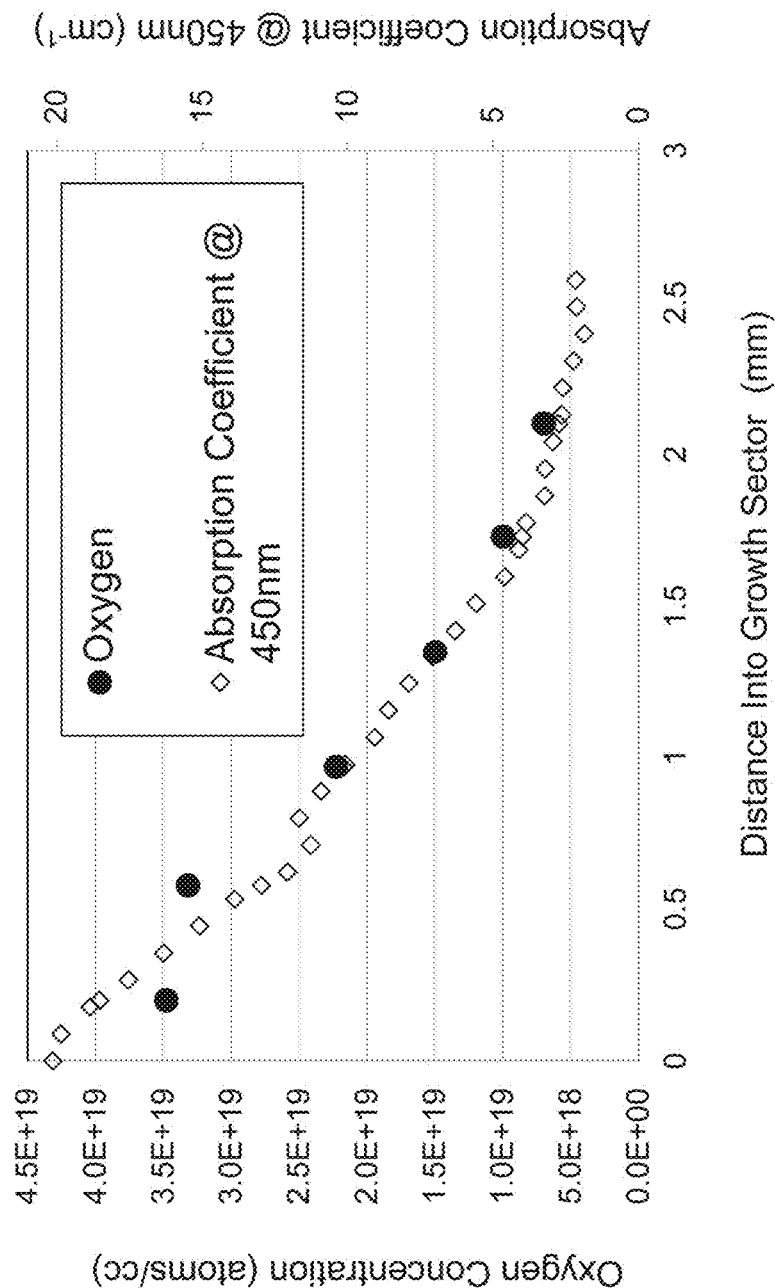
FIGS. 16B and 17B are graphs illustrating the dependence of an oxygen concentration (left axis) and of an optical absorption coefficient at a wavelength of 450 nm (right axis) on distance from a regrowth interface in the [0 0 0 −1] direction, according to embodiments of the present disclosure.

A set of c-plane-oriented, bulk GaN substrates, some un-patterned, some patterned, and some patterned and trenched, were placed in a silver capsule along with a 7%-open-area baffle and polycrystalline GaN nutrient. The ratio of the weight of the weight of the silver to the weight of polycrystalline GaN nutrient was approximately 1.76, and the silver had an average oxygen content of approximately 10 parts per million, based on a measurement of similarly-prepared parts by instrumental gas analysis (IGA). Prior to placement in the capsule, the polycrystalline GaN was deposited as a several-millimeter-thick film on Mo foil by reaction of GaCl, formed by bubbling Cl$_2$ through Ga at a temperature of approximately 825° C., with NH$_3$, at a temperature of approximately 900° C., and then recovered. The polycrystalline GaN nutrient had a porosity of approximately 0.66%, as measured by mercury intrusion porosimetry and an oxygen content of approximately 7 parts per million, as measured by glow discharge mass spectrometry. Before insertion in the capsule, the polycrystalline GaN nutrient was cleaned with mineral acids, washed in deionized water, and baked at a temperature of approximately 60° C. overnight. After insertion of the solid raw materials, the capsule was evacuated, back-filled with argon, evacuated again, heated to a temperature of approximately 175° C., back-filled with argon, re-evacuated, held at temperature for approximately 4.8 hours, and then cooled. The capsule was chilled to dry ice temperature and HF and then NH$_3$ were added by the vapor phase, forming NH$_4$F as mineralizer. The ratios of GaN nutrient and NH$_4$F mineralizer to ammonia were approximately 3.23 and 0.125 respectively, by weight. The capsule was placed in an internally-heated high pressure apparatus and heated to temperatures of approximately 669 degrees Celsius for the upper, nutrient zone and approximately 679 degrees Celsius for the lower, crystal growth zone, maintained at these temperatures for approximately 1220 hours, and then cooled and removed. A wedge-shaped analysis sample was prepared from an ammonothermal GaN layer grown on an un-patterned substrate, as shown in FIG. 8 with wedge angle α=15° and SIMS measurements were performed at six points along surface 855. The measured oxygen, hydrogen, and fluorine concentrations, shown as a function of distance d from regrowth interface over the large-area surface 102, are shown in FIG. 16A. The maximum oxygen concentration was approximately $3.6 \times 10^{19}$ cm$^{-3}$, and the average gradient, measured between depths of 0.6 mm and 2.1 mm from the (0 0 0 -1) seed interface, was approximately $-1.8 \times 10^{20}$ cm$^{-4}$ in the [0 0 0 -1] direction. The average H/O ratio was approximately 0.55. The average F/O ratio was approximately 0.32%. Two parallel slices of the wedge-shaped sample were then made, perpendicular to surface 855 (that is, in the plane of the page in FIG. 8), and the two surfaces were ground and chemical-mechanically polished. The optical absorption coefficient at a wavelength of 450 nm and the oxygen concentration as a function of depth within the grown region were measured, and the optical absorption coefficient results (right axis) and the oxygen concentration (left axis) are included in FIG. 16B. The optical absorption coefficient at 450 nm as a function of oxygen concentration is included in FIG. 11.

Example 2

Figure 17A:
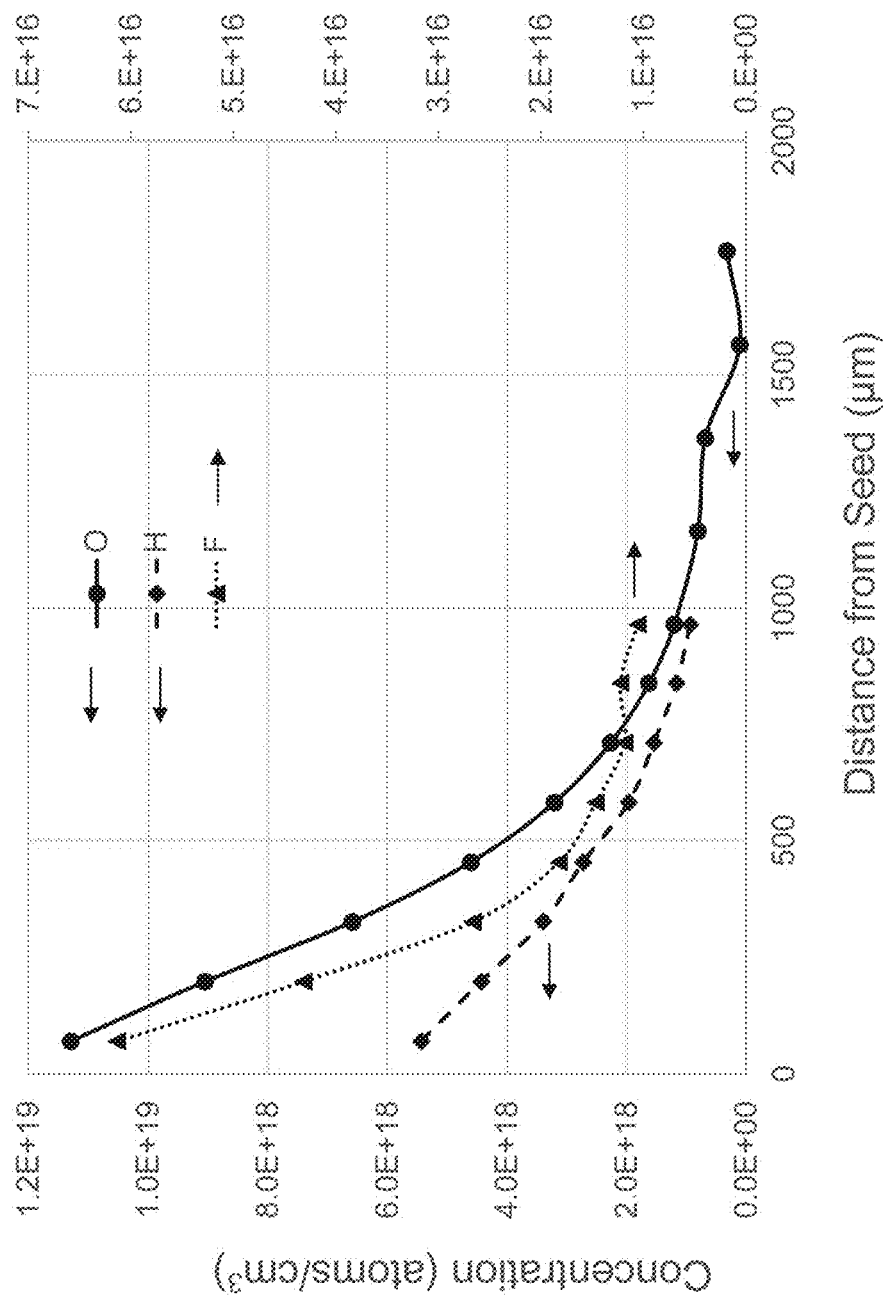
Figure 17B:
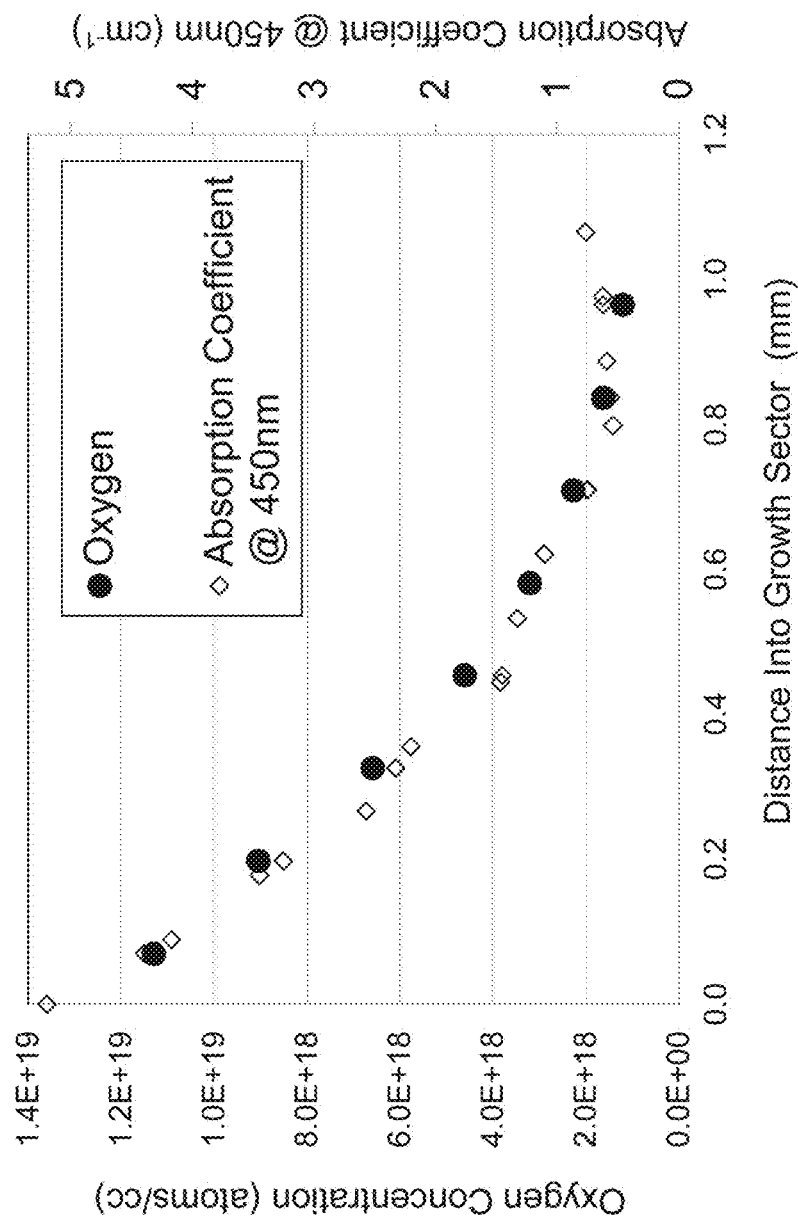

A set of c-plane-oriented, bulk GaN substrates, some un-patterned, some patterned, and some patterned and trenched, were placed in a silver capsule along with a 15%-open-area baffle and polycrystalline GaN nutrient. The ratio of the weight of the weight of the silver to the weight of polycrystalline GaN was approximately 3.11, and the silver had an average oxygen content of approximately 6 parts per million, based on a measurement of similarly-prepared parts by instrumental gas analysis (IGA). Prior to placement in the capsule, the polycrystalline GaN was deposited as a several-millimeter-thick film on Mo foil by reaction of GaCl, formed by bubbling Cl$_2$ through Ga at a temperature of approximately 825° C., with NH$_3$, at a temperature of approximately 900° C., as described in U.S. Pat. No. 10,619,239. The polycrystalline GaN nutrient had a porosity of approximately 0.66%, as measured by mercury intrusion porosimetry and an oxygen content of approximately 7 parts per million, as measured by glow discharge mass spectrometry. Before insertion in the capsule, the polycrystalline GaN nutrient was cleaned with mineral acids, washed in deionized water, and baked at a temperature of approximately 120° C. overnight. After insertion of the solid raw materials, the capsule was evacuated, heated to a temperature of approximately 200° C., back-filled with argon, re-evacuated, back-filled and purged with a continuous flow of argon for about 71 hours, as described in U.S. Pat. No. 8,021,481, re-evacuated, such that the capsule was held at temperature for approximately 92 hours, and then cooled, with an additional pump/purge cycle during the cooldown. The capsule was chilled to dry ice temperature and HF and then $NH_3$ were added by the vapor phase, forming $NH_4F$ as mineralizer. The ratios of GaN nutrient and $NH_4F$ mineralizer to ammonia were approximately 2.59 and 0.122 respectively, by weight. The capsule was placed in an internally-heated high pressure apparatus and heated to temperatures of approximately 664 degrees Celsius for the upper, nutrient zone and approximately 681 degrees Celsius for the lower, crystal growth zone, maintained at these temperatures for approximately 960 hours, and then cooled and removed. A wedge-shaped analysis sample was prepared from an ammonothermal GaN layer grown on an un-patterned substrate, as shown in FIG. 8 with wedge angle $\alpha=10°$ and SIMS measurements were performed at 12 points along surface 855. The measured oxygen, hydrogen, and fluorine concentrations, shown as a function of distance d from regrowth interface over the large-area surface 102, are shown in FIG. 17A. The maximum oxygen concentration was approximately $1.1\times10^{19}$ $cm^{-3}$. The average oxygen gradient, up to a depth of about 0.6 mm from the (0 0 0 -1) seed interface, was approximately $-1.6\times10^{20}$ $cm^{-4}$ in the [0 0 0 -1] direction. The average oxygen gradient, at depths between about 0.7 mm and about 1.8 mm from the seed interface, was approximately $-1.8\times10^{19}$ $cm^{-4}$ in the [0 0 0 -1] direction. The average H/O ratio was approximately 0.61. The average F/O ratio was approximately 0.55%. Two parallel slices of the wedge-shaped sample were then made, perpendicular to surface 855 (that is, in the plane of the page in FIG. 8), and the two surfaces were ground and chemical-mechanically polished. The optical absorption coefficient at a wavelength of 450 nm and the oxygen concentration as a function of depth within the grown region were measured, and the optical absorption coefficient results (right axis) and the oxygen concentration (left axis) are included in FIG. 17B. The optical absorption coefficient as a function of oxygen concentration is included in FIG. 11.

Example 3

Figure 18:
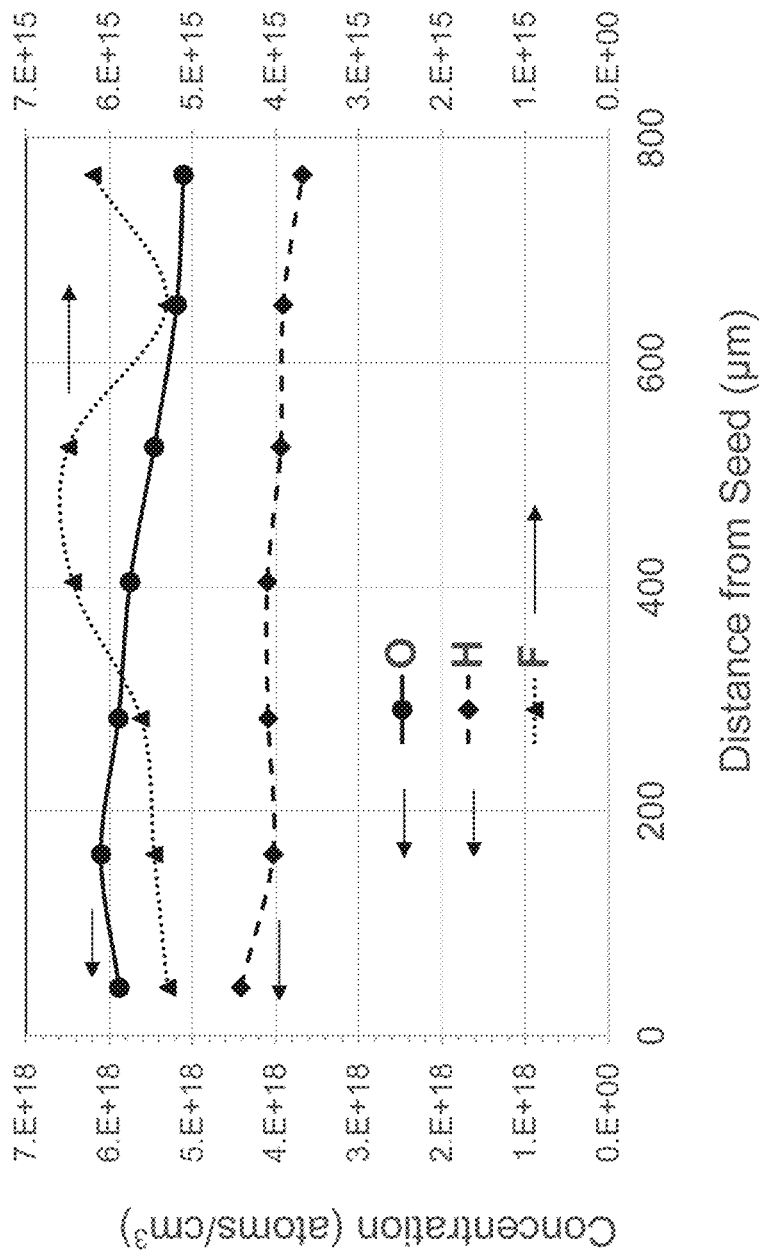

A set of c-plane-oriented, bulk GaN substrates, some un-patterned, some patterned, and some patterned and trenched, were placed in a silver capsule along with a 15%-open-area baffle and polycrystalline GaN nutrient. The ratio of the weight of the weight of the silver to the weight of polycrystalline GaN was approximately 3.59, and the silver had an average oxygen content of approximately 6 parts per million, based on a measurement of similarly-prepared parts by instrumental gas analysis (IGA). Prior to placement in the capsule, the polycrystalline GaN was deposited as a several-millimeter-thick film on Mo foil by reaction of GaCl, formed by bubbling $Cl_2$ through Ga at a temperature of approximately 825° C., with $NH_3$, at a temperature of approximately 900° C., as described in U.S. Pat. No. 10,619,239. The polycrystalline GaN nutrient had a porosity of approximately 0.66%, as measured by mercury intrusion porosimetry and an oxygen content of approximately 7 parts per million, as measured by glow discharge mass spectrometry. Before insertion in the capsule, the polycrystalline GaN nutrient was cleaned with mineral acids, washed in deionized water, and baked at a temperature of approximately 120° C. overnight. After insertion of the solid raw materials, the capsule was evacuated, heated to a temperature of approximately 200° C., back-filled with argon and re-evacuated three times over a period of approximately 42 hours, and then cooled, with an additional pump/purge cycle during the cooldown. The capsule was chilled to dry ice temperature and HF and then $NH_3$ were added by the vapor phase, forming $NH_4F$ as mineralizer. The ratios of GaN nutrient and $NH_4F$ mineralizer to ammonia were approximately 2.19 and 0.135 respectively, by weight. The capsule was placed in an internally-heated high pressure apparatus and heated to temperatures of approximately 664 degrees Celsius for the upper, nutrient zone and approximately 681 degrees Celsius for the lower, crystal growth zone, maintained at these temperatures for approximately 333 hours, and then cooled and removed. A wedge-shaped analysis sample was prepared from an ammonothermal GaN layer grown on an un-patterned substrate, as shown in FIG. 8 with wedge angle $\alpha=5°$ and SIMS measurements were performed at seven points along surface 855. The measured oxygen, hydrogen, and fluorine concentrations, shown as a function of distance d from regrowth interface over the large-area surface 102, are shown in FIG. 18. The maximum oxygen concentration was approximately $6.1\times10^{18}$ $cm^{-3}$. The average oxygen gradient, up to a depth of about 0.75 mm from the (0 0 0 -1) seed interface, was approximately $-1.65\times10^{19}$ $cm^{-4}$ in the [0 0 0 -1] direction. The average H/O ratio was approximately 0.72. The average F/O ratio was approximately 0.10%. In this case the fluorine concentrations were only slightly above the sensitivity limit of $5\times10^{15}$ $cm^{-3}$ and may be subject to significant uncertainty.

Example 4

Figure 20:
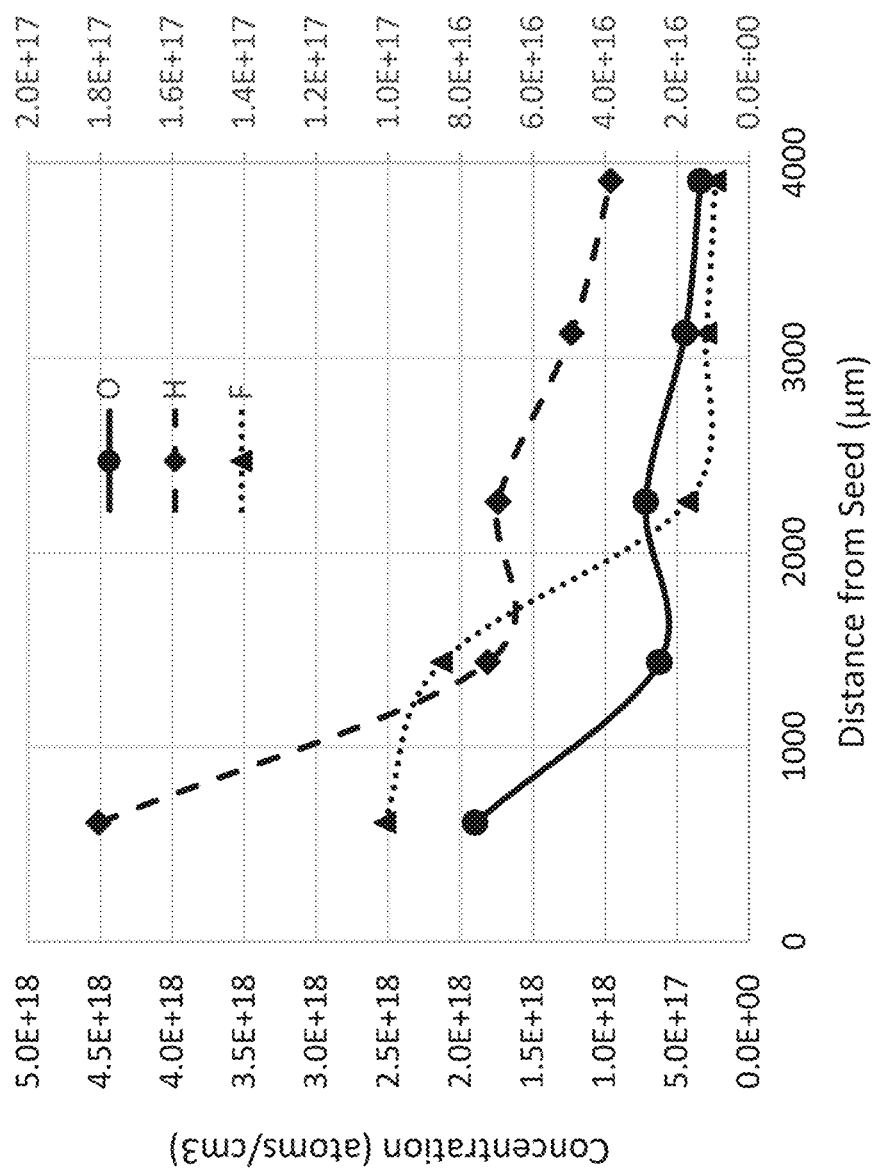
FIG. 20 is a graph illustrating the dependence of oxygen (●, left axis), hydrogen (♦, left axis), and fluorine (▲, right axis) concentrations on distance from a regrowth interface in the [0 0 0 −1] direction, according to an embodiment of the present disclosure.

A set of c-plane-oriented, bulk GaN substrates, some un-patterned, some patterned, and some patterned and trenched, were placed in a silver capsule along with a 15%-open-area baffle and polycrystalline GaN nutrient. The ratio of the weight of the weight of the silver to the weight of polycrystalline GaN was approximately 1.54, and the silver had an average oxygen content of approximately 6 parts per million, based on a measurement of similarly-prepared parts by instrumental gas analysis (IGA). Prior to placement in the capsule, the polycrystalline GaN was deposited as a several-millimeter-thick film on Mo foil by reaction of GaCl, formed by bubbling $Cl_2$ through Ga at a temperature of approximately 825° C., with $NH_3$, at a temperature of approximately 900° C. The polycrystalline GaN nutrient had a porosity of approximately 0.66%, as measured by mercury intrusion porosimetry and an oxygen content of approximately 7 parts per million, as measured by glow discharge mass spectrometry. Before insertion in the capsule, the polycrystalline GaN nutrient was cleaned with mineral acids, washed in deionized water, and baked at a temperature of approximately 120° C. overnight. After insertion of the solid raw materials, the capsule was evacuated, back-filled with argon and re-evacuated, heated to a temperature of approximately 250° C., held at temperature under vacuum for a period of approximately 48 hours, and then cooled, with an additional pump/purge cycle after the cooldown. The capsule was chilled to dry ice temperature and HF and then $NH_3$ were added by the vapor phase, forming $NH_4F$ as mineralizer. The ratios of GaN nutrient and $NH_4F$ mineralizer to ammonia were approximately 3.82 and 0.121 respectively, by weight. The capsule was placed in an internally-heated high pressure apparatus and heated to temperatures of approximately 666 degrees Celsius for the upper, nutrient zone and approximately 675 degrees Celsius for the lower, crystal growth zone, maintained at these temperatures for approximately 936 hours, and then cooled and removed. A wedge-shaped analysis sample was prepared from an ammonothermal GaN layer grown on an un-patterned substrate, as shown in FIG. 8 with wedge angle $\alpha=80°$ and SIMS measurements were performed at five points along surface 855. The measured oxygen, hydrogen, and fluorine concentrations, shown as a function of distance d from regrowth interface over the large-area surface 102, are shown in FIG. 20. The maximum oxygen concentration was approximately $1.9 \times 10^{18}$ cm$^{-3}$. The average oxygen gradient, up to a depth of about 3.9 mm from the (0 0 0 −1) seed interface, was approximately $-4.7 \times 10^{18}$ cm$^{-4}$ in the [0 0 0 −1] direction. The average H/O ratio was approximately 2.7. The average F/O ratio was approximately 5%.

Embodiments of the disclosure may provide a method for forming a seed wafer, comprising: a depositing a patterned mask on a back-side, (000-1) surface of a c-plane, free-standing gallium nitride wafer to form a patterned seed wafer, wherein a front side of the c-plane, free-standing gallium nitride wafer has a crystallographic orientation that is miscut from (0001) by between 0.2 and 0.8 degree toward an m-direction and by less than 0.2 degrees toward an orthogonal a-direction and an average dislocation density between about $5 \times 10^5$ cm$^{-2}$ and about $3 \times 10^7$ cm$^{-2}$; growing a first GaN layer in a [000-1] direction on the patterned seed wafer having a thickness between about 1 millimeter and about 15 millimeters and an initial oxygen concentration between $1 \times 10^{19}$ cm$^{-3}$ and about $6 \times 10^{19}$ cm$^{-3}$ by an ammonothermal method; preparing at least one first ammonothermal seed wafer from the first GaN layer by performing at least one of a wire-sawing and a grinding process; depositing a patterned mask on the (000-1) side of the c-plane, free-standing gallium nitride wafer to form a patterned ammonothermal seed wafer; growing a second GaN layer in the [000-1] direction on the patterned ammonothermal seed wafer having a thickness between about 1 millimeter and about 15 millimeters and an initial oxygen concentration between $1 \times 10^{19}$ cm$^{-3}$ and about $6 \times 10^{19}$ cm$^{-3}$ by an ammonothermal method; and preparing at least one second ammonothermal seed wafer from the second GaN layer by performing at least one of a wire-sawing and a grinding process. The method may further comprise removing a portion of the first ammonothermal seed wafer by an etching process prior to depositing a patterned mask on its (000-1) surface. The method may further comprise: growing a third GaN layer in a [000-1] direction by an ammonothermal process on an un-patterned, open (000-1) surface of the second ammonothermal seed wafer, the third GaN layer having a thickness between about 1 millimeter and about 15 millimeters and an initial oxygen concentration between $1 \times 10^{19}$ cm$^{-3}$ and about $6 \times 10^{19}$ cm$^{-3}$ by an ammonothermal method, wherein the as-grown surface of the third GaN layer is substantially flat, with a root-mean-square roughness between about 1 micrometer and about 100 micrometers. The method may further comprise preparing at least one third ammonothermal seed wafer from the third GaN layer by performing at least one of a wire-sawing and a grinding process. The method of claim may further comprise: growing a fourth GaN layer in a [000-1] direction by an ammonothermal process on an un-patterned, open (000-1) surface of the third ammonothermal seed wafer, the fourth GaN layer having a thickness between about 1 millimeter and about 15 millimeters and an initial oxygen concentration between $3 \times 10^{18}$ cm$^{-3}$ and about $1 \times 10^{19}$ cm$^{-3}$ by an ammonothermal method, wherein at least 95% of the area of the as-grown surface of the fourth GaN layer is substantially flat and smooth, with at least 95% of the area of the as-grown (000-1) surface having a root-mean-square roughness between about 1 micrometer and about 100 micrometers and at least 90% of the area of the as-grown (000-1) surface being free of depressions having a depth greater than about 20 micrometers, with respect to the balance of the (000-1) surface.

While the foregoing is directed to embodiments of the present disclosure, other and further embodiments of the disclosure may be devised without departing from the basic scope thereof, and the scope thereof is determined by the claims that follow.

What is claimed is:

1. A free-standing crystal, comprising a group III metal and nitrogen, wherein the free-standing crystal comprises:
   a wurtzite crystal structure;
   a first surface having a maximum dimension greater than 40 millimeters in a first direction and a crystallographic orientation within 10 degrees of (0 0 0 1); and
   a second surface on the opposite side of the crystal from the first surface, wherein a separation between the first surface and the second surface is between about 200 micrometers and about 2000 micrometers,
   wherein an average oxygen concentration within a depth of 2 to 10 micrometers from the first surface, measured at at least four regions, is between $1 \times 10^{16}$ cm$^{-3}$ and $5 \times 10^{19}$ cm$^{-3}$ and is greater, by a factor between about 1.1 and about 10, than the average oxygen concentration within a depth of 2 to 10 micrometers from the second surface, measured at at least four regions, as quantified by calibrated secondary ion mass spectrometry.

2. The free-standing crystal of claim 1, wherein the average oxygen concentration within a depth of 2 to 10 micrometers on the first surface is greater, by a factor between about 1.1 and about 3, than the average oxygen concentration within a depth of 2 to 10 micrometers on the second surface, as quantified by calibrated secondary ion mass spectrometry.

3. The free-standing crystal of claim 1, wherein the crystal further comprises an impurity concentration of H greater than $10^{17}$ cm$^{-3}$, and an impurity concentration of at least one of Li, Na, K, F, Cl, Br, and I greater than $10^{15}$ cm$^{-3}$, as quantified by calibrated secondary ion mass spectrometry within a depth of 2 to 10 micrometers on the first surface, measured at at least four regions.

4. The free-standing crystal of claim 1, wherein the first surface is characterized by an average impurity concentrations of:
   hydrogen (H) between $1 \times 10^{16}$ cm$^{-3}$ and $8 \times 10^{19}$ cm$^{-3}$; and
   at least one of fluorine (F) and chlorine (Cl) between $1 \times 10^{15}$ cm$^{-3}$ and $1 \times 10^{19}$ cm$^{-3}$.

5. The free-standing crystal of claim 1, wherein the first surface is characterized by impurity concentrations of:
   hydrogen (H) between $1 \times 10^{16}$ cm$^{-3}$ and $8 \times 10^{19}$ cm$^{-3}$; and
   at least one of sodium (Na) and potassium (K) between $3 \times 10^{15}$ cm$^{-3}$ and $1 \times 10^{18}$ cm$^{3}$.

6. The free-standing crystal of claim 3, wherein a ratio of the impurity concentration of H to an impurity concentration of O is between about 0.3 and about 10.

7. The free-standing crystal of claim 6, wherein a ratio of the impurity concentration of H to an impurity concentration of O is between about 0.4 and about 5.

8. The free-standing crystal of claim 4, wherein a ratio of the impurity concentration of F to an impurity concentration of O is between about 0.05% and about 10%.

9. The free-standing crystal of claim 4, wherein a ratio of the impurity concentration of F to an impurity concentration of O is between about 0.1% and about 6%.

10. The free-standing crystal of claim 4, wherein a ratio of the impurity concentration of F to an impurity concentration of O is between about 0.2% and about 1%.

11. The free-standing crystal of claim 1, wherein the average oxygen concentration on the second surface is above about $1 \times 10^{18}$ cm$^{-3}$.

12. The free-standing crystal of claim 1, wherein an oxygen gradient, defined as a difference between the average oxygen concentration within a depth of 2 to 10 micrometers on the first surface and the average oxygen concentration within a depth of 2 to 10 micrometers on the second surface divided by a separation distance of between the first surface and the second surface, is between about $1 \times 10^{21}$ cm$^{-4}$ and about $5 \times 10^{16}$ cm$^{-4}$.

13. The free-standing crystal of claim 12, wherein the oxygen gradient is between about $5 \times 10^{20}$ cm$^{-4}$ and about $2 \times 10^{17}$ cm$^{-4}$.

14. The free-standing crystal of claim 12, wherein the oxygen gradient is between about $2 \times 10^{20}$ cm$^{-4}$ and about $1 \times 10^{18}$ cm$^{-4}$.

15. The free-standing crystal of claim 1, wherein the first surface and the second surface are substantially free of implantation damage or plasma damage to a depth of about 10 micrometers.

16. The free-standing crystal of claim 1, wherein the first surface has a maximum dimension greater than 90 millimeters in the first direction.

17. The free-standing crystal of claim 1, wherein the separation between the first surface and the second surface is between about 250 micrometers and about 1000 micrometers.

18. The free-standing crystal of claim 1, wherein the separation between the first surface and the second surface is characterized by a total thickness variation below about 20 micrometers.

19. The free-standing crystal of claim 1, wherein a variation in miscut angle across the first surface is less than about 0.1 degree in each of two orthogonal crystallographic directions.

20. The free-standing crystal of claim 1, wherein a root-mean-square surface roughness of the first surface, as measured over an area of at least 10 μm×10 μm, is less than about 0.1 nanometer.

* * * * *